(12) United States Patent
Vorbach et al.

(10) Patent No.: US 8,819,505 B2
(45) Date of Patent: *Aug. 26, 2014

(54) DATA PROCESSOR HAVING DISABLED CORES

(75) Inventors: Martin Vorbach, Karlsruhe (DE); Robert Münch, Karlsruhe (DE)

(73) Assignee: Pact XPP Technologies AG, Munich (DE)

( * ) Notice: Subject to any disclaimer, the term of this patent is extended or adjusted under 35 U.S.C. 154(b) by 1006 days.

This patent is subject to a terminal disclaimer.

(21) Appl. No.: 12/495,465

(22) Filed: Jun. 30, 2009

(65) Prior Publication Data

US 2009/0300445 A1 Dec. 3, 2009

Related U.S. Application Data

(63) Continuation of application No. 10/757,900, filed on Jan. 14, 2004, now Pat. No. 7,584,390, which is a continuation of application No. 09/598,926, filed on Jun. 21, 2000, now Pat. No. 6,697,979.

(51) Int. Cl.
*G01R 31/28* (2006.01)
*G11C 13/00* (2006.01)
*G06F 11/20* (2006.01)
*G01R 31/3185* (2006.01)
*G01R 31/319* (2006.01)
*G11C 29/00* (2006.01)
*G06F 11/00* (2006.01)

(52) U.S. Cl.
CPC ...... *G01R 31/31908* (2013.01); *G06F 11/2038* (2013.01); *G06F 11/006* (2013.01); *G01R 31/318505* (2013.01); *G11C 29/78* (2013.01)
USPC ............ 714/724; 714/718; 714/723; 714/742

(58) Field of Classification Search
CPC .... G01R 31/85; G06F 11/2041; G06F 11/267
USPC .................. 714/718, 723, 724, 742
See application file for complete search history.

(56) References Cited

U.S. PATENT DOCUMENTS

| 3,564,506 A | 2/1971 | Bee et al. |
| 3,681,578 A | 8/1972 | Stevens |
| 3,753,008 A | 8/1973 | Guarnaschelli |

(Continued)

FOREIGN PATENT DOCUMENTS

| DE | 42 21 278 | 1/1994 |
| DE | 44 16 881 | 11/1994 |

(Continued)

OTHER PUBLICATIONS

Mukherjee, N.; Kassab, H.; Rajski, J.; Tyszer, J., "Arithmetic built-in self test for high-level synthesis," VLSI Test Symposium, 1995. Proceedings., 13th IEEE , vol., No., pp. 132,139, Apr. 30-May 3, 1995.*

(Continued)

*Primary Examiner* — Cynthia Britt
(74) *Attorney, Agent, or Firm* — Edward P. Heller, III

(57) ABSTRACT

A data processor having a plurality of data processing cores configured to disable cores found defective by a self-test.

52 Claims, 18 Drawing Sheets

(56) References Cited

U.S. PATENT DOCUMENTS

| | | |
|---|---|---|
| 3,754,211 A | 8/1973 | Rocher et al. |
| 3,855,577 A | 12/1974 | Vandierendonck |
| 3,956,589 A | 5/1976 | Weathers et al. |
| 3,959,638 A * | 5/1976 | Blum et al. .................. 714/11 |
| 3,970,993 A * | 7/1976 | Finnila ........................ 712/14 |
| 4,151,611 A | 4/1979 | Sugawara et al. |
| 4,233,667 A | 11/1980 | Devine et al. |
| 4,414,547 A | 11/1983 | Knapp et al. |
| 4,428,048 A * | 1/1984 | Berlin, Jr. .................... 713/600 |
| 4,498,134 A | 2/1985 | Hansen et al. |
| 4,498,172 A | 2/1985 | Bhavsar |
| 4,566,102 A | 1/1986 | Hefner |
| 4,571,736 A | 2/1986 | Agrawal et al. |
| 4,590,583 A | 5/1986 | Miller |
| 4,591,979 A | 5/1986 | Iwashita |
| 4,594,682 A | 6/1986 | Drimak |
| 4,623,997 A | 11/1986 | Tulpule |
| 4,646,300 A | 2/1987 | Goodman et al. |
| 4,663,706 A | 5/1987 | Allen et al. |
| 4,667,190 A | 5/1987 | Fant et al. |
| 4,682,284 A | 7/1987 | Schrofer |
| 4,686,386 A | 8/1987 | Tadao |
| 4,706,216 A | 11/1987 | Carter |
| 4,720,778 A | 1/1988 | Hall et al. |
| 4,720,780 A | 1/1988 | Dolecek |
| 4,733,393 A * | 3/1988 | Morton ........................ 714/25 |
| 4,739,474 A | 4/1988 | Holsztynski |
| 4,760,525 A | 7/1988 | Webb |
| 4,761,755 A | 8/1988 | Ardini et al. |
| 4,791,603 A | 12/1988 | Henry |
| 4,811,214 A | 3/1989 | Nosenchuck et al. |
| 4,852,043 A | 7/1989 | Guest |
| 4,852,048 A | 7/1989 | Morton |
| 4,860,201 A | 8/1989 | Stolfo et al. |
| 4,870,302 A | 9/1989 | Freeman |
| 4,873,666 A | 10/1989 | Lefebvre et al. |
| 4,882,687 A | 11/1989 | Gordon |
| 4,884,231 A | 11/1989 | Mor et al. |
| 4,891,810 A | 1/1990 | de Corlieu et al. |
| 4,901,268 A | 2/1990 | Judd |
| 4,907,148 A * | 3/1990 | Morton ........................ 712/22 |
| 4,910,665 A | 3/1990 | Mattheyses et al. |
| 4,918,440 A | 4/1990 | Furtek et al. |
| 4,939,641 A | 7/1990 | Schwartz et al. |
| 4,959,781 A | 9/1990 | Rubenstein et al. |
| 4,967,340 A | 10/1990 | Dawes |
| 4,972,314 A | 11/1990 | Getzinger et al. |
| 4,992,933 A | 2/1991 | Taylor |
| 5,010,401 A | 4/1991 | Murakami et al. |
| 5,014,193 A | 5/1991 | Garner et al. |
| 5,015,884 A | 5/1991 | Agrawal et al. |
| 5,021,947 A | 6/1991 | Campbell et al. |
| 5,023,775 A | 6/1991 | Poret |
| 5,031,179 A | 7/1991 | Yoshida et al. |
| 5,034,914 A | 7/1991 | Osterlund |
| 5,036,473 A | 7/1991 | Butts et al. |
| 5,036,493 A | 7/1991 | Nielsen |
| 5,041,924 A | 8/1991 | Blackborow et al. |
| 5,043,978 A | 8/1991 | Nagler et al. |
| 5,047,924 A | 9/1991 | Fujioka et al. |
| 5,055,997 A | 10/1991 | Sluijter et al. |
| 5,065,308 A | 11/1991 | Evans |
| 5,072,178 A | 12/1991 | Matsumoto |
| 5,076,482 A | 12/1991 | Kozyrski et al. |
| 5,081,375 A | 1/1992 | Pickett et al. |
| 5,099,447 A | 3/1992 | Myszewski |
| 5,103,311 A | 4/1992 | Sluijter et al. |
| 5,109,503 A | 4/1992 | Cruickshank et al. |
| 5,113,498 A | 5/1992 | Evan et al. |
| 5,115,510 A | 5/1992 | Okamoto et al. |
| 5,119,290 A | 6/1992 | Loo et al. |
| 5,123,109 A | 6/1992 | Hillis |
| 5,128,559 A | 7/1992 | Steele |
| 5,142,469 A | 8/1992 | Weisenborn |
| 5,144,166 A | 9/1992 | Camarota et al. |
| 5,157,785 A * | 10/1992 | Jackson et al. .................. 712/12 |
| 5,193,202 A | 3/1993 | Jackson et al. |
| 5,203,005 A | 4/1993 | Horst |
| 5,204,935 A | 4/1993 | Mihara et al. |
| 5,208,491 A | 5/1993 | Ebeling et al. |
| 5,212,716 A | 5/1993 | Ferraiolo et al. |
| 5,212,777 A | 5/1993 | Gove et al. |
| 5,214,652 A * | 5/1993 | Sutton ........................... 714/10 |
| 5,218,302 A | 6/1993 | Loewe et al. |
| 5,226,122 A | 7/1993 | Thayer et al. |
| RE34,363 E | 8/1993 | Freeman |
| 5,233,539 A | 8/1993 | Agrawal et al. |
| 5,237,686 A | 8/1993 | Asano et al. |
| 5,243,238 A | 9/1993 | Kean |
| 5,245,616 A | 9/1993 | Olson |
| 5,247,689 A | 9/1993 | Ewert |
| RE34,444 E | 11/1993 | Kaplinsky |
| 5,274,593 A | 12/1993 | Proebsting |
| 5,276,836 A | 1/1994 | Fukumaru et al. |
| 5,287,472 A | 2/1994 | Horst |
| 5,287,511 A | 2/1994 | Robinson et al. |
| 5,287,532 A | 2/1994 | Hunt |
| 5,301,284 A | 4/1994 | Estes et al. |
| 5,301,344 A | 4/1994 | Kolchinsky |
| 5,303,172 A | 4/1994 | Magar et al. |
| 5,311,079 A | 5/1994 | Ditlow et al. |
| 5,327,125 A | 7/1994 | Iwase et al. |
| 5,336,950 A | 8/1994 | Popli et al. |
| 5,343,406 A | 8/1994 | Freeman et al. |
| 5,347,639 A | 9/1994 | Rechtschaffen et al. |
| 5,349,193 A | 9/1994 | Mott et al. |
| 5,353,432 A | 10/1994 | Richek et al. |
| 5,355,508 A | 10/1994 | Kan |
| 5,361,373 A | 11/1994 | Gilson |
| 5,365,125 A | 11/1994 | Goetting et al. |
| 5,379,444 A | 1/1995 | Mumme |
| 5,386,154 A | 1/1995 | Goetting et al. |
| 5,386,518 A | 1/1995 | Reagle et al. |
| 5,392,437 A | 2/1995 | Matter et al. |
| 5,408,643 A | 4/1995 | Katayose |
| 5,410,723 A | 4/1995 | Schmidt et al. |
| 5,412,795 A | 5/1995 | Larson |
| 5,418,952 A | 5/1995 | Morley et al. |
| 5,418,953 A | 5/1995 | Hunt et al. |
| 5,421,019 A | 5/1995 | Holsztynski et al. |
| 5,422,823 A | 6/1995 | Agrawal et al. |
| 5,425,036 A | 6/1995 | Liu et al. |
| 5,426,378 A | 6/1995 | Ong |
| 5,428,526 A | 6/1995 | Flood et al. |
| 5,430,687 A | 7/1995 | Hung et al. |
| 5,435,000 A | 7/1995 | Boothroyd et al. |
| 5,440,245 A | 8/1995 | Galbraith et al. |
| 5,440,538 A | 8/1995 | Olsen et al. |
| 5,442,790 A | 8/1995 | Nosenchuck |
| 5,444,394 A | 8/1995 | Watson et al. |
| 5,448,186 A | 9/1995 | Kawata |
| 5,450,022 A | 9/1995 | New |
| 5,455,525 A | 10/1995 | Ho et al. |
| 5,457,644 A | 10/1995 | McCollum |
| 5,465,375 A | 11/1995 | Thepaut et al. |
| 5,469,003 A | 11/1995 | Kean |
| 5,473,266 A | 12/1995 | Ahanin et al. |
| 5,473,267 A | 12/1995 | Stansfield |
| 5,475,583 A | 12/1995 | Bock et al. |
| 5,475,803 A | 12/1995 | Stearns et al. |
| 5,475,856 A | 12/1995 | Kogge |
| 5,477,525 A | 12/1995 | Okabe |
| 5,483,620 A | 1/1996 | Pechanek et al. |
| 5,485,103 A | 1/1996 | Pedersen et al. |
| 5,485,104 A | 1/1996 | Agrawal et al. |
| 5,489,857 A | 2/1996 | Agrawal et al. |
| 5,491,353 A | 2/1996 | Kean |
| 5,493,239 A | 2/1996 | Zlotnick |
| 5,493,663 A | 2/1996 | Parikh |
| 5,497,498 A | 3/1996 | Taylor |
| 5,502,838 A | 3/1996 | Kikinis |
| 5,504,439 A | 4/1996 | Tavana |
| 5,506,998 A | 4/1996 | Kato et al. |
| 5,510,730 A | 4/1996 | El Gamal et al. |

(56) References Cited

U.S. PATENT DOCUMENTS

| | | |
|---|---|---|
| 5,511,173 A | 4/1996 | Yamaura et al. |
| 5,513,366 A | 4/1996 | Agarwal et al. |
| 5,521,837 A | 5/1996 | Frankle et al. |
| 5,522,083 A | 5/1996 | Gove et al. |
| 5,525,971 A | 6/1996 | Flynn |
| 5,530,873 A | 6/1996 | Takano |
| 5,530,946 A | 6/1996 | Bouvier et al. |
| 5,532,693 A | 7/1996 | Winters et al. |
| 5,532,957 A | 7/1996 | Malhi |
| 5,535,406 A | 7/1996 | Kolchinsky |
| 5,537,057 A | 7/1996 | Leong et al. |
| 5,537,580 A | 7/1996 | Giomi et al. |
| 5,537,601 A | 7/1996 | Kimura et al. |
| 5,541,530 A | 7/1996 | Cliff et al. |
| 5,544,336 A | 8/1996 | Kato et al. |
| 5,548,773 A | 8/1996 | Kemeny et al. |
| 5,550,782 A | 8/1996 | Cliff et al. |
| 5,555,434 A | 9/1996 | Carlstedt |
| 5,559,450 A | 9/1996 | Ngai et al. |
| 5,561,738 A | 10/1996 | Kinerk et al. |
| 5,568,624 A | 10/1996 | Sites et al. |
| 5,570,040 A | 10/1996 | Lytle et al. |
| 5,572,710 A | 11/1996 | Asano et al. |
| 5,574,927 A | 11/1996 | Scantlin |
| 5,574,930 A | 11/1996 | Halverson, Jr. et al. |
| 5,581,731 A | 12/1996 | King et al. |
| 5,581,734 A | 12/1996 | DiBrino et al. |
| 5,583,450 A | 12/1996 | Trimberger et al. |
| 5,584,013 A | 12/1996 | Cheong et al. |
| 5,586,044 A | 12/1996 | Agrawal et al. |
| 5,587,921 A | 12/1996 | Agrawal et al. |
| 5,588,152 A | 12/1996 | Dapp et al. |
| 5,590,345 A | 12/1996 | Barker et al. |
| 5,590,348 A | 12/1996 | Phillips et al. |
| 5,596,742 A | 1/1997 | Agarwal et al. |
| 5,600,265 A | 2/1997 | El Gamal Abbas et al. |
| 5,600,597 A | 2/1997 | Kean et al. |
| 5,600,845 A | 2/1997 | Gilson |
| 5,602,999 A | 2/1997 | Hyatt |
| 5,603,005 A | 2/1997 | Bauman et al. |
| 5,606,698 A | 2/1997 | Powell |
| 5,608,342 A | 3/1997 | Trimberger |
| 5,611,049 A | 3/1997 | Pitts |
| 5,617,547 A | 4/1997 | Feeney et al. |
| 5,617,577 A | 4/1997 | Barker et al. |
| 5,619,720 A | 4/1997 | Garde et al. |
| 5,625,806 A | 4/1997 | Kromer |
| 5,625,836 A | 4/1997 | Barker et al. |
| 5,627,992 A | 5/1997 | Baror |
| 5,634,131 A | 5/1997 | Matter et al. |
| 5,635,851 A | 6/1997 | Tavana |
| 5,642,058 A | 6/1997 | Trimberger et al. |
| 5,646,544 A | 7/1997 | Iadanza |
| 5,646,545 A | 7/1997 | Trimberger et al. |
| 5,649,176 A | 7/1997 | Selvidge et al. |
| 5,649,179 A | 7/1997 | Steenstra et al. |
| 5,652,529 A | 7/1997 | Gould et al. |
| 5,652,894 A | 7/1997 | Hu et al. |
| 5,655,069 A | 8/1997 | Ogawara et al. |
| 5,655,124 A | 8/1997 | Lin |
| 5,656,950 A | 8/1997 | Duong et al. |
| 5,657,330 A | 8/1997 | Matsumoto |
| 5,659,785 A | 8/1997 | Pechanek et al. |
| 5,659,797 A | 8/1997 | Zandveld et al. |
| 5,675,262 A | 10/1997 | Duong et al. |
| 5,675,743 A | 10/1997 | Mavity |
| 5,675,757 A | 10/1997 | Davidson et al. |
| 5,675,777 A | 10/1997 | Glickman |
| 5,677,909 A | 10/1997 | Heide |
| 5,680,583 A | 10/1997 | Kuijsten |
| 5,682,491 A | 10/1997 | Pechanek et al. |
| 5,682,544 A | 10/1997 | Pechanek et al. |
| 5,687,325 A | 11/1997 | Chang |
| 5,694,602 A | 12/1997 | Smith |
| 5,696,791 A | 12/1997 | Yeung |
| 5,696,976 A | 12/1997 | Nizar et al. |
| 5,701,091 A | 12/1997 | Kean |
| 5,705,938 A | 1/1998 | Kean |
| 5,706,482 A | 1/1998 | Matsushima et al. |
| 5,713,037 A | 1/1998 | Wilkinson et al. |
| 5,717,890 A | 2/1998 | Ichida et al. |
| 5,717,943 A | 2/1998 | Barker et al. |
| 5,727,229 A | 3/1998 | Kan et al. |
| 5,732,209 A | 3/1998 | Vigil et al. |
| 5,734,869 A | 3/1998 | Chen |
| 5,734,921 A | 3/1998 | Dapp et al. |
| 5,737,516 A | 4/1998 | Circello et al. |
| 5,737,565 A | 4/1998 | Mayfield |
| 5,742,180 A | 4/1998 | DeHon et al. |
| 5,745,734 A | 4/1998 | Craft et al. |
| 5,748,872 A | 5/1998 | Norman |
| 5,748,979 A | 5/1998 | Trimberger |
| 5,752,035 A | 5/1998 | Trimberger |
| 5,754,459 A | 5/1998 | Telikepalli |
| 5,754,820 A | 5/1998 | Yamagami |
| 5,754,827 A | 5/1998 | Barbier et al. |
| 5,754,871 A | 5/1998 | Wilkinson et al. |
| 5,754,876 A | 5/1998 | Tamaki et al. |
| 5,760,602 A | 6/1998 | Tan |
| 5,761,484 A | 6/1998 | Agarwal et al. |
| 5,768,629 A | 6/1998 | Wise et al. |
| 5,773,994 A | 6/1998 | Jones |
| 5,778,237 A | 7/1998 | Yamamoto et al. |
| 5,778,439 A | 7/1998 | Trimberger et al. |
| 5,781,756 A | 7/1998 | Hung |
| 5,784,313 A | 7/1998 | Trimberger et al. |
| 5,784,630 A | 7/1998 | Saito et al. |
| 5,784,636 A | 7/1998 | Rupp |
| 5,794,059 A | 8/1998 | Barker et al. |
| 5,794,062 A | 8/1998 | Baxter |
| 5,801,547 A | 9/1998 | Kean |
| 5,801,715 A | 9/1998 | Norman |
| 5,801,958 A | 9/1998 | Dangelo et al. |
| 5,802,290 A | 9/1998 | Casselman |
| 5,804,986 A | 9/1998 | Jones |
| 5,815,004 A | 9/1998 | Trimberger et al. |
| 5,815,715 A | 9/1998 | Kayhan |
| 5,815,726 A | 9/1998 | Cliff |
| 5,821,774 A | 10/1998 | Veytsman et al. |
| 5,828,229 A | 10/1998 | Cliff et al. |
| 5,828,858 A | 10/1998 | Athanas et al. |
| 5,831,448 A | 11/1998 | Kean |
| 5,832,288 A | 11/1998 | Wong |
| 5,838,165 A | 11/1998 | Chatter |
| 5,838,988 A | 11/1998 | Panwar et al. |
| 5,841,973 A | 11/1998 | Kessler et al. |
| 5,844,422 A | 12/1998 | Trimberger et al. |
| 5,844,888 A | 12/1998 | Markkula, Jr. et al. |
| 5,848,238 A | 12/1998 | Shimomura et al. |
| 5,854,918 A | 12/1998 | Baxter |
| 5,857,097 A | 1/1999 | Henzinger et al. |
| 5,857,109 A | 1/1999 | Taylor |
| 5,859,544 A | 1/1999 | Norman |
| 5,860,119 A | 1/1999 | Dockser |
| 5,862,403 A | 1/1999 | Kanai et al. |
| 5,867,691 A | 2/1999 | Shiraishi |
| 5,867,723 A | 2/1999 | Peters et al. |
| 5,870,620 A | 2/1999 | Kadosumi et al. |
| 5,884,075 A | 3/1999 | Hester et al. |
| 5,887,162 A | 3/1999 | Williams et al. |
| 5,887,165 A | 3/1999 | Martel et al. |
| 5,889,533 A | 3/1999 | Lee |
| 5,889,982 A | 3/1999 | Rodgers et al. |
| 5,892,370 A | 4/1999 | Eaton et al. |
| 5,892,961 A | 4/1999 | Trimberger |
| 5,892,962 A | 4/1999 | Cloutier |
| 5,894,565 A | 4/1999 | Furtek et al. |
| 5,895,487 A | 4/1999 | Boyd et al. |
| 5,898,602 A * | 4/1999 | Rothman et al. ............... 708/230 |
| 5,901,279 A | 5/1999 | Davis, III |
| 5,913,925 A | 6/1999 | Kahle et al. |
| 5,915,099 A | 6/1999 | Takata et al. |
| 5,915,123 A | 6/1999 | Mirsky et al. |
| 5,924,119 A | 7/1999 | Sindhu et al. |

(56) References Cited

U.S. PATENT DOCUMENTS

| | | |
|---|---|---|
| 5,926,638 A | 7/1999 | Inoue |
| 5,933,023 A | 8/1999 | Young |
| 5,933,642 A | 8/1999 | Greenbaum et al. |
| 5,936,424 A | 8/1999 | Young et al. |
| 5,943,242 A | 8/1999 | Vorbach et al. |
| 5,956,518 A | 9/1999 | DeHon et al. |
| 5,960,193 A | 9/1999 | Guttag et al. |
| 5,960,200 A | 9/1999 | Eager et al. |
| 5,966,143 A | 10/1999 | Breternitz, Jr. |
| 5,966,534 A | 10/1999 | Cooke et al. |
| 5,970,254 A | 10/1999 | Cooke et al. |
| 5,978,260 A | 11/1999 | Trimberger et al. |
| 5,978,583 A | 11/1999 | Ekanadham et al. |
| 5,996,048 A | 11/1999 | Cherabuddi et al. |
| 5,996,083 A | 11/1999 | Gupta et al. |
| 5,999,990 A | 12/1999 | Sharrit et al. |
| 6,002,268 A * | 12/1999 | Sasaki et al. ............ 326/41 |
| 6,003,143 A | 12/1999 | Kim et al. |
| 6,011,407 A | 1/2000 | New |
| 6,014,509 A | 1/2000 | Furtek et al. |
| 6,020,758 A | 2/2000 | Patel et al. |
| 6,020,760 A | 2/2000 | Sample et al. |
| 6,021,490 A | 2/2000 | Vorbach et al. |
| 6,023,564 A | 2/2000 | Trimberger |
| 6,023,742 A | 2/2000 | Ebeling et al. |
| 6,026,478 A | 2/2000 | Dowling |
| 6,026,481 A | 2/2000 | New et al. |
| 6,034,538 A | 3/2000 | Abramovici |
| 6,035,371 A | 3/2000 | Magloire |
| 6,038,650 A | 3/2000 | Vorbach et al. |
| 6,038,656 A | 3/2000 | Martin et al. |
| 6,044,030 A | 3/2000 | Zheng et al. |
| 6,045,585 A | 4/2000 | Blainey |
| 6,047,115 A | 4/2000 | Mohan et al. |
| 6,049,222 A | 4/2000 | Lawman |
| 6,049,866 A | 4/2000 | Earl |
| 6,052,524 A | 4/2000 | Pauna |
| 6,052,773 A | 4/2000 | DeHon et al. |
| 6,054,873 A | 4/2000 | Laramie |
| 6,055,619 A | 4/2000 | North et al. |
| 6,058,266 A | 5/2000 | Megiddo et al. |
| 6,058,469 A | 5/2000 | Baxter |
| 6,064,819 A | 5/2000 | Franssen et al. |
| 6,072,348 A | 6/2000 | New et al. |
| 6,075,935 A | 6/2000 | Ussery et al. |
| 6,076,157 A | 6/2000 | Borkenhagen et al. |
| 6,077,315 A | 6/2000 | Greenbaum et al. |
| 6,078,736 A | 6/2000 | Guccione |
| 6,081,903 A | 6/2000 | Vorbach et al. |
| 6,084,429 A | 7/2000 | Trimberger |
| 6,085,317 A | 7/2000 | Smith |
| 6,086,628 A | 7/2000 | Dave et al. |
| 6,088,795 A | 7/2000 | Vorbach et al. |
| 6,092,174 A | 7/2000 | Roussakov |
| RE36,839 E | 8/2000 | Simmons et al. |
| 6,096,091 A | 8/2000 | Hartmann |
| 6,105,105 A | 8/2000 | Trimberger et al. |
| 6,105,106 A | 8/2000 | Manning |
| 6,108,760 A | 8/2000 | Mirsky et al. |
| 6,118,724 A | 9/2000 | Higginbottom |
| 6,119,181 A | 9/2000 | Vorbach et al. |
| 6,122,719 A | 9/2000 | Mirsky et al. |
| 6,125,072 A | 9/2000 | Wu |
| 6,125,408 A | 9/2000 | McGee et al. |
| 6,127,908 A | 10/2000 | Bozler et al. |
| 6,128,720 A | 10/2000 | Pechanek et al. |
| 6,134,166 A | 10/2000 | Lytle et al. |
| 6,137,307 A | 10/2000 | Iwanczuk et al. |
| 6,145,072 A | 11/2000 | Shams et al. |
| 6,150,837 A | 11/2000 | Beal et al. |
| 6,150,839 A | 11/2000 | New et al. |
| 6,154,048 A | 11/2000 | Iwanczuk et al. |
| 6,154,049 A | 11/2000 | New |
| 6,154,826 A | 11/2000 | Wulf et al. |
| 6,157,214 A | 12/2000 | Marshall |
| 6,170,051 B1 | 1/2001 | Dowling |
| 6,172,520 B1 | 1/2001 | Lawman et al. |
| 6,173,419 B1 | 1/2001 | Barnett |
| 6,173,434 B1 | 1/2001 | Wirthlin et al. |
| 6,178,494 B1 | 1/2001 | Casselman |
| 6,185,256 B1 | 2/2001 | Saito et al. |
| 6,185,731 B1 | 2/2001 | Maeda et al. |
| 6,188,240 B1 | 2/2001 | Nakaya |
| 6,188,650 B1 | 2/2001 | Hamada et al. |
| 6,191,614 B1 | 2/2001 | Schultz et al. |
| 6,198,304 B1 | 3/2001 | Sasaki |
| 6,201,406 B1 | 3/2001 | Iwanczuk et al. |
| 6,202,163 B1 | 3/2001 | Gabzdyl et al. |
| 6,202,182 B1 | 3/2001 | Abramovici et al. |
| 6,204,687 B1 | 3/2001 | Schultz et al. |
| 6,211,697 B1 | 4/2001 | Lien et al. |
| 6,212,544 B1 | 4/2001 | Borkenhagen et al. |
| 6,212,650 B1 | 4/2001 | Guccione |
| 6,215,326 B1 | 4/2001 | Jefferson et al. |
| 6,216,223 B1 | 4/2001 | Revilla et al. |
| 6,219,833 B1 | 4/2001 | Solomon et al. |
| RE37,195 E | 5/2001 | Kean |
| 6,230,307 B1 | 5/2001 | Davis et al. |
| 6,240,502 B1 | 5/2001 | Panwar et al. |
| 6,243,808 B1 | 6/2001 | Wang |
| 6,247,147 B1 | 6/2001 | Beenstra |
| 6,249,756 B1 | 6/2001 | Bunton et al. |
| 6,252,792 B1 | 6/2001 | Marshall et al. |
| 6,256,724 B1 | 7/2001 | Hocevar et al. |
| 6,260,114 B1 | 7/2001 | Schug |
| 6,260,179 B1 | 7/2001 | Ohsawa et al. |
| 6,262,908 B1 | 7/2001 | Marshall et al. |
| 6,263,430 B1 | 7/2001 | Trimberger et al. |
| 6,266,760 B1 | 7/2001 | DeHon et al. |
| 6,279,077 B1 | 8/2001 | Nasserbakht et al. |
| 6,282,627 B1 | 8/2001 | Wong et al. |
| 6,282,701 B1 | 8/2001 | Wygodny et al. |
| 6,285,624 B1 | 9/2001 | Chen |
| 6,286,134 B1 | 9/2001 | Click, Jr. et al. |
| 6,288,566 B1 | 9/2001 | Hanrahan et al. |
| 6,289,369 B1 | 9/2001 | Sundaresan |
| 6,289,440 B1 | 9/2001 | Casselman |
| 6,298,043 B1 | 10/2001 | Mauger et al. |
| 6,298,396 B1 | 10/2001 | Loyer et al. |
| 6,298,472 B1 | 10/2001 | Phillips et al. |
| 6,301,706 B1 | 10/2001 | Maslennikov et al. |
| 6,311,200 B1 | 10/2001 | Hanrahan et al. |
| 6,311,265 B1 | 10/2001 | Beckerle et al. |
| 6,321,298 B1 | 11/2001 | Hubis |
| 6,321,366 B1 | 11/2001 | Tseng et al. |
| 6,321,373 B1 | 11/2001 | Ekanadham et al. |
| 6,338,106 B1 | 1/2002 | Vorbach et al. |
| 6,339,424 B1 | 1/2002 | Ishikawa et al. |
| 6,339,840 B1 | 1/2002 | Kothari et al. |
| 6,341,318 B1 | 1/2002 | Dakhil |
| 6,347,346 B1 | 2/2002 | Taylor |
| 6,349,346 B1 | 2/2002 | Hanrahan et al. |
| 6,353,841 B1 | 3/2002 | Marshall et al. |
| 6,362,650 B1 | 3/2002 | New et al. |
| 6,370,596 B1 | 4/2002 | Dakhil |
| 6,373,779 B1 | 4/2002 | Pang et al. |
| 6,374,286 B1 | 4/2002 | Gee |
| 6,378,068 B1 | 4/2002 | Foster et al. |
| 6,381,624 B1 | 4/2002 | Colon-Bonet et al. |
| 6,389,379 B1 | 5/2002 | Lin et al. |
| 6,389,579 B1 | 5/2002 | Phillips et al. |
| 6,392,912 B1 | 5/2002 | Hanrahan et al. |
| 6,400,601 B1 | 6/2002 | Sudo et al. |
| 6,404,224 B1 | 6/2002 | Azegami et al. |
| 6,405,185 B1 | 6/2002 | Pechanek et al. |
| 6,405,299 B1 | 6/2002 | Vorbach et al. |
| 6,421,808 B1 | 7/2002 | McGeer |
| 6,421,809 B1 | 7/2002 | Wuytack et al. |
| 6,421,817 B1 | 7/2002 | Mohan et al. |
| 6,425,054 B1 | 7/2002 | Nguyen |
| 6,425,068 B1 | 7/2002 | Vorbach |
| 6,426,649 B1 | 7/2002 | Fu et al. |
| 6,427,156 B1 | 7/2002 | Chapman et al. |
| 6,430,309 B1 | 8/2002 | Pressman et al. |

(56) References Cited

U.S. PATENT DOCUMENTS

| | | |
|---|---|---|
| 6,434,642 B1 | 8/2002 | Camilleri et al. |
| 6,434,672 B1 | 8/2002 | Gaither |
| 6,434,695 B1 | 8/2002 | Esfahani et al. |
| 6,434,699 B1 | 8/2002 | Jones et al. |
| 6,437,441 B1 | 8/2002 | Yamamoto |
| 6,438,747 B1 | 8/2002 | Schreiber et al. |
| 6,449,283 B1 | 9/2002 | Chao et al. |
| 6,456,628 B1 | 9/2002 | Greim et al. |
| 6,457,116 B1 | 9/2002 | Mirsky et al. |
| 6,476,634 B1 | 11/2002 | Bilski |
| 6,477,643 B1 | 11/2002 | Vorbach et al. |
| 6,480,937 B1 | 11/2002 | Vorbach et al. |
| 6,480,954 B2 | 11/2002 | Trimberger et al. |
| 6,483,343 B1 | 11/2002 | Faith et al. |
| 6,487,709 B1 | 11/2002 | Keller et al. |
| 6,490,695 B1 | 12/2002 | Zagorski et al. |
| 6,496,740 B1 | 12/2002 | Robertson et al. |
| 6,496,902 B1 | 12/2002 | Faanes et al. |
| 6,496,971 B1 | 12/2002 | Lesea et al. |
| 6,504,398 B1 | 1/2003 | Lien et al. |
| 6,507,898 B1 | 1/2003 | Gibson et al. |
| 6,507,947 B1 | 1/2003 | Schreiber et al. |
| 6,512,804 B1 | 1/2003 | Johnson et al. |
| 6,513,077 B2 | 1/2003 | Vorbach et al. |
| 6,516,382 B2 | 2/2003 | Manning |
| 6,518,787 B1 | 2/2003 | Allegrucci et al. |
| 6,519,674 B1 | 2/2003 | Lam et al. |
| 6,523,107 B1 | 2/2003 | Stansfield et al. |
| 6,525,678 B1 | 2/2003 | Veenstra et al. |
| 6,526,520 B1 | 2/2003 | Vorbach et al. |
| 6,538,468 B1 | 3/2003 | Moore |
| 6,538,470 B1 | 3/2003 | Langhammer et al. |
| 6,539,415 B1 | 3/2003 | Mercs |
| 6,539,438 B1 | 3/2003 | Ledzius et al. |
| 6,539,477 B1 | 3/2003 | Seawright |
| 6,542,394 B2 | 4/2003 | Marshall et al. |
| 6,542,844 B1 | 4/2003 | Hanna |
| 6,542,998 B1 | 4/2003 | Vorbach |
| 6,553,395 B2 | 4/2003 | Marshall et al. |
| 6,553,479 B2 | 4/2003 | Mirsky et al. |
| 6,567,834 B1 | 5/2003 | Marshall et al. |
| 6,571,381 B1 | 5/2003 | Vorbach et al. |
| 6,587,939 B1 | 7/2003 | Takano |
| 6,598,128 B1 | 7/2003 | Yoshioka et al. |
| 6,606,704 B1 | 8/2003 | Adiletta et al. |
| 6,624,819 B1 | 9/2003 | Lewis |
| 6,625,631 B2 | 9/2003 | Ruehle |
| 6,631,487 B1 | 10/2003 | Abramovici et al. |
| 6,633,181 B1 | 10/2003 | Rupp |
| 6,657,457 B1 | 12/2003 | Hanrahan et al. |
| 6,658,564 B1 | 12/2003 | Smith et al. |
| 6,665,758 B1 | 12/2003 | Frazier et al. |
| 6,668,237 B1 | 12/2003 | Guccione et al. |
| 6,681,388 B1 | 1/2004 | Sato et al. |
| 6,687,788 B2 | 2/2004 | Vorbach et al. |
| 6,694,434 B1 | 2/2004 | McGee et al. |
| 6,697,979 B1 * | 2/2004 | Vorbach et al. ............... 714/724 |
| 6,704,816 B1 | 3/2004 | Burke |
| 6,708,223 B1 | 3/2004 | Wang et al. |
| 6,708,325 B2 | 3/2004 | Cooke et al. |
| 6,717,436 B2 | 4/2004 | Kress et al. |
| 6,721,830 B2 | 4/2004 | Vorbach et al. |
| 6,725,334 B2 | 4/2004 | Barroso et al. |
| 6,728,871 B1 | 4/2004 | Vorbach et al. |
| 6,745,317 B1 | 6/2004 | Mirsky et al. |
| 6,748,440 B1 | 6/2004 | Lisitsa et al. |
| 6,751,722 B2 | 6/2004 | Mirsky et al. |
| 6,754,805 B1 | 6/2004 | Juan |
| 6,757,847 B1 | 6/2004 | Farkash et al. |
| 6,757,892 B1 | 6/2004 | Gokhale et al. |
| 6,782,445 B1 | 8/2004 | Olgiati et al. |
| 6,785,826 B1 | 8/2004 | Durham et al. |
| 6,802,026 B1 | 10/2004 | Patterson et al. |
| 6,803,787 B1 | 10/2004 | Wicker, Jr. |
| 6,820,188 B2 | 11/2004 | Stansfield et al. |
| 6,829,697 B1 | 12/2004 | Davis et al. |
| 6,836,842 B1 | 12/2004 | Guccione et al. |
| 6,847,370 B2 | 1/2005 | Baldwin et al. |
| 6,859,869 B1 | 2/2005 | Vorbach |
| 6,868,476 B2 | 3/2005 | Rosenbluth |
| 6,871,341 B1 | 3/2005 | Shyr |
| 6,874,108 B1 | 3/2005 | Abramovici et al. |
| 6,886,092 B1 | 4/2005 | Douglass et al. |
| 6,901,502 B2 | 5/2005 | Yano et al. |
| 6,928,523 B2 | 8/2005 | Yamada |
| 6,957,306 B2 | 10/2005 | So et al. |
| 6,961,924 B2 | 11/2005 | Bates et al. |
| 6,975,138 B2 | 12/2005 | Pani et al. |
| 6,977,649 B1 | 12/2005 | Baldwin et al. |
| 7,000,161 B1 | 2/2006 | Allen et al. |
| 7,007,096 B1 | 2/2006 | Lisitsa et al. |
| 7,010,667 B2 | 3/2006 | Vorbach |
| 7,010,687 B2 | 3/2006 | Ichimura |
| 7,028,107 B2 | 4/2006 | Vorbach et al. |
| 7,036,114 B2 | 4/2006 | McWilliams et al. |
| 7,038,952 B1 | 5/2006 | Zack et al. |
| 7,043,416 B1 | 5/2006 | Lin |
| 7,144,152 B2 | 12/2006 | Rusu et al. |
| 7,155,708 B2 | 12/2006 | Hammes et al. |
| 7,164,422 B1 | 1/2007 | Wholey et al. |
| 7,210,129 B2 | 4/2007 | May et al. |
| 7,216,204 B2 | 5/2007 | Rosenbluth |
| 7,237,087 B2 | 6/2007 | Vorbach et al. |
| 7,249,351 B1 | 7/2007 | Songer et al. |
| 7,254,649 B2 | 8/2007 | Subramanian et al. |
| 7,266,725 B2 | 9/2007 | Vorbach et al. |
| 7,340,596 B1 | 3/2008 | Crosland et al. |
| 7,346,644 B1 | 3/2008 | Langhammer et al. |
| 7,350,178 B1 | 3/2008 | Crosland et al. |
| 7,382,156 B2 | 6/2008 | Pani et al. |
| 7,455,450 B2 | 11/2008 | Liu et al. |
| 7,595,659 B2 | 9/2009 | Vorbach et al. |
| 7,650,448 B2 | 1/2010 | Vorbach et al. |
| 7,657,877 B2 | 2/2010 | Vorbach et al. |
| 7,759,968 B1 | 7/2010 | Hussein et al. |
| 7,873,811 B1 | 1/2011 | Wolinski et al. |
| 2001/0001860 A1 | 5/2001 | Beiu |
| 2001/0003834 A1 | 6/2001 | Shimonishi |
| 2001/0010074 A1 | 7/2001 | Nishihara et al. |
| 2001/0018733 A1 | 8/2001 | Fujii et al. |
| 2001/0032305 A1 | 10/2001 | Barry |
| 2002/0004916 A1 | 1/2002 | Marchand et al. |
| 2002/0010853 A1 | 1/2002 | Trimberger et al. |
| 2002/0013861 A1 | 1/2002 | Adiletta et al. |
| 2002/0038414 A1 | 3/2002 | Taylor |
| 2002/0045952 A1 | 4/2002 | Blemel |
| 2002/0051482 A1 | 5/2002 | Lomp |
| 2002/0073282 A1 | 6/2002 | Chauvel et al. |
| 2002/0083308 A1 | 6/2002 | Pereira et al. |
| 2002/0099759 A1 | 7/2002 | Gootherts |
| 2002/0103839 A1 | 8/2002 | Ozawa |
| 2002/0124238 A1 | 9/2002 | Metzgen |
| 2002/0138716 A1 | 9/2002 | Master et al. |
| 2002/0143505 A1 | 10/2002 | Drusinsky |
| 2002/0144229 A1 | 10/2002 | Hanrahan |
| 2002/0147932 A1 | 10/2002 | Brock et al. |
| 2002/0152060 A1 | 10/2002 | Tseng |
| 2002/0156962 A1 | 10/2002 | Chopra et al. |
| 2002/0162097 A1 | 10/2002 | Meribout |
| 2002/0165886 A1 | 11/2002 | Lam |
| 2003/0001615 A1 | 1/2003 | Sueyoshi et al. |
| 2003/0014743 A1 | 1/2003 | Cooke et al. |
| 2003/0046607 A1 | 3/2003 | May et al. |
| 2003/0052711 A1 | 3/2003 | Taylor |
| 2003/0055861 A1 | 3/2003 | Lai et al. |
| 2003/0056062 A1 | 3/2003 | Prabhu |
| 2003/0056085 A1 | 3/2003 | Vorbach |
| 2003/0056091 A1 | 3/2003 | Greenberg |
| 2003/0056202 A1 | 3/2003 | May et al. |
| 2003/0061542 A1 | 3/2003 | Bates et al. |
| 2003/0062922 A1 | 4/2003 | Douglass et al. |
| 2003/0070059 A1 | 4/2003 | Dally et al. |
| 2003/0086300 A1 | 5/2003 | Noyes et al. |
| 2003/0093662 A1 | 5/2003 | Vorbach et al. |

(56) References Cited

U.S. PATENT DOCUMENTS

| | | |
|---|---|---|
| 2003/0097513 A1 | 5/2003 | Vorbach et al. |
| 2003/0123579 A1 | 7/2003 | Safavi et al. |
| 2003/0135686 A1 | 7/2003 | Vorbach et al. |
| 2003/0154349 A1 | 8/2003 | Berg et al. |
| 2003/0192032 A1 | 10/2003 | Andrade et al. |
| 2003/0226056 A1 | 12/2003 | Yip et al. |
| 2004/0015899 A1 | 1/2004 | May et al. |
| 2004/0025005 A1 | 2/2004 | Vorbach et al. |
| 2004/0039880 A1 | 2/2004 | Pentkovski et al. |
| 2004/0078548 A1 | 4/2004 | Claydon et al. |
| 2004/0088689 A1 | 5/2004 | Hammes |
| 2004/0088691 A1 | 5/2004 | Hammes et al. |
| 2004/0168099 A1 | 8/2004 | Vorbach et al. |
| 2004/0199688 A1 | 10/2004 | Vorbach et al. |
| 2005/0066213 A1 | 3/2005 | Vorbach et al. |
| 2005/0091468 A1 | 4/2005 | Morita et al. |
| 2005/0144210 A1 | 6/2005 | Simkins et al. |
| 2005/0144212 A1 | 6/2005 | Simkins et al. |
| 2005/0144215 A1 | 6/2005 | Simkins et al. |
| 2006/0036988 A1 | 2/2006 | Allen et al. |
| 2006/0230094 A1 | 10/2006 | Simkins et al. |
| 2006/0230096 A1 | 10/2006 | Thendean et al. |
| 2007/0050603 A1 | 3/2007 | Vorbach et al. |
| 2007/0083730 A1 | 4/2007 | Vorbach et al. |
| 2008/0034184 A1* | 2/2008 | Norman ........................ 712/17 |
| 2008/0313383 A1 | 12/2008 | Morita et al. |
| 2009/0085603 A1 | 4/2009 | Paul et al. |
| 2009/0193384 A1 | 7/2009 | Sima et al. |
| 2010/0306602 A1 | 12/2010 | Kamiya et al. |

FOREIGN PATENT DOCUMENTS

| | | |
|---|---|---|
| DE | 38 55 673 | 11/1996 |
| DE | 196 51 075 | 6/1998 |
| DE | 196 54 593 | 7/1998 |
| DE | 196 54 595 | 7/1998 |
| DE | 196 54 846 | 7/1998 |
| DE | 197 04 044 | 8/1998 |
| DE | 197 04 728 | 8/1998 |
| DE | 197 04 742 | 9/1998 |
| DE | 198 22 776 | 3/1999 |
| DE | 198 07 872 | 8/1999 |
| DE | 198 61 088 | 2/2000 |
| DE | 199 26 538 | 12/2000 |
| DE | 100 28 397 | 12/2001 |
| DE | 100 36 627 | 2/2002 |
| DE | 101 29 237 | 4/2002 |
| DE | 102 04 044 | 8/2003 |
| EP | 0 208 457 | 1/1987 |
| EP | 0 221 360 | 5/1987 |
| EP | 0 398 552 | 11/1990 |
| EP | 0 428 327 | 5/1991 |
| EP | 0 463 721 | 1/1992 |
| EP | 0 477 809 | 4/1992 |
| EP | 0 485 690 | 5/1992 |
| EP | 0 497 029 | 8/1992 |
| EP | 0 539 595 | 5/1993 |
| EP | 0 638 867 A2 | 8/1994 |
| EP | 0 628 917 | 12/1994 |
| EP | 0 678 985 | 10/1995 |
| EP | 0 686 915 | 12/1995 |
| EP | 0 696 001 | 2/1996 |
| EP | 0 707 269 | 4/1996 |
| EP | 0 726 532 | 8/1996 |
| EP | 0 735 685 | 10/1996 |
| EP | 0 746 106 | 12/1996 |
| EP | 0 748 051 | 12/1996 |
| EP | 0 926 594 | 6/1999 |
| EP | 1 061 439 | 12/2000 |
| EP | 1 115 204 | 7/2001 |
| EP | 1 146 432 | 10/2001 |
| EP | 1 669 885 | 6/2006 |
| FR | 2 752 466 | 2/1998 |
| GB | 2 304 438 | 3/1997 |
| JP | 58-058672 | 4/1983 |
| JP | 10-44571 | 2/1989 |
| JP | 1-229378 | 9/1989 |
| JP | 2-130023 | 5/1990 |
| JP | 2-226423 | 9/1990 |
| JP | 5-265705 | 10/1993 |
| JP | 5-276007 | 10/1993 |
| JP | 5-509184 | 12/1993 |
| JP | 6-266605 | 9/1994 |
| JP | 7-086921 | 3/1995 |
| JP | 7-154242 | 6/1995 |
| JP | 8-148989 | 6/1995 |
| JP | 7-182160 | 7/1995 |
| JP | 7-182167 | 7/1995 |
| JP | 8-044581 | 2/1996 |
| JP | 8-069447 | 3/1996 |
| JP | 8-101761 | 4/1996 |
| JP | 8-102492 | 4/1996 |
| JP | 8-106443 | 4/1996 |
| JP | 8-221164 | 8/1996 |
| JP | 8-250685 | 9/1996 |
| JP | 9-027745 | 1/1997 |
| JP | 9-237284 | 9/1997 |
| JP | 9-294069 | 11/1997 |
| JP | 11-046187 | 2/1999 |
| JP | 11-184718 | 7/1999 |
| JP | 11-307725 | 11/1999 |
| JP | 2000-076066 | 3/2000 |
| JP | 2000-181566 | 6/2000 |
| JP | 2000-201066 | 7/2000 |
| JP | 2000-311156 | 11/2000 |
| JP | 2001-500682 | 1/2001 |
| JP | 2001-167066 | 6/2001 |
| JP | 2001-510650 | 7/2001 |
| JP | 2001-236221 | 8/2001 |
| JP | 2002-0033457 | 1/2002 |
| JP | 3-961028 | 8/2007 |
| WO | WO90/04835 | 5/1990 |
| WO | WO90/11648 | 10/1990 |
| WO | WO92/01987 | 2/1992 |
| WO | WO93/11503 | 6/1993 |
| WO | WO94/06077 | 3/1994 |
| WO | WO94/08399 | 4/1994 |
| WO | WO95/26001 | 9/1995 |
| WO | WO98/10517 | 3/1998 |
| WO | WO98/26356 | 6/1998 |
| WO | WO98/28697 | 7/1998 |
| WO | WO98/29952 | 7/1998 |
| WO | WO98/31102 | 7/1998 |
| WO | WO98/35294 | 8/1998 |
| WO | WO98/35299 | 8/1998 |
| WO | WO99/00731 | 1/1999 |
| WO | WO99/00739 | 1/1999 |
| WO | WO99/12111 | 3/1999 |
| WO | WO99/32975 | 7/1999 |
| WO | WO99/40522 | 8/1999 |
| WO | WO99/44120 | 9/1999 |
| WO | WO99/44147 | 9/1999 |
| WO | WO00/17771 | 3/2000 |
| WO | WO00/38087 | 6/2000 |
| WO | WO00/45282 | 8/2000 |
| WO | WO00/49496 | 8/2000 |
| WO | WO00/77652 | 12/2000 |
| WO | WO01/55917 | 8/2001 |
| WO | WO02/13000 | 2/2002 |
| WO | WO02/29600 | 4/2002 |
| WO | WO02/50665 | 6/2002 |
| WO | WO02/071196 | 9/2002 |
| WO | WO02/071248 | 9/2002 |
| WO | WO02/071249 | 9/2002 |
| WO | WO02/103532 | 12/2002 |
| WO | WO03/017095 | 2/2003 |
| WO | WO03/023616 | 3/2003 |
| WO | WO03/025781 | 3/2003 |
| WO | WO03/036507 | 5/2003 |
| WO | WO03/091875 | 11/2003 |
| WO | WO2004/053718 | 6/2004 |

(56) References Cited

FOREIGN PATENT DOCUMENTS

| WO | WO2004/114128 | 12/2004 |
|---|---|---|
| WO | WO2005/045692 | 5/2005 |
| WO | WO 2007/030395 | 3/2007 |

OTHER PUBLICATIONS

Li, Zhiyuan, et al., "Configuration prefetching techniques for partial reconfigurable coprocessor with relocation and defragmentation," International Symposium on Field Programmable Gate Arrays, Feb. 1, 2002, pp. 187-195.
ARM Limited, "ARM Architecture Reference Manual," Dec. 6, 2000, pp. A10-6-A10-7.
Agarwal, A., et al., "APRIL: A Processor Architecture for Multiprocessing," Laboratory for Computer Science, MIT, Cambridge, MA, IEEE 1990, pp. 104-114.
Almasi and Gottlieb, *Highly Parallel Computing*, The Benjamin/Cummings Publishing Company, Inc., Redwood City, CA, 1989, 3 pages (Fig. 4.1).
Advanced RISC Machines Ltd (ARM), "AMBA—Advanced Microcontroller Bus Architecture Specification," (Document No. ARM IHI 0001C), Sep. 1995, 72 pages.
Alfke, Peter; New, Bernie, *Xilinx Application Note*, "Additional XC3000 Data," XAPP 024.000, 1994, pp. 8-11 through 8-20.
Alfke, Peter; New, Bernie, *Xilinx Application Note*, "Adders, Subtracters and Accumulators in XC3000," XAPP 022.000, 1994, pp. 8-98 through 8-104.
Alfke, Peter, *Xilinx Application Note*, "Megabit FIFO in Two Chips: One LCA Device and One DRAM," XAPP 030.000, 1994, pp. 8-148 through 8-150.
Alfke, Peter, *Xilinx Application Note*, "Dynamic Reconfiguration," XAPP 093, Nov. 10, 1997, pp. 13-45 through 13-46.
Alfke, Peter; New, Bernie, *Xilinx Application Note*, "Implementing State Machines in LCA Devices," XAPP 027.001, 1994, pp. 8-169 through 8-172.
Algotronix, Ltd., CAL64K Preliminary Data Sheet, Apr. 1989, pp. 1-24.
Algotronix, Ltd., CAL4096 Datasheet, 1992, pp. 1-53.
Algotronix, Ltd., CHS2x4 User Manual, "CHA2x4 Custom Computer," 1991, pp. 1-38.
Allaire, Bill; Fischer, Bud, *Xilinx Application Note*, "Block Adaptive Filter," XAPP 055, Aug. 15, 1996 (Version 1.0), pp. 1-10.
Altera Application Note (73), "Implementing FIR Filters in FLEX Devices," Altera Corporation, Feb. 1998, ver. 1.01, pp. 1-23.
Athanas, P. (Thesis), "An adaptive machine architecture and compiler for dynamic processor reconfiguration," Brown University 1992, pp. 1-157.
Berkeley Design Technology, Inc., *Buyer's Guide to DSP Processors*, 1995, Fremont, CA., pp. 673-698.
Bittner, R. et al., "Colt: An Experiment in Wormhole Run-Time Reconfiguration," Bradley Department of Electrical and Computer Engineering, Blacksburg, VA, SPIE—International Society for Optical Engineering, vol. 2914/187, Nov. 1996, Boston, MA, pp. 187-194.
Camilleri, Nick; Lockhard, Chris, *Xilinx Application Note*, "Improving XC4000 Design Performance," XAPP 043.000, 1994, pp. 8-21 through 8-35.
Cartier, Lois, *Xilinx Application Note*, "System Design with New XC4000EX I/O Features," Feb. 21, 1996, pp. 1-8.
Chen, D., (Thesis) "Programmable arithmetic devices for high speed digital signal processing," U. California Berkeley 1992, pp. 1-175.
Churcher, S., et al., "The XC6200 FastMap™ Processor Interface," Xilinx, Inc., Aug. 1995, pp. 1-8.
Cowie, Beth, *Xilinx Application Note*, "High Performance, Low Area, Interpolator Design for the XC6200," XAPP 081, May 7, 1997 (Version 1.0), pp. 1-10.
Duncan, Ann, *Xilinx Application Note*, "A32×16 Reconfigurable Correlator for the XC6200," XAPP 084, Jul. 25, 1997 (Version 1.0), pp. 1-14.

Ebeling, C., et al., "RaPiD—Reconfigurable Pipelined Datapath," Dept. of Computer Science and Engineering, U. Washington, 1996, pp. 126-135.
Epstein, D., "IBM Extends DSP Performance with Mfast—Powerful Chip Uses Mesh Architecture to Accelerate Graphics, Video," 1995 MicroDesign Resources, vol. 9, No. 16, Dec. 4, 1995, pp. 231-236.
Fawcett, B., "New SRAM-Based FPGA Architectures Address New Applications," Xilinx, Inc. San Jose, CA, Nov. 1995, pp. 231-236.
Goslin, G; Newgard, B, *Xilinx Application Note*, "16-Tap, 8-Bit FIR Filter Applications Guide," Nov. 21, 1994, pp. 1-5.
Iwanczuk, Roman, *Xilinx Application Note*, "Using the XC4000 RAM Capability," XAPP 031.000, 1994, pp. 8-127 through 8-138.
Knapp, Steven, "Using Programmable Logic to Accelerate DSP Functions," Xilinx, Inc., 1995, pp. 1-8.
New, Bernie, *Xilinx Application Note*, "Accelerating Loadable Counters in SC4000," XAPP 023.001, 1994, pp. 8-82 through 8-85.
New, Bernie, *Xilinx Application Note*, "Boundary Scan Emulator for XC3000," XAPP 007.001, 1994, pp. 8-53 through 8-59.
New, Bernie, *Xilinx Application Note*, "Ultra-Fast Synchronous Counters," XAPP 014.001, 1994, pp. 8-78 through 8-81.
New, Bernie, *Xilinx Application Note*, "Using the Dedicated Carry Logic in XC4000," XAPP 013.001, 1994, pp. 8-105 through 8-115.
New, Bernie, *Xilinx Application Note*, "Complex Digital Waveform Generator," XAPP 008.002, 1994, pp. 8-163 through 8-164.
New, Bernie, *Xilinx Application Note*, "Bus-Structured Serial Input-Output Device," XAPP 010.001, 1994, pp. 8-181 through 8-182.
Ridgeway, David, *Xilinx Application Note*, "Designing Complex 2-Dimensional Convolution Filters," XAPP 037.000, 1994, pp. 8-175 through 8-177.
Rowson, J., et al., "Second-generation compilers optimize semicustom circuits," Electronic Design, Feb. 19, 1987, pp. 92-96.
Schewel, J., "A Hardware/Software Co-Design System using Configurable Computing Technology," Virtual Computer Corporation, Reseda, CA, IEEE 1998, pp. 620-625.
Segers, Dennis, Xilinx Memorandum, "MIKE—Product Description and MRD," Jun. 8, 1994, pp. 1-29.
Texas Instruments, "TMS320C8x System-Level Synopsis," Sep. 1995, 75 pages.
Texas Instruments, "TMS320C80 Digital Signal Processor," Data Sheet, Digital Signal Processing Solutions 1997, 171 pages.
Texas Instruments, "TMS320C80 (MVP) Parallel Processor," User's Guide, Digital Signal Processing Products 1995, 73 pages.
Trainor, D.W., et al., "Implementation of the 2D DCT Using A Xilinx XC6264 FPGA," 1997, IEEE Workshop of Signal Processing Systems SiPS 97, pp. 541-550.
Trimberger, S, (Ed.) et al., "Field-Programmable Gate Array Technology," 1994, Kluwer Academic Press, pp. 1-258 (and the Title Page, Table of Contents, and Preface) [274 pages total].
Trimberger, S., "A Reprogrammable Gate Array and Applications," IEEE 1993, Proceedings of the IEEE, vol. 81, No. 7, Jul. 1993, pp. 1030-1041.
Trimberger, S., et al., "A Time-Multiplexed FPGA," Xilinx, Inc., 1997 IEEE, pp. 22-28.
Ujvari, Dan, *Xilinx Application Note*, "Digital Mixer in an XC7272," XAPP 035.002, 1994, p. 1.
Veendrick, H., et al., "A 1.5 GIPS video signal processor (VSP)," Philips Research Laboratories, The Netherlands, IEEE 1994 Custom Integrated Circuits Conference, pp. 95-98.
Wilkie, Bill, *Xilinx Application Note*, "Interfacing XC6200 to Microprocessors (TMS320C50 Example)," XAPP 064, Oct. 9, 1996 (Version 1.1), pp. 1-9.
Wilkie, Bill, *Xilinx Application Note*, "Interfacing XC6200 to Microprocessors (MC68020 Example)," XAPP 063, Oct. 9, 1996 (Version 1.1), pp. 1-8.
XCELL, Issue 18, Third Quarter 1995, "Introducing three new FPGA Families!"; "Introducing the XC6200 FPGA Architecture: The First FPGA Architecture Optimized for Coprocessing in Embedded System Applications," 40 pages.
*Xilinx Application Note*, Advanced Product Specification, "XC6200 Field Programmable Gate Arrays," Jun. 1, 1996 (Version 1.0), pp. 4-253-4-286.
*Xilinx Application Note*, A Fast Constant Coefficient Multiplier for the XC6200, XAPP 082, Aug. 24, 1997 (Version 1.0), pp. 1-5.

(56) References Cited

OTHER PUBLICATIONS

Xilinx Technical Data, "XC5200 Logic Cell Array Family," Preliminary (v1.0), Apr. 1995, pp. 1-43.
Xilinx Data Book, "The Programmable Logic Data Book," 1996, 909 pages.
Xilinx, Series 6000 User's Guide, Jun. 26, 1997, 223 pages.
Yeung, K., (Thesis) "A Data-Driven Multiprocessor Architecture for High Throughput Digital Signal Processing," Electronics Research Laboratory, U. California Berkeley, Jul. 10, 1995, pp. 1-153.
Yeung, L., et al., "A 2.4GOPS Data-Driven Reconfigurable Multiprocessor IC for DSP," Dept. of EECS, U. California Berkeley, 1995 IEEE International Solid State Circuits Conference, pp. 108-110.
ZILOG Preliminary Product Specification, "Z86C95 CMOS Z8 Digital Signal Processor," 1992, pp. 1-82.
ZILOG Preliminary Product Specification, "Z89120 Z89920 (ROMless) 16-Bit Mixed Signal Processor," 1992, pp. 1-82.
Defendants' Invalidity Contentions in *PACT XPP Technologies, AG v. XILINX, Inc., et al.*, (E.D. Texas Dec. 28, 2007) (No. 2:07cv563)., including Exhibits A through K in separate PDF files.
U.S. Appl. No. 60/109,417, filed Nov. 18, 1998, Jefferson et al.
Abnous et al., "Ultra-Low-Power Domain-Specific Multimedia Processors," U.C. Berkeley, 1996 IEEE, pp. 461-470.
Abnous, A., et al., "The Pleiades Architecture," Chapter I of *The Application of Programmable DSPs in Mobile Communications*, A. Gatherer and A. Auslander, Ed., Wiley, 2002, pp. 1-33.
Ade, et al., "Minimum Memory Buffers in DSP Applications," Electronics Letters, vol. 30, No. 6, Mar. 17, 1994, pp. 469-471.
Advanced RISC Machines, "Introduction to AMBA," Oct. 1996, Section 1, pp. 1-7.
ARM, "The Architecture for the Digital World," http://www.arm.com/products/ Mar. 18, 2009, 3 pages.
ARM, "The Architecture for the Digital World; Milestones," http://www.arm.com/aboutarm/milestones.html Mar. 18, 2009, 5 pages.
Albahama, O.T. et al., "On the Viability of FPGA-Based Integrated Coprocessors," Dept. of Electrical and Electronic Engineering, Imperial College of Science, London, 1999 IEEE, pp. 206-215.
Alippi, et al., "Determining the Optimum Extended Instruction Set Architecture for Application Specific Reconfigurable VLIW CPUs," IEEE, 2001, pp. 50-56.
Altera, "Flex 8000 Programmable Logic Device Family," Altera Corporation product description, Jan. 2003, pp. 1-62.
Altera, "Flex 10K Embedded Programmable Logic Device Family," Altera Corporation product description, Jan. 2003, pp. 1-128.
Altera, "APEX 20K Programmable Logic Device Family," Altera Corporation Data Sheet, Mar. 2004, ver. 5.1, pp. 1-117.
Arabi, et al., "PLD Integrates Dedicated High-speed Data Buffering, Complex State machine, and Fast Decode Array," conference record on WESCON '93, Sep. 28, 1993, pp. 432-436.
Asari, K. et al., "FeRAM circuit technology for system on a chip," *Proceedings First NASA/DoD Workshop on Evolvable Hardware* (1999), pp. 193-197.
Athanas, "A Functional Reconfigurable Architecture and Compiler for Adoptive Computing," IEEE 1993, pp. 49-55.
Athanas, et al., "An Adaptive Hardware Machine Architecture and Compiler for Dynamic Processor Reconfigutation," IEEE, Laboratory for Engineering man/Machine Systems Division of Engineering, Box D, Brown University, Providence, Rhode Island, 1991, pp. 397-400.
Athanas et al., "Processor Reconfiguration Through Instruction-Set Metamorphosis," 1993, IEEE Computers, pp. 11-18.
Atmel, 5-K-50K Gates Coprocessor FPGA with Free Ram, Data Sheet, Jul. 2006, 55 pages.
Atmel, FPGA-based FIR Filter Application Note, Sep. 1999, 10 pages.
Atmel, "An Introduction to DSP Applications using the AT40K FPGA," FPGA Application Engineering, San Jose, CA, Apr. 2004, 15 pages.
Atmel, Configurable Logic Design & Application Book, Atmel Corporation, 1995, pp. 2-19 through 2-25.
Atmel, Field Programmable Gate Array Configuration Guide, AT6000 Series Configuration Data Sheet, Sep. 1999, pp. 1-20.
Bacon, D. et al., "Compiler Transformations for High-Performance Computing," ACM Computing Surveys, 26(4):325-420 (1994).
Bakkes, P.J., et al., "Mixing Fixed and Reconfigurable Logic for Array Processing," Dept. of Electrical and Electronic Engineering, University of Stellenbosch, South Africa, 1996 IEEE, pp. 118-125.
Baumgarte, V. et al., PACT XPP "A Self-reconfigurable Data Processing Architecture," PACT Info. GMBH, Munchen Germany, 2001, 7 pages.
Beck et al., "From control flow to data flow," TR 89-1050, Oct. 1989, Dept. of Computer Science, Cornell University, Ithaca, NY, pp. 1-25.
Becker, J. et al., "Architecture, Memory and Interface Technology Integration of an Industrial/Academic Configurable System-on-Chip (CSoC)," IEEE Computer Society Annual Workshop on VLSI (WVLSI 2003), (Feb. 2003).
Becker, J., "Configurable Systems-on-Chip (CSoC)," (Invited Tutorial), Proc. of 9th Proc. of XV Brazilian Symposium on Integrated Circuit, Design (SBCCI 2002), (Sep. 2002).
Becker et al., "Automatic Parallelism Exploitation for FPL-Based Accelerators," 1998, Proc. 31$^{st}$ Annual Hawaii International Conference on System Sciences, pp. 169-178.
Becker, J. et al., "Parallelization in Co-compilation for Configurable Accelerators—a Host/accelerator Partitioning Compilation Method," Poceedings of Asia and South Pacific Design Automation Conference, Yokohama, Japan, Feb. 10-13, 1998, 11 pages.
Bittner, "Wormhole Run-time Reconfiguration: Conceptualization and VLSI Design of a High Performance Computing System," *Dissertation*, Jan. 23, 1997, pp. I-XX, 1-415.
Bratt, A, "Motorola field programmable analogue arrays, present hardware and future trends," Motorola Programmable Technology Centre, Gadbrook Business Centre, Northwich, Cheshire, 1998, The Institute of Electrical Engineers, IEE. Savoy Place, London, pp. 1-5.
Cadambi, et al., "Managing Pipeline-reconfigurable FPGAs," ACM, 1998, pp. 55-64.
Callahan, et al., "The Garp Architecture and C Compiler," Computer, Apr. 2000, pp. 62-69.
Cardoso, J.M.P., et al., "A novel algorithm combining temporal partitioning and sharing of functional units," University of Algarve, Faro, Portugal, 2001 IEEE, pp. 1-10.
Cardoso, Joao M.P., and Markus Weinhardt, "XPP-VC: A C Compiler with Temporal Partitioning for the PACT-XPP Architecture," Field-Programmable Logic and Applications. Reconfigurable Computing is Going Mainstream, 12$^{th}$ International Conference FPL 2002, Proceedings (Lecture Notes in Computer Science, vol. 2438) Springer-Verlag Berlin, Germany, 2002, pp. 864-874.
Cardoso, J.M.P., "Compilation of Java™ Algorithms onto Reconfigurable Computing Systems with Exploitation of Operation-Level Parallelism," Ph.D. Thesis, Universidade Tecnica de Lisboa (UTL), Lisbon, Portugal Oct. 2000 (Table of Contents and English Abstract only).
Cardoso, J.M.P., et al., "Compilation and Temporal Partitioning for a Coarse-Grain Reconfigurable Architecture," New Algorithms, Architectures and Applications for Reconfigurable Computing, Lysacht, P. & Rosentiel, W. eds., (2005) pp. 105-115.
Cardoso, J.M.P., et al., "Macro-Based Hardware Compilation of Java™ Bytecodes into a Dynamic Reconfigurable Computing System," Field-Programmable Custom Computing Machines (1999) FCCM '99. Proceedings. Seventh Annual IEEE Symposium on NAPA Valley, CA, USA, Apr. 21-23, 1999, IEEE Comput. Soc, US, (Apr. 21, 1999) pp. 2-11.
Chaudhry, G.M. et al., "Separated caches and buses for multiprocessor system," Circuits and Systems, 1993; Proceedings of the 36$^{th}$ Midwest Symposium on Detroit, MI, USA, Aug. 16-18, 1993, New York, NY IEEE, Aug. 16, 1993, pp. 1113-1116, XP010119918 ISBN: 0-7803-1760-2.
Chen et al., "A reconfigurable multiprocessor IC for rapid prototyping of algorithmic-specific high-speed DSP data paths," IEEE Journal of Solid-State Circuits, vol. 27, No. 12, Dec. 1992, pp. 1895-1904.
Clearspeed, CSX Processor Architecture, Whitepaper, PN-1110-0702, 2007, pp. 1-15, www.clearspeed.com.
Clearspeed, CSX Processor Architecture, Whitepaper, PN-1110-0306, 2006, pp. 1-14, www.clearspeed.com.

(56) References Cited

OTHER PUBLICATIONS

Compton, K., et al., "Configurable Computing: A Survey of Systems and Software," Northwestern University, Dept. of ECE, Technical Report, 1999, (XP-002315148), 39 pages.
Cook, Jeffrey J., "The Amalgam Compiler Infrastructure," Thesis at the University of Illinois at Urbana-Champaign (2004) Chapter 7 & Appendix G.
Cronquist, D., et al., "Architecture Design of Reconfigurable Pipelined Datapaths," Department of Computer Science and Engineering, University of Washington, Seattle, WA, Proceedings of the 20*th* Anniversary Conference on Advanced Research in VSLI, 1999, pp. 1-15.
Culler, D.E; Singh, J.P., "Parallel Computer Architecture," pp. 434-437, 1999, Morgan Kaufmann, San Francisco, CA USA, XP002477559.
DeHon, A., "DPGA Utilization and Application," MIT Artificial Intelligence Laboratory, Proceedings of the Fourth International ACM Symposium on Field-Programmable Gate Arrays (FPGA '96), IEEE Computer Society, pp. 1-7.
DeHon, Andre, "Reconfigurable Architectures for General-Purpose Computing," Massachusetts Institute of Technology, Technical Report AITR-1586, Oct. 1996, XP002445054, Cambridge, MA, pp. 1-353.
Del Corso et al., "Microcomputer Buses and Links," Academic Press Inc. Ltd., 1986, pp. 138-143, 277-285.
Diniz, P., et al., "Automatic Synthesis of Data Storage and Control Structures for FPGA-based Computing Engines," 2000, IEEE, pp. 91-100.
Diniz, P., et al., "A behavioral synthesis estimation interface for configurable computing," University of Southern California, Marina Del Rey, CA, 2001 IEEE, pp. 1-2.
Donandt, "Improving Response Time of Programmable Logic Controllers by use of a Boolean Coprocessor," AEG Research Institute Berlin, IEEE, 1989, pp. 4-167-4-169.
Dutt, et al., "If Software is King for Systems-in-Silicon, What's New in Compilers?" IEEE, 1997, pp. 322-325.
Ebeling, C., et al., "Mapping Applications to the RaPiD Configurable Architecture," Department of Computer Science and Engineering, University of Washington, Seattle, WA, *FPGAs for Custom Computing Machines, 1997. Proceedings., The 5th Annual IEEE Symposium*, Publication Date: Apr. 16-18, 1997, 10 pages.
Equator, Pixels to Packets, Enabling Multi-Format High Definition Video, Equator Technologies BSP-15 Product Brief, www.equator.com, 2001, 4 pages.
Fawcett, B.K., "Map, Place and Route: The Key to High-Density PLD Implementation," Wescon Conference, IEEE Center (Nov. 7, 1995) pp. 292-297.
Ferrante, J., et al., "The Program Dependence Graph and its Use in Optimization ACM Transactions on Programming Languages and Systems," Jul. 1987, USA, [online] Bd. 9, Nr., 3, pp. 319-349, XP002156651 ISSN: 0164-0935 ACM Digital Library.
Fineberg, S, et al., "Experimental Analysis of a Mixed-Mode Parallel Architecture Using Bitonic Sequence Sorting," Journal of Parallel and Distributed Computing, vol. 11, No. 3, Mar. 1991, pp. 239-251.
Fornaciari, et al., System-level power evaluation metrics, 1997 Proceedings of the 2*nd* Annual IEEE International Conference on Innovative Systems in Silicon, New York, NY, Oct. 1997, pp. 323-330.
Forstner, "Wer Zuerst Kommt, Mahlt Zuerst!: Teil 3: Einsatzgebiete und Anwendungbeispiele von FIFO-Speichern," Elektronik, Aug. 2000, pp. 104-109.
Franklin, Manoj, et al., "A Fill-Unit Approach to Multiple Instruction Issue," Proceedings of the Annual International Symposium on Microarchitecture, Nov. 1994, pp. 162-171.
Freescale Slide Presentation, An Introduction to Motorola's RCF (Reconfigurable Compute Fabric) Technology, Presented by Frank David, Launched by Freescale Semiconductor, Inc., 2004, 39 pages.
Genius, D., et al., "A Case for Array Merging in Memory Hierarchies," Proceedings of the 9th International Workshop on Compilers for Parallel Computers, CPC'01 (Jun. 2001), 10 pages.

Gokhale, M.B., et al., "Automatic Allocation of Arrays to Memories in FPGA processors with Multiple Memory Banks," Field-Programmable Custom Computing Machines, 1999, IEEE, pp. 63-69.
Hammes, Jeff, et al., "Cameron: High Level Language Compilation for Reconfigurable Systems," Department of Computer Science, Colorado State University, Conference on Parallel Architectures and Compilation Techniques, Oct. 12-16, 1999, 9 pages.
Hartenstein, R. et al., "A new FPGA architecture for word-oriented datapaths," Proc. FPL'94, Springer LNCS, Sep. 1994, pp. 144-155.
Hartenstein, R., "Coarse grain reconfigurable architectures," Design Automation Conference, 2001, Proceedings of the ASP-DAC 2001 Asia and South Pacific, Jan. 30-Feb. 2, 2001, IEEE Jan. 30, 2001, pp. 564-569.
Hastie et al., "The implementation of hardware subroutines on field programmable gate arrays," Custom Integrated Circuits Conference, 1990, Proceedings of the IEEE 1990, May 16, 1990, pp. 31.3.1-31. 4.3 (3 pages).
Hauck, "The Roles of FPGAs in Reprogrammable Systems," IEEE, Apr. 1998, pp. 615-638.
Hauser, J.R., et al., "Garp: A MIPS Processor with a Reconfigurable Coprocessor," University of California, Berkeley, IEEE, 1997, pp. 24-33.
Hedge, S.J., "3D WASP Devices for On-line Signal and Data Processing," 1994, International Conference on Wafer Scale Integration, pp. 11-21.
Hendrich, N., et al., "Silicon Compilation and Rapid Prototyping of Microprogrammed VLSI-Circuits with MIMOLA and SOLO 1400," Microprocessing & Microprogramming (Sep. 1992) vol. 35(1-5), pp. 287-294.
Hwang, K., "Advanced Computer Architecture—Parallelism, Scalability, Programmability," 1993, McGraw-Hill, Inc., pp. 348-355.
Hwang, K., "Computer Architecture and Parallel Processing," Data Flow Computers and VLSI Computations, XP-002418655, 1985 McGraw-Hill, Chapter 10, pp. 732-807.
Hwang, L., et al., "Min-cut Replication in Partitioned Networks," IEEE Transactions on Computer-Aided Design of Integrated Circuits and Systems, [online] Bd. 14, Nr. 1, Jan. 1995, pp. 96-106, XP00053228 USA ISSN: 0278-0070 IEEE Xplore.
IBM Technical Disclosure Bulletin, IBM Corp., New York, XP000424878, Bd. 36, Nr. 11, Nov. 1, 1993, pp. 335-336.
"IEEE Standard Test Access Port and Boundary-Scan Architecture," IEEE Std. 1149.1-1990, 1993, pp. 1-127.
Inside DSP, "Ambric Discloses Massively Parallel Architecture," Aug. 23, 2006, http://www.insidedsp.com/Articles/tabid/64/articleType/ArticleView/articleId/155/Default.aspx, 2 pages.
Intel, Intel MXP5800/MXP5400 Digital Media Processors, Architecture Overview, Jun. 2004, Revision 2.4, pp. 1-24.
Iseli, C., et al. "A C++ Compiler for FPGA Custom Execution Units Synthesis," IEEE, 1995, pp. 173-179.
Isshiki, Tsuyoshi, et al., "Bit-Serial Pipeline Synthesis for Multi-FPGA Systems with C++ Design Capture." 1996 IEEE, pp. 38-47.
Jacob, J., et al., "Memory Interfacing and Instruction Specification for Reconfigurable Processors," ACM 1999, pp. 145-154.
Jantsch, Axel et al., "A Case Study on Hardware/Software Partitioning," Royal Institute of Technology, Kista, Sweden, Apr. 10, 1994, IEEE, pp. 111-118.
Jantsch, Axel et al., "Hardware/Software Partitioning and Minimizing Memory Interface Traffic," Electronic System Design Laboratory, Royal Institute of Technology, ESDLab, Electrum 229, S-16440 Kista, Sweden (Apr. 1994), pp. 226-231.
John, L., et al., "A Dynamically Reconfigurable Interconnect for Array Processors," vol. 6, No. 1, Mar. 1998, IEEE, pp. 150-157.
Kastrup, B., "Automatic Hardware Synthesis for a Hybrid Reconfigurable CPU Featuring Philips CPLDs," Proceedings of the PACT Workshop on Reconfigurable Computing, 1998, pp. 5-10.
Kaul, M., et al., "An automated temporal partitioning and loop fission approach of FPGA based reconfigurable synthesis of DSP applications," University of Cincinnati, Cincinnati, OH, ACM 1999, pp. 616-622.
Kean, T.A., "Configurable Logic: A Dynamically Programmable Cellular Architecture and its VLSI Implementation," University of Edinburgh (Dissertation) 1988, pp. 1-286.

(56) References Cited

OTHER PUBLICATIONS

Kean, T., et al., "A Fast Constant Coefficient Multiplier for the XC6200," Xilinx, Inc., Lecture Notes in Computer Science, vol. 1142, Proceedings of the 6$^{th}$ International Workshop of Field-Programmable Logic, 1996, 7 pages.
Kim et al., "A Reconfigurable Multifunction Computing Cache Architecture," IEEE Transactions on Very Large Scale Integration (VLSI) Systems vol. 9, Issue 4, Aug. 2001 pp. 509-523.
Knittel, Gunter, "A PCI-compatible FPGA-Coprocessor for 2D/3D Image Processing," University of Turgingen, Germany, 1996 IEEE, pp. 136-145.
Koch, A., et al., "Practical Experiences with the SPARXIL Co-Processor," 1998, IEEE, pp. 394-398.
Koch, Andreas et al., "High-Level-Language Compilation for Reconfigurable Computers," Proceedings of European Workshop on Reconfigurable Communication-Centric SOCS (Jun. 2005) 8 pages.
Koren et al., "A data-driven VLSI array for arbitrary algorithms," IEEE Computer Society, Long Beach, CA vol. 21, No. 10, Oct. 1, 1988, pp. 30-34.
Kung, "Deadlock Avoidance for Systolic Communication," 1988 Conference Proceedings of the 15$^{th}$ Annual International Symposium on Computer Architecture, May 30, 1998, pp. 252-260.
Lange, H. et al., "Memory access schemes for configurable processors," Field-Programmable Logic and Applications, International Workshop, FPL, Aug. 27, 2000, pp. 615-625, XP02283963.
Larsen, S., et al., "Increasing and Detecting Memory Address Congruence," Proceedings of the 2002 IEEE International Conference on Parallel Architectures and Compilation Techniques (PACT'02), pp. 1-12 (Sep. 2002).
Lee et al., "A new distribution network based on controlled switching elements and its applications," IEEE/ACT Trans. of Networking, vol. 3, No. 1, pp. 70-81, Feb. 1995.
Lee, Jong-eun, et al., "Reconfigurable ALU Array Architecture with Conditional Execution," International Soc. Design Conference (ISOOC) [online] Oct. 25, 2004, Seoul, Korea, 5 pages.
Lee, R. B., et al., "Multimedia extensions for general-purpose processors," *IEEE Workshop on Signal Processing Systems, SIPS 97—Design and Implementation* (1997), pp. 9-23.
Lee, Ming-Hau et al., "Designs and Implementation of the MorphoSys Reconfigurable Computing Processors," The Journal of VLSI Signal Processing, Kluwer Academic Publishers, BO, vol. 24, No. 2-3, Mar. 2, 2000, pp. 1-29.
Ling, X., "WASMII: An MPLD with Data-Driven Control on a Virtual Hardware," Journal of Supercomputing, Kluwer Acdemic Publishers, Dordrecht, Netherlands, 1995, pp. 253-276.
Ling et al., "WASMII: A Multifunction Programmable Logic Device (MPLD) with Data Driven Control," The Transactions of the Institute of Electronics, Information and Communication Engineers, Apr. 25, 1994, vol. J77-D-1, Nr. 4, pp. 309-317. [This reference is in Chinese, but should be comparable in content to the Ling et al. reference above.].
Mano, M.M., "Digital Design," by Prentice Hall, Inc., Englewood Cliffs, New Jersey 07632, 1984, pp. 119-125, 154-161.
Margolus, N., "An FPGA architecture for DRAM-based systolic computations," Boston University Center for Computational Science and MIT Artificial Intelligence Laboratory, IEEE 1997, pp. 2-11.
Maxfield,C., "Logic that Mutates While-U-Wait," EDN (Bur. Ed) (USA), EDN (European Edition), Nov. 7, 1996, Cahners Publishing, USA, pp. 137-140, 142.
Mei, Bingfeng, "A Coarse-Grained Reconfigurable Architecture Template and Its Compilation Techniques," Katholeike Universiteit Leuven, PhD Thesis, Jan. 2005, IMEC vzw, Universitair Micro-Electronica Centrum, Belgium, pp. 1-195 (and Table of Contents).
Mei, Bingfeng et al., "Design and Optimization of Dynamically Reconfigurable Embedded Systems," IMEC vzw, 2003, Belgium, 7 pages, http://www.imec.be/reconfigurable/pdf/ICERSA_01_design.pdf.
Mei, Bingfeng et al., "Adres: An Architecture with Tightly Coupled VLIW Processor and Coarse-Grained Reconfigurable Matrix,"Proc. *Field-Programmable Logic and Applications* (FPL 03), Springer, 2003, pp. 61-70.
Miller, M.J., et al., "High-Speed FIFOs Contend with Widely Differing Data Rates: Dual-port RAM Buffer and Dual-pointer System Provide Rapid, High-density Data Storage and Reduce Overhead," Computer Design, Sep. 1, 1985, pp. 83-86.
Mirsky, E. DeHon, "MATRIX: A Reconfigurable Computing Architecture with Configurable Instruction Distribution and Deployable Resources," Proceedings of the IEEE Symposium on FPGAs for Custom Computing Machines, 1996, pp. 157-166.
Miyamori, T., et al., "REMARC: Reconfigurable Multimedia Array Coprocessor," Computer Systems Laboratory, Stanford University, IEICE Transactions on Information and Systems E Series D, 1999; (abstract): Proceedings of the 1998 ACM/SIGDA sixth international symposium on Field programmable gate arrays, p. 261, Feb. 22-25, 1998, Monterey, California, United States, pp. 1-12.
Moraes, F., et al., "A Physical Synthesis Design Flow Based on Virtual Components," XV Conference on Design of Circuits and Integrated Systems (Nov. 2000) 6 pages.
Muchnick, S., "Advanced Compiler Design and Implementation," (Morgan Kaufmann 1997), Table of Contents, 11 pages.
Murphy, C., "Virtual Hardware Using Dynamic Reconfigurable Field Programmable Gate Arrays," Engineering Development Centre, Liverpool John Moores University, UK, GERI Annual Research Symposium 2005, 8 pages.
Myers, G. "Advances in Computer Architecture," Wiley-Interscience Publication, 2nd ed., John Wiley & Sons, Inc., 1978, pp. 463-494.
Nageldinger, U., "Design-Space Exploration for Coarse Grained Reconfigurable Architectures," (Dissertation) Universitaet Kaiserslautern, 2000, Chapter 2, pp. 19-45.
Neumann, T., et al., "A Generic Library for Adaptive Computing Environments," Field Programmable Logic and Applications, 11$^{th}$ International Conference, FPL 2001, Proceedings (Lecture Notes in Computer Science, vol. 2147) (2001) pp. 503-512.
Nilsson, et al., "The Scalable Tree Protocol—A Cache Coherence Approaches for Large-Scale Multiprocessors," IEEE, pp. 498-506, Dec. 1992.
Norman, R.S., "Hyperchip Business Summary, The Opportunity," Jan. 31, 2000, pp. 1-3.
Ohmsha, "Information Processing Handbook," edited by the Information Processing Society of Japan, p. 376, Dec. 21, 1998.
Olukotun, K., "The Case for a Single-Chip Microprocessor," ACM Sigplan Notices, ACM, Association for Computing Machinery, New York, vol. 31, No. 9, Sep. 1996 pp. 2-11.
Ozawa, Motokazu et al., "A Cascade ALU Architecture for Asynchronous Super-Scalar Processors," IEICE Transactions on Electronics, Electronics Society, Tokyo, Japan, vol. E84-C, No. 2, Feb. 2001, pp. 229-237.
PACT Corporation, "The XPP Communication System," Technical Report 15 (2000), pp. 1-16.
Parhami, B., "Parallel Counters for Signed Binary Signals," Signals, Systems and Computers, 1989, Twenty-Third Asilomar Conference, vol. 1, pp. 513-516.
PCI Local Bus Specification, Production Version, Revision 2.1, Jun. 1, Portland, OR, 1995, pp. 1-281.
Piotrowski, A., "IEC-Bus, Die Funktionsweise des IEC-Bus unde seine Anwendung in Geräten und Systemen," 1987, Franzis-Verlag GmbH, München, pp. 20-25, English abstract included.
Pirsch, P. et al., "VLSI implementations of image and video multimedia processing systems," *IEEE Transactions on Circuits and Systems for Video Technology*, vol. 8, No. 7, Nov. 1998, pp. 878-891.
Quenot, G.M., et al., "A Reconfigurable Compute Engine for Real-Time Vision Automata Prototyping," Laboratoire Systeme de Perception, DGA/Etablissement Technique Central de l'Armement, France, 1994 IEEE, pp. 91-100.
Razdan et al., A High-Performance Microarchitecture with Hardware-Programmable Functional Units, Micro-27, Proceedings of the 27$^{th}$ Annual International Symposium on Microarchitecture, IEEE Computer Society and Association for Computing Machinery, Nov. 30-Dec. 2, 1994, pp. 172-180.

(56) References Cited

OTHER PUBLICATIONS

Ryo, A., "Auszug aus Handbuch der Informationsverarbeitung," ed. Information Processing Society of Japan, *Information Processing Handbook, New Edition*, Software Information Center, Ohmsha, Dec. 1998, 4 pages. [Translation provided].
Saleeba, Z.M.G., "A Self-Reconfiguring Computer System," Department of Computer Science, Monash University (Dissertation) 1998, pp. 1-306.
Saleeba, M. "A Self-Contained Dynamically Reconfigurable Processor Architecture," Sixteenth Australian Computer Science Conference, ASCS-16, QLD, Australia, Feb. 1993, pp. 59-70.
Salefski, B. et al., "Re-configurable computing in wireless," *Annual ACM IEEE Design Automation Conference: Proceedings of the 38th conference on Design automation* (2001) pp. 178-183.
Schmidt, H. et al., "Behavioral synthesis for FGPA-based computing," Carnegie Mellon University, Pittsburgh, PA, 1994 IEEE, pp. 125-132.
Schmidt, U. et al., "Datawave: A Single-Chip Multiprocessor for Video Applications," *IEEE Micro*, vol. 11, No. 3, May/Jun. 1991, pp. 22-25, 88-94.
Schmit, et al., "Hidden Markov Modeling and Fuzzy Controllers in FPGAs, FPGAs for Custom Computing Machines," 1995; Proceedings, IEEE Symposium in Napa Valley, CA, Apr. 1995, pp. 214-221.
Schönfeld, M., et al., "The LISA Design Environment for the Synthesis of Array Processors Including Memories for the Data Transfer and Fault Tolerance by Reconfiguration and Coding Techniques," J. VLSI Signal Processing Systems for Signal, Image, and Video Technology, (Oct. 1, 1995) vol. 11(1/2), pp. 51-74.
Shin, D., et al., "C-based Interactive RTL Design Methodology," Technical Report CECS-03-42 (Dec. 2003) pp. 1-16.
Shirazi, et al., "Quantitative analysis of floating point arithmetic on FPGA based custom computing machines," IEEE Symposium on FPGAs for Custom Computing Machines, *IEEE Computer Society Press*, Apr. 19-21, 1995, pp. 155-162.
Siemers, C., "Rechenfabrik Ansaetze Fuer Extrem Parallele Prozessoren," Verlag Heinze Heise GmbH., Hannover, DE No. 15, Jul. 16, 2001, pp. 170-179.
Siemers et al., "The .>S<puter: A Novel Micoarchitecture Model for Execution inside Superscalar and VLIW Processors Using Reconfigurable Hardware," Australian Computer Science Communications, vol. 20, No. 4, Computer Architecture, Proceedings of the 3rd Australian Computer Architecture Conference, Perth, John Morris, Ed., Feb. 2-3, 1998, pp. 169-178.
Simunic, et al., Source Code Optimization and Profiling of Energy Consumption in Embedded Systems, Proceedings of the 13th International Symposium on System Synthesis, Sep. 2000, pp. 193-198.
Singh, H. et al., "MorphoSys: An Integrated Reconfigurable System for Data-Parallel Computation-Intensive Applications," University of California, Irvine, CA. and Federal University of Rio de Janeiro, Brazil, 2000, IEEE Transactions on Computers, pp. 1-35.
Skokan, Z.E., "Programmable logic machine (A programmable cell array)," IEEE Journal of Solid-State Circuits, vol. 18, Issue 5, Oct. 1983, pp. 572-578.
Sondervan, J., "Retiming and logic synthesis," Electronic Engineering (Jan. 1993) vol. 65(793), pp. 33, 35-36.
Soni, M., "VLSI Implementation of a Wormhole Run-time Reconfigurable Processor," Jun. 2001, (Masters Thesis)Virginia Polytechnic Institute and State University, 88 pages.
Sueyoshi, T, "Present Status and Problems of the Reconfigurable Computing Systems Toward the Computer Evolution," Department of Artificial Intelligence, Kyushi Institute of Technology, Fukuoka, Japan; Institute of Electronics, Information and Communication Engineers, vol. 96, No. 426, IEICE Technical Report (1996), pp. 111-119 [English Abstract Only].
Sutton et al., "A Multiprocessor DSP System Using PADDI-2," U.C. Berkeley, 1998 ACM, pp. 62-65.
Tau, E., et al., "A First Generation DPGA Implementation," *FPD '95*, pp. 138-143.

Tenca, A.F., et al., "A Variable Long-Precision Arithmetic Unit Design for Reconfigurable Coprocessor Architectures," University of California, Los Angeles, 1998, pp. 216-225.
The XPP White Paper, Release 2.1, PACT—A Technical Perspective, Mar. 27, 2002, pp. 1-27.
TMS320C54X DSP: CPU and Peripherals, Texas Instruments, 1996, 25 pages.
TMS320C54x DSP: Mnemonic Instruction Set, Texas Instruments, 1996, 342 pages.
Tsutsui, A., et al., "YARDS: FPGA/MPU Hybrid Architecture for Telecommunication Data Processing," NTT Optical Network Systems Laboratories, Japan, 1997 ACM, pp. 93-99.
Vasell et al., "The Function Processor: A Data-Driven Processor Array for Irregular Computations," Chalmers University of Technology, Sweden, 1992, pp. 1-21.
Villasenor, et al., "Configurable Computing Solutions for Automatic Target Recognition," *IEEE*, 1996 pp. 70-79.
Villasenor, et al., "Configurable Computing," *Scientific American*, vol. 276, No. 6, Jun. 1997, pp. 66-71.
Villasenor, et al., "Express Letters Video Communications Using Rapidly Reconfigurable Hardware," IEEE Transactions on Circuits and Systems for Video Technology, IEEE, Inc., NY, Dec. 1995, pp. 565-567.
Wada, et al., "A Performance Evaluation of Tree-based Coherent Distributed Shared Memory," Proceedings of the Pacific RIM Conference on Communications, Comput and Signal Processing, Victoria, May 19-21, 1993, pp. 390-393.
Waingold, E., et al., "Baring it all to software: Raw machines," IEEE Computer, Sep. 1997, at 86-93.
Weinhardt, M., "Compilation Methods for Structure-programmable Computers," dissertation, ISBN 3-89722-011-3, 1997. [Table of Contents and English Abstract Provided].
Weinhardt, Markus et al., "Pipeline Vectorization for Reconfigurable Systems," 1999, IEEE, pp. 52-62.
Weinhardt, Markus et al., "Pipeline Vectorization," IEEE Transactions on Computer-Aided Design of Integrated Circuits and Systems, vol. 20, No. 2, Feb. 2001, pp. 234-248.
Weinhardt, Markus et al., "Memory Access Optimization for Reconfigurable Systems," IEEE Proceedings Computers and Digital Techniques, 48(3) (May 2001) pp. 1-16.
Wittig, et al., "OneChip: An FPGA Processor with Reconfigurable Logic," IEEE, 1996, pp. 126-135.
Wolfe, M. et al., "High Performance Compilers for Parallel Computing," (Addison-Wesley 1996) Table of Contents, 11 pages.
Wu, et al., "A New Cache Directory Scheme," IEEE, pp. 466-472, Jun. 1996.
Xilinx, "Logic Cell Array Families: XC4000, XC4000A and XC4000H," 1994, product description, pp. 2-7, 2-9, 2-14, 2-15, 8-16, and 9-14.
Xilinx, "The Programmable Logic Data Book," 1994, Section 2, pp. 1-231, Section 8, pp. I, 23-25, 29, 45-52, 169-172.
Xilinx, "Spartan and SpartanXL Families Field Programmable Gate Arrays," Jan. 1999, Xilinx, pp. 4-3 through 4-70.
Xilinx, "XC6200 Field Programmable Gate Arrays," Apr. 24, 1997, Xilinx product description, pp. 1-73.
Xilinx, "XC3000 Series Field Programmable Gate Arrays," Nov. 6, 1998, Xilinx product description, pp. 1-76.
Xilinx, "XC4000E and XC4000X Series Field Programmable Gate Arrays," May 14, 1999, Xilinx product description, pp. 1-68.
Xilinx, "Virtex-E 1.8 V Extended Memory Field Programmable Gate Arrays," Jul. 17, 2002, Xilinx Production Product Specification, pp. 1-118.
Xilinx, "Virtex-E 1.8 V Extended Memory Field Programmable Gate Arrays," (v2.2) Sep. 10, 2002, Xilinx Production Product Specification, pp. 1-52.
Xilinx, "Virtex-II and Virtex-II Pro X FPGA User Guide," Mar. 28, 2007, Xilinx user guide, pp. 1-559.
Xilinx, "Virtex-II and Virtex-II Pro X FPGA Platform FPGAs: Complete Data Sheet," (v4.6) Mar. 5, 2007, pp. 1-302.
Xilinx, "Virtex-II Platform FPGAs: Complete Data Sheet," (v3.5) Nov. 5, 2007, pp. 1-226.

(56) References Cited

OTHER PUBLICATIONS

Xu, H. et al., "Parallel QR Factorization on a Block Data Flow Architecture," Conference Proceeding Article, Mar. I, 1992, pp. 332-336 XP010255276, p. 333, Abstract 2.2, 2.3, 2.4-p. 334.

Ye, Z.A. et al., "A C-Compiler for a Processor With a Reconfigurable Functional Unit," FPGA 2000 ACM/SIGNA International Symposium on Field Programmable Gate Arrays, Monterey, CA Feb. 9-11, 2000, pp. 95-100.

Yeung, A. et al., "A data-driven architecture for rapid prototyping of high throughput DSP algorithms," Dept. of Electrical Engineering and Computer Sciences, Univ. of California, Berkeley, USA, *Proceedings VLSI Signal Processing Workshop, IEEE Press*, pp. 225-234, Napa, Oct. 1992.

Yeung, A. et al., "A reconfigurable data-driven multiprocessor architecture for rapid prototyping of high throughput DSP algorithms," Dept. of Electrical Engineering and Computer Sciences, Univ. of California, Berkeley, USA, pp. 169-178, *IEEE* 1993.

Zhang, et al., "Architectural Evaluation of Flexible Digital Signal Processing for Wireless Receivers, Signals, Systems and Computers," 2000; Conference Record of the Thirty-Fourth Asilomar Conference, Bd. 1, Oct. 29, 2000, pp. 78-83.

Zhang, et al., "A 1-V Heterogeneous Reconfigurable DSP IC for Wireless Baseband Digital Signal Processing," IEEE Journal of Solid-State Circuits, vol. 35, No. 11, Nov. 2000, pp. 1697-1704.

Zhang et al., "Abstract: Low-Power Heterogeneous Reconfigurable Digital Signal Processors with Energy-Efficient Interconnect Network," U.C. Berkeley (2004), pp. 1-120.

Zima, H. et al., "Supercompilers for parallel and vector computers," (Addison-Wesley 1991) Table of Contents, 5 pages.

Coelho, F., "Compiling dynamic mappings with array copies," Jul. 1997, 12 pages, http://delivery.acm.org/10.1145/270000/263786/p168-coelho.pdf.

Janssen et al., "A Specification Invariant Technique for Regularity Improvement between Flow-Graph Clusters," Mar. 1996, 6 pages, http://delivery.acm.org/10.1145/790000/787534/74230138.pdf.

Microsoft Press Computer Dictionary, Second Edition, 1994, Microsoft Press, ISBN 1-55615-597-2, p. 10.

Newton, Harry, "Newton's Telecom Dictionary," Ninteenth Edition, 2003, CMP Books, p. 40.

Rehmouni et al., "Formulation and evaluation of scheduling techniques for control flow graphs," Dec. 1995, 6 pages, http://delivery.acm.org/10.1145/230000/224352/p386-rahmouni.pdf.

Sinha et al., "System-dependence-graph-based slicing of programs with arbitrary interprocedural control flow," May 1999, 10 pages, http://delivery.acm.org/10.1145/310000/203675/p432-sinha.pdf.

Stallings, William, "Data & Computer Communications," Sixth Edition, Jun. 2000, Prentice-Hall, Inc., ISBN 0-084370-9, pp. 195-196.

Bondalapati et al., "Reconfigurable Meshes: Theory and Practice," Dept. of Electrical Engineering-Systems, Univ. of Southern California, Apr. 1997, Reconfigurable Architectures Workshop, International Parallel Processing Symposium, 15 pages.

Cherbaka, Mark F., "Verification and Configuration of a Run-time Reconfigurable Custom Computing Integrated Circuit for DSP Applications," Thesis: Virginia Polytechnic Institute and State University, Jul. 8, 1996, 106 pages.

Cong et al., "Structural Gate Decomposition for Depth-Optimal Technology Mapping in LUT-Based FPGA Designs," Univ. of California, ACM Transactions on Design Automation of Electronic Systems, vol. 5, No. 2, Apr. 2000, pp. 193-225.

Foldoc, The Free On-Line Dictionary of Computing, "handshaking," online Jan. 13, 1995, retrieved from Internet Jan. 23, 2011 at http://foldoc.org/handshake.

Li et al., "Hardware-Software Co-Design of Embedded Reconfigurable Architectures," Los Angeles, CA, 2000 ACM, pp. 507-512.

Marshall et al., "A Reconfigurable Arithmetic Array for Multimedia Applications," FPGA '99 Proceedings of the 1999 ACM/SIGDA Seventh International Symposium on Field Programmable Gate Arrays, 10 pages.

Melvin, Stephen et al., "Hardware Support for Large Atomic Units in Dynamically Scheduled Machines," Computer Science Division, University of California, Berkeley, IEEE (1988), pp. 60-63.

Pistorius et al., "Generation of Very Large Circuits to Benchmark the Partitioning of FPGAs," Monterey, CA, ACM 1999, pp. 67-73.

Roterberg, Eric., et al., "Trace Cache: a Low Latency Approach to High Bandwidth Instruction Fetching," Proceedings of the 29th Annual International Symposium on Michoarchitecture, Paris, France, IEEE (1996), 12 pages.

Translation of DE 101 39 170 by examiner using Google Translate, 10 pages.

Altera, "Flex 8000 Programmable Logic Device Family," Altera Corporation Data Sheet, Jan. 2003, pp. 1-62.

Altera, "Flex 10K Embedded Programmable Logic Device Family," Altera Corporation Data Sheet, Jan. 2003, pp. 1-128.

Becker, J. et al., "Architecture, Memory and Interface Technology Integration of an Industrial/Academic Configurable System-on-Chip (CSoC)," IEEE Computer Society Annual Workshop on VLSI (WVLSI 2003), (Feb. 2003), 6 pages.

Becker, J., "Configurable Systems-on-Chip (CSoC)," (Invited Tutorial), Proc. of 9th Proc. of XV Brazilian Symposium on Integrated Circuit, Design (SBCCI 2002), (Sep. 2002), 6 pages.

Becker, J. et al., "Parallelization in Co-compilation for Configurable Accelerators—a Host/accelerator Partitioning Compilation Method," Proceedings of Asia and South Pacific Design Automation Conference, Yokohama, Japan, Feb. 10-13, 1998, 11 pages.

Becker, J., "A Partitioning Compiler for Computers with Xputer-based Accelerators," 1997, Kaiserslautern University, 326 pp.

Cardoso, J.M.P., et al., "Macro-Based Hardware Compilation of Java™ Bytecodes into a Dynamic Reconfigurable Computing System," IEEE, Apr. 21, 1999, pp. 2-11.

DeHon, A., "DPGA Utilization and Application," MIT Artificial Intelligence Laboratory, Proceedings of the Fourth International ACM Symposium on Field-Programmable Gate Arrays (FPGA 1996), IEEE Computer Society, pp. 1-7.

Fomaciari, et al., System-level power evaluation metrics, 1997 Proceedings of the 2nd Annual IEEE International Conference on Innovative Systems in Silicon, New York, NY, Oct. 1997, pp. 323-330.

Hartenstein et al., "Parallelizing Compilation for a Novel Data-Parallel Architecture," 1995, PCAT-94, Parallel Computing: Technology and Practice, 13 pp.

Hartenstein et al., "A Two-Level Co-Design Framework for Xputer-based Data-driven Reconfigurable Accelerators," 1997, Proceedings of the Thirtieth Annual Hawaii International Conference on System Sciences, 10 pp.

Hauser, J.R., et al., "Garp: A MIPS Processor with a Reconfigurable Coprocessor," University of California, Berkeley, IEEE, Apr. 1997, pp. 24-33.

Huang, Libo et al., "A New Architecture for Multiple-Precision Floating-Point Multiply-Add Fused Unit Design," School of Computer National University of Defense Technology, China, IEEE 2007, 8 pages.

IMEC, "ADRES multimedia processor & 3MF multimedia platform," Transferable IP, IMEC Technology Description, (Applicants believe the date to be Oct. 2005), 3 pages.

Isshiki, Tsuyoshi, et al., "Bit-Serial Pipeline Synthesis for Multi-FPGA Systems with C++ Design Capture," 1996 IEEE, pp. 38-47.

Jacob, J., et al., "Memory Interfacing and Instruction Specification for Reconfigurable Processors," ACM Feb. 1999, pp. 145-154.

Jo, Manhwee et al., "Implementation of Floating-Point Operations for 3D Graphics on a Coarse-Grained Reconfigurable Architecture," Design Automation Laboratory, School of EE/CS, Seoul National University, Korea, IEEE 2007, pp. 127-130.

Kanter, David, "NVIDIA's GT200: Inside a Parallel Processor," http://www.realworldtech.com/page.cfm?ArticleID=RWT090989195242&p=1, Sep. 8, 2008, 27 pages.

Lee, Ming-Hau et al., "Design and Implementation of the MorphoSys Reconfigurable Computing Processors," The Journal of VLSI Signal Processing, Kluwer Academic Publishers, BO, vol. 24, No. 2-3, Mar. 2, 2000, pp. 1-29.

Ling et al., "WASMII: A Multifunction Programmable Logic Device (MPLD) with Data Driven Control," The Transactions of the Institute of Electronics, Information and Communication Engineers, Apr. 25,

(56) References Cited

OTHER PUBLICATIONS 1994, vol. J77-D-1, Nr. 4, pp. 309-317. [This reference is in Chinese, but should be comparable in content to the Ling et al. reference above.]
Mei, Bingfeng et al., "Design and Optimization of Dynamically Reconfigurable Embedded Systems," IMEC vzw, 2003, Belgium, 7 pages, http://www.imec.be/reconfigurabie/pdf/ICERSA_01_design.pdf.
Mei, Bingfeng et al., "Adres: An Architecture with Tightly Coupled VLIW Processor and Coarse-Grained Reconfigurable Matrix," Proc. *Field-Programmable Logic and Applications* (FPL 03), Springer, 2003, pp. 61-70.
Ohmsha, "Information Processing Handbook," edited by the Information Processing Society of Japan, pp. 376, Dec. 21, 1998.
Parhami, B., "Parallel Counters for Signed Binary Signals," Signals, Systems and Computers, 1989, Twenty-Third Asilomar Conference, vol. I, pp. 513-516.
PCI Local Bus Specification, Production Version, Revision 2.1, Portland, OR, Jun. 1, 1995, pp. 1-281.
Piotrowski, A., "IEC-Bus, Die Funktionsweise des IEC-Bus unde seine Anwendung in Geräten and Systemen," 1987, Franzis-Verlag GmbH, München, pp. 20-25. [English Abstract Provided].
Xilinx, "The Programmable Logic Data Book," 1994, Section 2, pp. 1-231, Section 8, pp. 1, 23-25, 29, 45-52, 169-172.
Xilinx, "Virtex-E 1.8 V Extended Memory Field Programmable Gate Arrays," (v1.5) Jul. 17, 2002, Xilinx Production Product Specification, pp. 1-118.
Xilinx, White Paper 370: (Virtex-6 and Spartan-6 FPGA Families) "Reducing Switching Power with Intelligent Clock Gating," Frederic Rivoallon, May 3, 2010, pp. 1-5.
Xilinx, White Paper 298: (Spartan-6 and Virtex-6 Devices) "Power Consumption at 40 and 50 nm," Matt Klein, Apr. 13, 2009, pp. 1-21.
Xu, H. et al., "Parallel QR Factorization on a Block Data Flow Architecture," Conference Proceeding Article, Mar. 1, 1992, pp. 332-336 XPO10255276, p. 333, Abstract 2.2, 2.3, 2.4-p. 334.
Ye, Z.A. et al., "A C-Compiler for a Processor With a Reconfigurable Functional Unit," FPGA 2000 ACM/SIGNA International Symposium on Field Programmable Gate Arrays, Monterey, CA Feb 9-11, 2000, pp. 95-100.
ARM, "The Architecture for the Digital World; Milestones," htto://www.arm.com/aboutarm/milestones.html Mar. 18, 2009, 5 pages.
Albaharna, O.T. et al., "On the Viability of FPGA-Based Integrated Coprocessors," Dept. of Electrical and Electronic Engineering, Imperial College of Science, London, 1999 IEEE, pp. 206-215.
Altera, "2. TriMatrix Embedded Memory Blocks in Stratix & Stratix GX Devices," Altera Corporation, Jul. 2005, 28 pages.
Altera, "APEX II Programmable Logic Device Family," Altera Corporation Data Sheet, Aug. 2002, Ver. 3.0, 99 pages.
Bacon, D. et al., "Compiler Transformations for High-Perfomance Computing," ACM Computing Surveys, 26(4):325-420 (1994).
"BlueGene/L—Hardware Architecture Overview," BlueGene/L design team, IBM Research, Oct. 17, 2003 slide presentation, pp. 1-23.
"BlueGene/L: the next generation of scalable supercomputer," Kissel et al., Lawrence Livermore National Laboratory, Livermore, California, Nov. 18, 2002, 29 pages.
BlueGene Project Update, Jan. 2002, IBM slide presentation, 20 pages.
BlueGene/L, "An Overview of the BlueGene/L Supercomputer," The BlueGene/L Team, IBM and Lawrence Livermore National Laboratory, 2002 IEEE. pp. 1-22.
Epstein, Dave, "IBM Extends DSP Performance with Mfaxt," Microprocessor Report, vol. 9, No. 16 (MicroDesign Resources), Dec. 4, 1995, pp. 1-4 [XL0029013].
Forstner, "Wer Zuerst Kommt, Mahit Zuerst!: Teil 3: Einsatzgebiete und Anwendungbeispiele von FIFO-Speichern," Elektronik, Aug. 2000, pp. 104-109.
Galanis, M.D. et al., "Accelerating Applications by Mapping Critical Kernels on Coarse-Grain Reconfigurable Hardware in Hybrid Systems," Proceedings of the 13th Annual IEEE Symposium on Field-Programmable Custom Computing Machines, 2005, 2 pages.
Guo, Z. et al., "A Compiler Intermediate Representation for Reconfigurable Fabrics," UniVersity of California, Riverside, Dept. of Electrical Engineering, IEEE 2006, 4 pages.
Gwennap, Linley, "P6 Underscores Intel's Lead," Microprocessor Report, vol. 9., No. 2, Feb. 16, 1995 (MicroDesign Resources), p. 1 and pp. 6-15.
Gwennap, Linley, "Intel's P6 Bus Designed for Multiprocessing," Microprocessor Report, vol. 9, No. 7 (MicroDesign Resources), May 30, 1995, p. 1 and pp. 6-10.
Intel, "Pentium Pro Family Developer's Manual , vol. 3: Operating System Writer's Guide," Intel Corporation, Dec. 1995, [submitted in 4 PDF files: Part I, Part II, Part III and Part IV], 458 pages.
Iseli, C., et al. "A C++ Compiler for FPGA Custom Execution Units Synthesis," IEEE, 1995, pp. 173-479.
Isstiki, Tsuyoshi, et al., "Bit-Serial Pipeline Synthesis for Multi-FPGA Systems with C++ Design Capture," 1996 IEEE, pp. 38-47.
Ling et al., "WSMII: A Multifunction Programmable Logic Device (MPLD) with Data Driven Control," The Transactions of the Institute of Electronics, Information and Communication Engineers, Apr. 25, 1994, vol. J77-D-1, Nr. 4, pp. 309-317. [This reference is in Chinese, but should be comparable in content to the Ling et al. reference above.].
Mario, M.M., "Digital Design," by Prentice Hall, Inc., Englewood Cliffs, New Jersey 07632, 1984, pp. 119-125, 154-161.
Maxfield,C., "Logic that Mutates While-U-Wait," EDN (Bur. Ed) (USA), EDNn (European Edition), Nov. 7, 1996, Cahners Publishing, USA, pp. 137-140, 142.
Murphy, C., "Virtual Hardware Using Dynamic Reconfigurabie Field Programmable Gate Arrays," Engineering Development Centre, Liverpool John Moores University, UK, Geri Annual Research Symposium 2005, 8 pages.
Piotrowski, A., "IEC-Bus, Die Funktionsweise des IEC-Bus unde seine Anwendung in Geräten und Systemen," 1987, Franzis-Verlag GmbH, München, pp. 20-25. [English Abstract Provided].
Schönfeld, M., et al., "The LISA Design Environment for the Synthesis of Array Processors Including Memories for the Data Transfer and Fault Tolerance by Reconfiguration and Coding Techniques," J. VLSI Signal Processing Systems for Signal, Image, and Video Technology, (Oct. 1, 1995) vol. 11 (1/2), pp. 51-74.
Altera, "Implementing High-Speed Search Applications with Altera CAM," Jul. 2001, Ver. 2.1, Application Note 119, 50 pages.
Bolsens, Ivo (CTO Xilinx), "FPGA, a history of interconnect," Xilinx slide presentation, posted on the internet Oct. 30, 2008 at http://www.docstoc.com/docs/2198008/FPGA-a-history-of-interconnect, 32 pages.
U.S. Appl. No. 90/010,979, filed May 4, 2010, Vorbach et al.
U.S. Appl. No. 90/011,087, filed Jul. 8, 2010, Vorbach et al.
Hauser, John Reid, (Dissertation) "Augmenting A Microprocessor with Reconfigurable Hardware," University of California, Berkeley, Fall 2000, 255 pages. (submitted in 3 PDFs, Parts 1-3).
Hauser, John R., "The Garp Architecture,"University of California at Berkeley, Computer Science Division, Oct. 1997, pp. 1-55.
Venkatachalam et al., "A highly flexible, distributed multiprocessor architecture for network processing," Computer Networks, The International Journal of Computer and Telecommunications Networking, vol. 41, No. 5, Apr. 5, 2003, pp. 563-568.
Xilinx, Inc.'s and Avnet, Inc.'s Disclosure Pursuant to P.R. 4-2; *PACT XPP Technologies, AG. V. Xilinx, Inc. and Avnet, Inc.*, Case No. 2:07-cv-00563-TJW-CE, U.S. District Court for the Eastern District of Texas, Dec. 28, 2007, 4 pages.
Xilinx, Inc.'s and Avnet, Inc.'s Disclosure Pursuant to P.R. 4-1; *PACT XPP Technologies, AG. V. Xilinx, Inc. and Avnet, Inc.*, Case No. 2:07-cv-00563-TJW-CE, U.S. District Court for the Eastern District of Texas, Dec. 28, 2007, 9 pages.
Defendant's Claim Construction Chart for P.R. 4-2 Constructions and Extrinsic Evidence for Terms Proposed by Defendants, *PACT XPP Technologies, AG. V.Xilinx, Inc, and AVENT, Inc.*, Case No. 2:07-cv-00563-TJW-CE, U.S. District Court for the Eastern District of Texas, Dec. 28, 2007, pp. 1-19.

(56) References Cited

OTHER PUBLICATIONS

PACT's P.R. 4-1 List of Claim Terms for Construction, *PACT XPP Technologies, AG. V. Xilinx, Inc. and Avnet Inc.*, Case No. 2:07-cv-00563-TJW-CE, U.S. District Court for the Eastern District of Texas, Dec. 28, 2007, pp. 1-7.
PACT's P.R. 4-2 Preliminary Claim Constructions and Extrinsic Evidence, *PACT XPP Technologies, AG. V. Xilinx, Inc. and AVNET, Inc.*, Case No. 2:07-cv-00563-TJW-CE, U.S. District Court for the Eastern District of Texas, Dec. 28, 2007, pp. 1-16, and Exhibits re Extrinsic Evidence Parts in seven (7) separate additional PDF files (Parts 1-7).
Ballagh et al., "Java Debug Hardware Models Using JBits," 8$^{th}$ Reconfigurable Architectures Workshop, 2001, 8 pages.
Bellows et al., "Designing Run-Time Reconfigurable Systems with JHDL," Journal of VLSI Signal Processing, vol. 28, Kluwer Academic Publishers, The Netherlands, 2001, pp. 29-45.
Guccione et al., "JBits: Java based interface for reconfigurable computing," Xilinx, Inc., San Jose, CA, 1999; 9 pages.
Price et al., "Debug of Reconfigurable Systems," Xilinx, Inc., San Jose, CA, Proceedings of SPIE, 2000, pp. 181-187.
Sundararajan et al., "Testing FPGA Devices Using JBits," Proc. MAPLD 2001, Maryland, USA, Katz (ed.), NASA, CA, 8 pages.
U.S. Appl. No. 90/010,450, filed Mar. 27, 2009.
Microsoft Press Computer Dictionary, Third Edition, Redmond, WA, 1997, 3 pages.
Microsoft Press Computer Dictionary, Second Edition, Redmond, WA, 1994, 3 pages.
A Dictionary of Computing, Fourth Edition, Oxford University Press, 1997, 4 pages.
Communications Standard Dictionary, Third Edition, Martin Weik (Ed.), Chapman & Hall, 1996, 3 pages.
Dictionary of Communications Technology, Terms Definitions and Abbreviations, Second Edition, Gilbert Held (Ed.), John Wiley & Sons, England, 1995, 5 pages.
The Random House College Dictionary, Revised Edition, Random House, Inc., 1984, 14 pages.
The Random House College Dictionary, Revised Edition, Random House, Inc., 1984, 7 pages.
Random House Webster's College Dictionary with CD-ROM, Random House, 2001, 7 pages.
Random House Webster's College Dictionary with CD-ROM, Random House, 2001, 4 pages.
Random House Personal Computer Dictionary, Second Edition, Philip E. Margolis (Ed.), Random House, New York, 1996, 5 pages.
The IEEE Standard Dictionary of Electrical and Electronics Terms, Sixth Edition, 1996, 36 pages.
The IEEE Standard Dictionary of Electrical and Electronics Terms, Sixth Edition, 1996, 8 pages.
McGraw-Hill Electronics Dictionary, Sixth Edition, Neil Sclater et al. (Ed.), McGraw-Hill, 1997, 3 pages.
Modem Dictionary of Electronics, Sixth Edition, Rudolf Graf (Ed.), Newnes (Butterwoth-Heinemann), 1997, 5 pages.
The American Heritage Dictionary, Fourth Edition, Dell (Houghton-Mifflin), 2001, 5 pages.
The American Heritage Dictionary, Second College Edition, Houghton Mifflin, 1982, 23 pages.
The American Heritage Dictionary, Second College Edition, Houghton Mifflin, 1982, 8 pages.
The American Heritage Dictionary, Third Edition, Dell Publishing (Bantam Doubleday Dell Publishing Group, Inc.), 1994, 4 pages.
The American Heritage Dictionary, Fourth Edition, Dell/Houghton Mifflin 2001, 5 pages.
Webster's New Collegiate Dictionary, Merriam Co., 1981, 5 pages.
Webster's New Collegiate Dictionary, Merriam Co., 1981, 4 pages.
The Oxford American Dictionary and Language Guide, Oxford University Press, 1999, 5 pages.
The Oxford Duden German Dictionary, Edited by the Dudenredaktion and the German Section of the Oxford University Press, W. Scholze-Stubenrecht et al. (Eds), Clarendon Press, Oxford, 1990, 7 pages.
Oxford Dictionary of Computing, Oxford University Press, 2008, 4 pages.
Modern Dictionary of Electronics, Sixth Edition Revised and Updated, Rudolf F. Graf (Ed.), Butterworth-Heinemann, 1997, 7 pages.
Modern Dictionary of Electronics, Sixth Edition Revised and Updated, Rudolf F. Graf (Ed.), Butterworth-Heinemann, 1997, 5 pages.
Garner's Modern American Usage, Bryan A. Garner (Ed.), Oxford University Press, 2003, 3 pages.
The New Fowler's Modern English Usage, R.W. Burchfield (Ed.), Oxford University Press, 2000, 3 pages.
Wikipedia, the free encyclopedia, "Granularity", at http://en.wikipedia.org/wiki/Granularity, Jun. 18, 2010, 4 pages.
Wordsmyth, The Premier Educational Dictionary—Thesaurus, at http://www.wordsmyth.net , "communication", Jun. 18, 2010, 1 page.
Yahoo! Education, "affect", at http://education.yahoo.com/reference/dictionary/entry/affect , Jun. 18, 2010, 2 pages.
mPulse Living Language, "high-level", at http://www.macmillandictionary.com/dictionary/american/high-level , Jun. 18, 2010, 1 page.
MSN Encarta, "regroup", at http://encarta.msn.com/encnet/features/dictionary/DictionaryResults.aspx?lextype=3&search=regroup, Jun. 17, 2010, 2 pages.
MSN Encarta, "synchronize", at http://encarta.msn.com/encnet/features/dictionary/DictionaryResults.aspx!lextype=3& search=synchronize , Jun. 17, 2010, 2 pages.
MSN Encarta, "pattern", at http://encarta.msn.com/encnet/features/dictionary/DictionaryResults.aspx?lextype=3&search=pattem, Jun. 17, 2010, 2 pages.
MSN Encarta, "dimension", at http://encarta.msn.com/encnet/features/dictionary/DictionaryResults.aspx?lextype=3&search=dimension, Jun. 17, 2010, 2 pages.
MSN Encarta, "communication", at http://encarta.msn.com/encnet/features/dictionary/DictionaryResults.aspx?lextype=3&search-communication, Jun. 17, 2010, 2 pages.
MSN Encarta, "arrangement", at http://encarta.msn.com/encnet/features/dictionary/DictionaryResults.aspx?lextype=3& search=arrangement, Jun. 17, 2010, 2 pages.
MSN Encarta, "vector", at http://encarta.msn.com/encnet/features/dictionary/DictionaryResults.aspx?lextype=38&search=vector, Jul. 30, 2010, 2 pages.
Dictionary.com, "address", at http://dictionary.reference.com/browse/address , Jun. 18, 2010, 4 pages.
P.R . 4-3 Joint Claim Constructions Statement, *PACT XPP Technologies, AG v. Xilinx, Inc. and Avnet, Inc et al.*, E.D. Texas, 2:07-cv-00563-CE, Jul. 19, 2010, pp. 1-50.
Order Granting Joint Motion for Leave to File An Amended Joint Claim Construction and Prehearing Statement and Joint Motion to File an Amended Joint Claim Construction and Prehearing Statement Pursuant to Local Patent Rule 4-3, and Exhibit A: P.R. 4-3 Amended Joint Claim Constructions Statement, *PACT XPP Technologies, AG v. Xilinx, Inc. and Avnet, Inc. et al.*, E.D. Texas, 2:07-cv-00563-CE, Aug. 2, 2010, 72 pages.
P.R. 4-3 Amended Joint Claim Constructions Statement, *PACT XPP Technologies, AG v. Xilinx, Inc. and Avnet, Inc. et al.*, E.D. Texas, 2:07-cv-00563-CE, Aug. 3, 2010, pp. 1-65.
Exhibit A—P.R. 4-3 Amended Joint Claim Constructions Statement, *PACT APP Technologies, AG v. Xilinx, Inc. and Avnet, Inc. et al.*, E.D. Texas, 2:07-cv-00563-CE, Aug. 2, 2010, pp. 1-66.
PACT's Opening Claim Construction Brief, *PACT XPP Technologies, AG v. Xilinx, Inc. and Avnet, Inc.*, E.D. Texas, 2:07-cv-00563-CE, Nov. 1, 2010, pp. 1-55.
Declaration of Harry L. (Nick) Tredennick in Support of PACT's Claim Constructions, *PACT XPP Technologies, AG v. Xilinx Inc. and Avnet, Inc. et al.*, E.D. Texas, 2:07-cv-00563-CE, Nov. 1, 2010, pp. 1-87.
Transcript of Harry (Nick) L. Tredennick III, Ph.D., Oct. 11, 2010, vol. 1, Exhibit 16 of PACT's Opening Claim Construction Brief, *PACT XPP Technologies, AG v. Xilinx, Inc. and Avnet, Inc. et al.*, E.D. Texas, 2:07-cv-00563-CE, Nov. 1, 2010, pp. 1-3.

(56) References Cited

OTHER PUBLICATIONS

Agreed and Disputed Terms, Exhibit 17 of PACT's Opening Claim Construction Brief, *PACT XPP Technologies, AG v. Xilinx, Inc. and Avnet, Inc. et al.*, E.D. Texas, 2:07-cv-00563-CE, Nov. 1, 2010, pp. 1-16.

Oral Videotaped Deposition—Joseph McAlexander dated Oct. 12, 2010, vol. 1, Exhibit 18 of PACT's Opening Claim Construction Brief, *PACT XPP Technologies, AG v. Xilinx, Inc. and Avnet, Inc. et al.*, E.D. Texas, 2:07-cv-00563-CE, Nov. 1, 2010, pp. 1-17.

Expert Report of Joe McAlexander Re Claim Construction dated Sep. 27, 2010, Exhibit 19 of PACT's Opening Claim Construction Brief, *PACT XPP Technologies, AG v. Xilinx, Inc. and Avnet, Inc. et al.*, E.D. Texas, 2:07-cv-00563-CE, Nov. 1, 2010, pp. 1-112.

Documents from File History of U.S. Appl. No. 09/290,342, filed Apr. 12, 1999, Exhibit 20 of PACT's Opening Claim Construction Brief, *PACT XPP Technologies, AG v. Xilinx, Inc. and Avnet, Inc. et al.*, E.D. Texas, 2:07-cv-00563-CE, Nov. 1, 2010, pp. 1-37.

Amendment from File History of U.S. Appl. No. 10/156,397, filed May 28, 2002, Exhibit 25 of PACT's Opening Claim Construction Brief, *PACT XPP Technologies, AG v. Xilinx, Inc. and Avnet, Inc. et al.*, E.D. Texas, 2:07-cv-00563-CE, Nov. 1, 2010, pp. 1-12.

Documents from File History U.S. Appl. No. 09/329,132, filed Jun. 9, 1999, Exhibit 27 of PACT's Opening Claim Construction Brief, *PACT XPP Technologies, AG v. Xilinx, Inc. and Avnet, Inc. et al.*, E.D. Texas, 2:07-cv-00563-CE, Nov. 1, 2010, pp. 1-36.

Amendment from File History of U.S. Appl. No. 10/791,501, filed Mar. 1, 2004, Exhibit 39 of PACT's Opening Claim Construction Brief, *PACT XPP Technologies, AG v. Xilinx, Inc. and Avnet, Inc. et al.*, E.D. Texas, 2:07-cv-00563-CE, Nov. 1, 2010, pp. 1-9.

Amendment from File History of U.S. Appl. No. 10/265,846, filed Oct. 7, 2002, Exhibit 40 of PACT's Opening Claim Construction Brief, *PACT XPP Technologies, AG v. Xilinx, Inc. and Avnet, Inc. et al.*, E.D. Texas, 2:07-cv-00563-CE, Nov. 1, 2010, pp. 1-12.

Defendants Xilinx, Inc. and Avnet, Inc.'s Responsive Claim Construction Brief, *PACT XPP Technologies, AG v. Xilinx, Inc. and Avnet, Inc. et al.*, E.D. Texas, 2:07-cv-00563-CE, Dec. 6, 2010, pp. 1-55.

Declaration of Aaron Taggart in Support of Defendants Xilinx, Inc. and Avnet, Inc.'s Responsive Claim Construction Brief, Defendants Xilinx, Inc. and Avnet, Inc.'s Responsive Claim Construction Brief (Exhibit A), *PACT XPP Technologies, AG v. Xilinx, Inc. and Avnet, Inc. et al.*, E.D. Texas, 2:07-cv-00563-CE, Dec. 6, 2010, pp. 1-5.

Oral Videotaped Deposition Joseph McAlexander (Oct. 12, 2010), Exhibit 1 of Defendants Xilinx, Inc. and Avnet, Inc.'s Responsive Claim Construction Brief, *PACT XPP Technologies, AG v. Xilinx, Inc. and Avnet, Inc. et al.*, E.D. Texas, 2:07-cv-00563-CE, Dec. 6, 2010, pp. 1-9.

Expert Report of Joe McAlexander re Claim Construction, Exhibit 2 of Defendants Xilinx, Inc. and Avnet, Inc.'s Responsive Claim Construction Brief, *PACT XPP Technologies, AG v. Xilinx, Inc. and Avnet, Inc. et al.*, E.D. Texas, 2:07-cv-00563-CE, Dec. 6, 2010, pp. 1-137.

Various Documents from File History of U.S. Appl. No. 09/290,342, filed Apr. 12, 1999), Exhibit 6 of Defendants Xilinx, Inc. and Avnet, Inc.'s Responsive Claim Construction Brief, *PACT XPP Technologies, AG v. Xilinx, Inc. and Avnet, Inc. et al.*, E.D. Texas, 2:07-cv-00563-CE, Dec. 6, 2010, pp. 1-181.

Transcript of Harry (Nick) L. Tredennick III, Ph.D., Oct. 11, 2010, vol. 1, Exhibit 7 of Defendants Xilinx, Inc. and Avnet, Inc.'s Responsive Claim Construction Brief, *PACT XPP Technologies, AG v. Xilinx, Inc. and Avnet, Inc. et al.*, E.D. Texas, 2:07-cv-00563-CE, Dec. 6, 2010, pp. 1-28.

Amendment, Response from File History of U.S. Appl. No. 10/156,397, filed May 28, 2002, Exhibit 15 of Defendants Xilinx, Inc. and Avnet, Inc.'s Responsive Claim Construction Brief, *PACT XPP Technologies, AG v. Xilinx, Inc. and Avnet, Inc. et al.*, E.D. Texas, 2:07-cv-00563-CE, Dec. 6, 2010, pp. 1-137.

Application from File History of U.S. Appl. No. 08/544,435, filed Nov. 17, 1995, Exhibit 20 of Defendants Xilinx, Inc. and Avnet, Inc.'s Responsive Claim Construction Brief, *PACT XPP Technologies, AG v. Xilinx, Inc. and Avnet, Inc. et al.*, E.D. Texas, 2:07-cv-00563-CE, Dec. 6, 2010, pp. 1-102.

Documents from File History of U.S. Appl. No. 09/329,132, filed Jun. 9, 1999, Exhibit 24 of Defendants Xilinx, Inc. and Avnet, Inc.'s Responsive Claim Construction Brief, *PACT XPP Technologies, AG v. Xilinx, Inc. and Avnet, Inc. et al.*, E.D. Texas, 2:07-cv-00563-CE, Dec. 6, 2010, pp. 1-13.

Documents from File History of U.S. Appl. No. 10/791,501, filed Mar. 1, 2004, Exhibit 25 of Defendants Xilinx, Inc. and Avnet, Inc.'s Responsive Claim Construction Brief, *PACT XPP Technologies, AG v. Xilinx, Inc. and Avnet, Inc. et al.*, E.D. Texas, 2:07-cv-00563-CE, Dec. 6, 2010, pp. 1-14.

Amendment from File History of U.S. Appl. No. 11/246,617, filed Oct. 7, 2005, Exhibit 26 of Defendants Xilinx, Inc. and Avnet, Inc.'s Responsive Claim Construction Brief, *PACT XPP Technologies, AG v. Xilinx, Inc. and Avnet, Inc. et al.*, E.D. Texas, 2:07-cv-00563-CE, Dec. 6, 2010, pp. 1-9.

Documents from File History of U.S. Appl. No. 08/947,254, filed Oct. 8, 1997, Exhibit 27 of Defendants Xilinx, Inc. and Avnet, Inc.'s Responsive Claim Construction Brief, *PACT XPP Technologies, AG v. Xilinx, Inc. and Avnet, Inc. et al.*, E.D. Texas, 2:07-cv-00563-CE, Dec. 6, 2010, pp. 1-38.

Documents from File History of U.S. Appl. No. 08/947,254, filed Oct. 8, 1997, specifically, German priority application specification [English translation provided], Exhibit 33 of Defendants Xilinx, Inc. and Avnet, Inc.'s Responsive Claim Construction Brief, *PACT XPP Technologies, AG v. Xilinx, Inc. and Avnet, Inc. et al.*, E.D. Texas, 2:07-cv-00563-CE, Dec. 6, 2010, 54 pages [including English translation].

Documents from File History of U.S. Appl. No. 09/335,974, filed Jun. 18, 1999, Exhibit 28 of Defendants Xilinx, Inc. and Avnet, Inc.'s Responsive Claim Construction Brief, *PACT XPP Technologies, AG v. Xilinx, Inc. and Avnet, Inc. et al.*, E.D. Texas, 2:07-cv-00563-CE, Dec. 6, 2010, pp. 1-32.

Documents from File History of U.S. Patent Reexamination Control No. 90/010,450, filed Mar. 27, 2009, Exhibit 30 of Defendants Xilinx, Inc. and Avnet, Inc.'s Responsive Claim Construction Brief, *PACT XPP Technologies, AG v. Xilinx, Inc. and Avnet, Inc. et al.*, E.D. Texas, 2:07-cv-00563-CE, Dec. 6, 2010, pp. 1-71.

Documents from File History of U.S. Appl. No. 10/265,846, filed Oct. 7, 2002, Exhibit 32 of Defendants Xilinx, Inc. and Avnet, Inc.'s Responsive Claim Construction Brief, *PACT XPP Technologies, AG v. Xilinx, Inc. and Avnet, Inc. et al.*, E.D. Texas, 2: 07-cv-00563-CE, Dec. 6, 2010, pp. 1-23.

PACT's Claim Construction Reply Brief, *PACT XPP Technologies, AG v. Xilinx, Inc. and Avnet, Inc. et al.*, E.D. Texas, 2:07-cv-00563-CE, Jan. 7, 2011, pp. 1-20.

Defendants Xilinx, Inc. and Avnet, Inc.'s Claim Construction Sur-reply Brief, *PACT XPP Technologies, AG v. Xilinx, Inc. and Avnet, Inc. et al.*, E.D. Texas, 2:07-cv-00563-CE, Jan. 18, 2011, 142 pages.

Markman Hearing Minutes and Attorney Sign-In Sheet, *PACT XPP Technologies, AG v. Xilinx, Inc. and Avnet, Inc. et al.*, E.D. Texas, 2:07-cv-00563-CE, Feb. 22, 2011, 3 pages; and court transcript, 245 pages.

Memorandum Opinion and Order, *PACT XPP Technologies, AG v. Xilinx, Inc. and Avnet, Inc. et al.*, E.D. Texas, 2:07-cv-00563-CE, Jun. 17, 2011, pp. 1-71.

Atmel Corporation, Atmel 5-K-50K Gates Coprocessor FPGA and FreeRAM, (www.atmel.com), Apr. 2002, pp. 1-68.

Glaskowsky, Peter N., "PACT Debuts Extreme Processor; Reconfigurable ALU Array Is Very Powerful—and Very Complex" Microprocessor, The Insider's Guide to Microprocessor Hardware, MicroDesign Resources—Microprocessor Report, Oct. 9, 2000 (www.MPRonline.com), 6 pages.

Glaskowsky, Peter N., "Analysis' Choice Nominees Named; Our Picks for 2002's Most Important Products and Technologies" Microprocessor, The Insider's Guide to Microprocessor Hardware, MicroDesign Resources—Microprocessor Report, Dec. 9, 2002 (www.MPRonline.com), 4 pages.

Lattice Semiconductor Corporation, ispLSI 2000E, 2000VE and 2000 VL Family Architectural Description, Oct. 2001, pp. 1-88.

Olukotun, K. et al., "Rationale, Design and Performance of the Hydra Multiprocessor," Computer Systems Laboratory, Stanford University, CA, Nov. 1994, pp. 1-19.

(56) References Cited

OTHER PUBLICATIONS

PACT Corporate Backgrounder, PACT company release, Oct. 2008, 4 pages.
Page, Ian., "Reconfigurable processor architectures," Oxford University Computing Laboratory, Oxford UK, Elsevier Science B.V., Microprocessors an Microsystems 20 (1996) pp. 185-196.
Singh, Hartej et al., "Morpho-Sys: A Reconfigurable Architecture for Multimedia Applications," Univ. of California, Irvine, CA and Federal University of Rio de Janiero, Brazil, at http://www.eng.uci.edu/morphosys/docs/sbcci98.html 10 pages.
Theodoridis, G. et al., "Chapter 2—A Survey of Coarse-Grain Reconfigurable Architectures and Cad Tools, Basic Definitions, Critical Design Issues and Existing Coarse-grain Reconfigurable Systems," from S. Vassiliadis, and D. Soudris (eds.) *Fine- and Coarse-Grained Reconfigurable Computing*, Springer 2007, pp. 89-149.
Weinhardt, Markus et al., "Using Function Folding to Improve Silicon Efficiency of Reconfigurable Arithmetic Arrays," PACT XPP Technologies AG, Munich, Germany, IEEE 2004, pp. 239-245.
Xilinx, XC6200 Field Programmable Gate Arrays, Advance Product Specification, Jun. 1, 1996 (Version 1.0), pp. 4-255 through 4-286.
Xilinx, Virtex-II Platform FPGA User Guide, UG002 (V2.1) Mar. 28, 2007, pp. 1-502 [Parts 1-3].
Xilinx, XC4000E and SC4000X Serial Field Programmable Gate Arrays, Product Specification (Version 1.6), May 14, 1999, pp. 1-107.
Culler, D.E; Singh, J.P., "Parallel Computer Architecture," p. 17, 1999, Morgan Kaufmann, San Francisco, CA USA, XP002477559.
Short, Kenneth L., *Microprocessors and Programmed Logic*, Prentice Hall, Inc., New Jersey 1981, p. 34.
Webster's Ninth New Collegiate Dictionary, Merriam-Webster, Inc., 1990, p. 332 (definition of "dedicated").
Ramanathan et al., "Reconfigurable Filter Coprocessor Architecture for DSP Applications," Journal of VLSI Signal Processing, 2000, vol. 26, pp. 333-359.
Shanley, Tom, *Pentium Pro and Pentium II System Architecture*, MindShare, Inc., Addition Wesley, 1998, Second Edition, pp. 11-17; Chapter 7; Chapter 10; pp. 209-211, and p. 394.
Shoup, Richard, "Programmable Cellular Logic Arrays," Dissertation, Computer Science Department, Carnegie-Mellon University, Mar. 1970, 193 pages.
Zucker, Daniel F., "A Comparison of Hardware Prefetching Techniques for Multimedia Benchmarks," Technical Report: CSL-TR-95-683, Dec. 1995, 26 pages.
"On High-Bandwidth Data Cache Design for Multi-Issue Processors," Jude A. Rivers, et al., Published in the Proceedings of Micro-30, Dec. 1-3, 1997.

\* cited by examiner

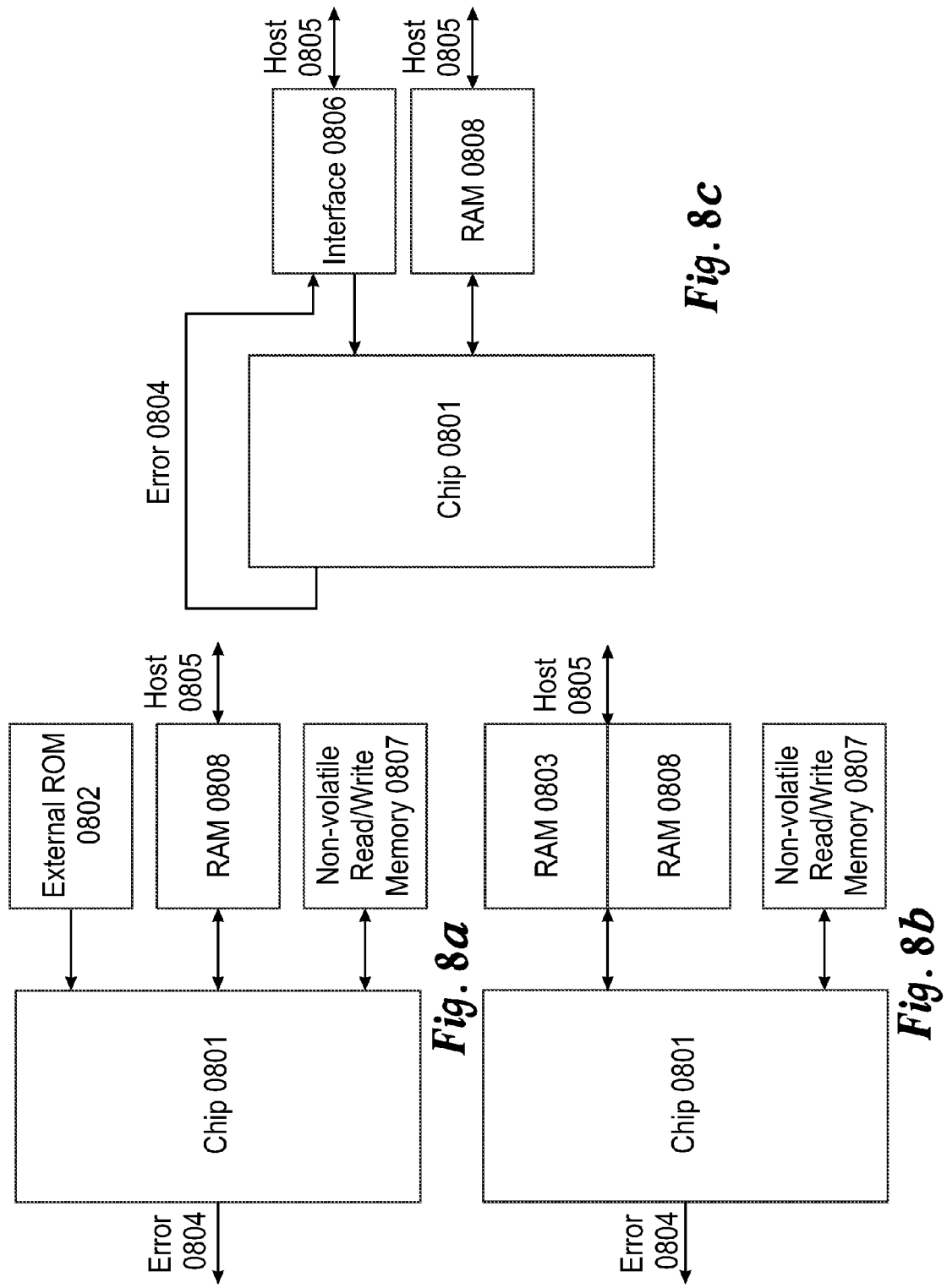

US 8,819,505 B2

DATA PROCESSOR HAVING DISABLED CORES

CROSS REFERENCE TO RELATED APPLICATIONS

This application is a continuation of and claims priority to U.S. patent application Ser. No. 10/757,900, filed on Jan. 14, 2004 (now U.S. Pat. No. 7,584,390); which is a continuation of U.S. patent application Ser. No. 09/598,926, filed on Jun. 21, 2000 (now U.S. Pat. No. 6,697,979); which is a US national stage of International Application Serial No. PCT/DE98/03682, filed on Dec. 15, 1998; which claims priority to German Patent Application No. 197 57 200.6, filed on Dec. 22, 1997, the entire contents of each of which are expressly incorporated herein by reference.

1. BACKGROUND OF THE INVENTION 1.1. Related Art
1.1.1. Multidimensional Arrays of Arithmetic and Logic Units German Patent 196 51 075.9-53 describes processors, having a plurality of 2-dimensional or multidimensional arithmetic and logic units/cells. The computing power of such processors increases with the number of arithmetic arid logic units present. Therefore, an attempt is made to integrate as many arithmetic and logic units as possible on one chip, which increases the area required. With an increase in area, there is also a higher probability of a chip having a manufacturing defect making it useless. All arithmetic and logic units arranged in matrix form have this problem, e.g., including other known types such as DPGAs, Kress arrays, systolic processors and RAW machines; likewise, some digital signal processors (DSPs) having more than one arithmetic and logic unit.

At the same time, all the aforementioned types require a great deal of testing, i.e., to detect faults, an especially large number of test cases must be generated and tested with respect to the functioning of the cells and the networking. Traditional known methods such as BIST, boundary scan, etc. are difficult to integrate because of the large number of test vectors and they are also too time consuming and take up too much space.

1.1.2. Standard Processors

Standard processors such as the known x86 series, MIPS or ALPHA have a plurality of arithmetic and logic units which are driven at the same time by a VLIW command or with a time offset. In the future, the number of integrated units (integer units) and floating point units will continue to increase. Each unit must be tested adequately and must be largely free of defects.

1.2. Problems
1.2.1. Multidimensional Arrays of Arithmetic and Logic Units

Due to the increasing probability of defects with 'large chips, either only a very small number of cells can be integrated or production costs will increase greatly due to the resulting rejects. Very large chips will reach a maximum area-beyond which a functional chip can no longer be produced. Due to the time consumed in testing according to traditional methods, there is a great increase in testing costs. Integrated BIST functions (built-in self-test) take up a great deal of area due to the high extra complexity, driving costs even higher and reducing manufacturing feasibility. In addition, this greatly increases the probability of a defect lying not within the actual function units but instead within the test structures.

1.2.2. Standard Processors

Due to the increasing number of arithmetic and logic units, there is also an increase in the probability of defects. This means more rejects, causing manufacturing costs to increase. With an increase in area and a related increase in the number of transistors used, there is also an increase in probability of failure during use.

With regard to testing complexity and implementation of BIST, the discussion above regarding "multidimensional arrays of arithmetic and logic units" also applies here.

1.3. Improvement Through the Present Invention; Object

According to the present invention, it is possible to replace defective cells by functional cells by functional cells and thus reduce rejects. A cell can be replaced either by the test systems at the time of manufacture of the chips or even by the user in the completely assembled system. Test vectors can be generated according to the BIST principle within the chip, or outside the unit according to a new method to save on space and costs. In addition, a possibility of chips automatically repairing defects without requiring any additional external tool is described. All the tests and repair can be performed during operation of the chips.

2. DESCRIPTION OF THE PRESENT INVENTION 2.1. Detailed Description of the Present Invention 2.1.1. Replacing Defective Cells An additional PAE not used in normal operation (referred to below as PAER) is assigned to a group of cells which are referred to below as PAEs according to German Patent 196 51 075.9-53. The cells may be arithmetic and logic units of any type, configurable (programmable) logic cells or other cores having any desired function. Grouping of the PAEs in rows or columns is preferred in the grouping of PAEs and allocation of the PAER, because this simplifies the networking. With respect to future chip technologies, reference is made to a possible grouping of the PAEs within a $3^{rd}$ dimension. Multiplexers are connected upstream from the inputs of the PAEs in such a way that the input of the first PAE in the row/column can also be switched to the input of the second PM in the row/column, and then the input of the second PAE can be switched to the input of the third PAE and so forth. The input of the last PAE is switched to the input of the PAER. This means that if there is a defect in the first PAE, its function is replaced by the second PAE, the function of the second is replaced by the third and so forth, until the function of the last PAE is replaced by the PAER. If a PAE within the column/row is defective, the PAEs upstream from it are switched normally and after the position of the defective PAE, all functions are shifted by one PAE. For example, if PAE 4 is defective, then PAEs 1 . . . 3 execute their respective functions, while the input multiplexer of PAE 5 is switched so that it receives the data of PAE 4, the input multiplexer of PAE 6 receives the data of PAE 5 and so forth until the input of the PAER receives the data of the last PAE.

To supply the results back to the network in the proper sequence, multiplexers are also provided at the outputs of the PAEs, with the output multiplexer of PAE 1 either switching PAE 1 to the bus (if it is not defective) or if there is a defect, switching the output of PAE 2 to the bus, PAE 3 is switched to the bus instead of PAE 2, until the last PAE, where the PAER is switched in its place. If the defective PAE is in the middle of the row/column, the outputs are shifted exactly as already described above for the inputs.

Especially with a configurable logic and configurable arithmetic and logic units, there are additional bus systems to transfer the configuration data and control the configuration. These bus systems are also connected by multiplexers in the same way as the buses mentioned in this section. The same thing is also true of bus systems over which commands are written to the respective arithmetic and logic units with a matrix arrangement of arithmetic and logic units (e.g., systolic processors, SIMD, etc.). Basically any bus or any signal can be sent over multiplexers. Depending on the fault tolerance requirements, the clock signal, for example, can be sent over multiplexers to prevent a possible short circuit, or the clock signal may be sent directly to the cell because such a failure need not be compensated. The fault tolerance step can be defined in the structural details according to the requirements for each signal or each bus individually.

2.1.2. Replacing Defective Buses

The concept of correcting faults within gate structures as presented here can also be applied accordingly to bus systems where an additional bus (BUS R) is assigned to a number of buses (BUS 1 ... BUS n). If one of the buses is defective (BUS d), its function is assumed by one of its neighboring buses (BUS (d+1)). The function of the neighboring bus (BUS (d+1)) is assumed by its neighboring bus; (BUS (d+2)), etc., with the direction of the bus assuming the function always remaining the same until the function of BUS n is assumed by BUS R.

When multiplexer structures are used with bus systems, the usual multiplexers, decoders and gates, tristate gates or bidirectional multiplexers are used according to the prevailing connection structure and the direction of the data.

2.1.3. Decoder

It is obvious that two groups of successive multiplexers must always assume the same state, i.e., MUX 1=MUX 2=MUX 3= ... =MUX n=state A, and MUX (n+1)=MUX (n+2)=MUX (n+3)= ... =MUX m=state B.

If no PAE is defective, then MUX 1=MUX 2= ... =MUX m=state A.

If the first PAE is defective, then MUX 1=MUX 2= ... MUX m=state B.

For example, if PAE 3 is defective, then MUX 1=MUX 2=state A, MUX 3=MUX 4= ... =MUX m=state B, with PAER being assigned to PAE m in this example, i.e., PAER is directly next to PAE m.

The multiplexers are therefore controlled as follows, for example:

| Defective PAE | Multiplexer control |
|---|---|
| none | 0000 ... 000 |
| m | 0000 ... 001 |
| m-1 | 0000 ... 011 |
| m-2 | 0000 ... 111 |
| 4 | 0001 ... 111 |
| 3 | 0011 ... 111 |
| 2 | 0111 ... 111 |
| 1 | 1111 ... 111 |

If PAER is assigned to PAE 1, the m ... 1 sequence is inverted (defective PAE 1 corresponds to 0000 ... 001, or defective PAE m corresponds to 1111 ... 111).

Therefore, it is sufficient to store the number of the defective PAE and send it to a decoder which controls the states of the multiplexer on the basis of the table given above.

2.1.4. Performing the Self-Test

Essentially any desired test strategies can be applied to this method, but the following method according to the present invention can be regarded as especially suitable.

The array of PAEs is loaded with one or more test algorithms which calculate one or more test vectors. At one edge of the array, the PAEs are wired as comparators so that the values calculated on the basis of the test vectors are compared to the setpoint results.

If the calculated result does not correspond to the setpoint results, there is a defect. The test data, i.e., the test algorithms, the test vectors and the setpoint results are present in an internal or external memory or are loaded by a higher level unit. In this test strategy, it is necessary for each test algorithm to be calculated at least twice, with the PAEs designed as comparators being on another edge (preferably the opposite edge) the second time to guarantee execution of the test algorithm on all PAEs. It is also conceivable for the comparators to be arranged in the interior of the PAE array, and with one test algorithm A and B each calculating one result A and B from left and right (top and bottom), where the results are sent to the comparators and must match. Depending on the type of test algorithm, the defective PAE may be tracked back on the basis of the defect or not. If the algorithm supports tracking of the defect, the corresponding multiplexer states of the row/column in which the defective PAE is located are changed and sent to the multiplexers. The test algorithm in which the test is failed is executed again to check on freedom from defects, which should now prevail. If the unit is still defective, a check must be performed to determine whether an additional or other PAEs are defective. Execution of the test algorithm and generation of the multiplexer states adapted to the defect are iterative processes. It is not usually sufficient to implement just one test algorithm, but instead multiple different test algorithms must be implemented, each being checked with multiple test vectors. Only in this way can a maximum fault detection rate be achieved.

At the same time, the bus crosslinking must be changed from one test algorithm to the next, so that the bus systems are also checked adequately.

The various embodiments of the test algorithms will not be discussed in further detail here because this is not relevant for the basic method according to the present invention.

2.1.5. Internal Control of the Self-Test

Units such as German Patent 196 51 075.9-53, DPGAs, Kress arrays, systolic processors and RAW machines all have in common an integrated memory which is assigned to one or more PAEs and determines the function of the arithmetic and logic unit(s).

According to the basic BIST principle, the memory is expanded by a region (TestMEM) containing the test algorithms and vectors. This memory can be fixed in the form of a ROM or it may be rewritable by (E)EPROM, flash ROM, NV-RAM or the like.

To perform a self-test, the system jumps to a memory location within the TestMEM and executes the test routine stored there (internal driven self-test=IDST). Except for the expansion of the memory (by the TestMEM) and an analyzer unit for the comparators described above (ErrorCHK), no other additional units typical of BIST are needed on the chip.

2.1.6. External Control of the Self-Test

The reduction in components on a memory expansion (TestMEM) and an analyzer unit of the comparators (ErrorCHK) permit an additional, even less expensive and space-saving variant. No internal TestMEM is implemented here, but instead the usual internal memory is loaded from the outside with the test algorithm and the test vectors (external driven self-test=EDST); this means that the BIST test data is shifted outward and regarded as a normal program. Then the test algorithm is executed. As an alternative, the test algorithm may also be loaded successively from an external memory during the execution and decoded. Only the ErrorCHK unit must still be integrated on the chip. There are several possibilities for loading the test algorithm and the test vectors from the outside into the chip-internal memory (memories). In principle, the process can take place through a functionally higher level CPU or computer unit (HOST), with the latter loading the test data (test algorithm and test vectors) onto the chip (download) or the chip loading the test data automatically from an external (dual-ported) RAM or read-only memory such as ROM, (E)EPROM, flash-ROM, NV-ROM or the like.

2.1.7. Checking the Function During Operation

BIST methods according to the related art usually perform the self-test only during the chip RESET phase, i.e., shortly after applying a voltage (when turned on). In contrast with that, it is possible or practical to perform the methods described here on the chips while the programs are running. For example, a complete test of the chip can be performed during the RESET phase and part of the available test data can be loaded during execution of the application program or during IDLE cycles, i.e., periods of time when no program is running on the chips or the chip is in a waiting mode. This is readily possible by the fact that one of the test algorithms is activated in the internal memory during IDLE cycles or is loaded into the unit from an external memory or host. It is of course possible to select one or more of the plurality of available test algorithms and test data in part, where the number of selected test data can be defined on the basis of the length of the IDLE cycle. New test data can be loaded until the IDLE cycle is ended by the arrival of new data to be processed, by a new program to be executed or by another request.

Another possibility is the fixed integration of test strategies into the application programs to perform tests during processing of the application program. In both cases, the relevant data in the array is saved before calling up the test algorithms. One option is to save the data either in internal memory areas (cf. PACT04) or in memories connected externally. After executing the test algorithms, the data is read back before the normal program processing.

One alternative for increasing the execution speed is to implement in addition to each register (Reg-n, n∈N) an additional register (TestReg-n, n∈N) which is used only for the test algorithms. Before execution of the test algorithms, the TestReg-n are connected by multiplexers/demultiplexers (gates) and used for the test. The Reg-n remain unchanged. After execution of the test algorithms, the Reg-n are connected again.

If the test strategy provides for testing of only those cells whose data is no longer relevant subsequently, the data need not be saved and loaded.

2.1.8. Storing the Number of the Defective PAE

If a PAE (or a bus) is recognized as defective, its number, i.e., the state vector (defect identifier) of the assigned multiplexer must be stored first to control the multiplexers and also to be available immediately for a chip RESET. Therefore, the defect identifier may be stored
1. internally in the chip in a programmable read-only memory ((E)EPROM, flash ROM, NV-RAM, etc.),
2. externally in a programmable read-only memory ((E)EPROM, flash ROM, NV-RAM, etc.),
3. externally in the HOST within the program to be executed, in its programmable read-only memory ((E)EPROM, flash ROM, NV-RAM, etc.) or in other storage media (magnetic, optical, etc.).

2.1.9. Automatic Generation of Multiplexer States

Usually after detection of a defect, the defective cell is tracked on the basis of the defective performance detected. This is possible with appropriate test algorithms if there is an additional algorithm for tracking the defect. If the test is controlled by a HOST, the tracking can be performed on the HOST. However, if there is no HOST, tracking often cannot be integrated into the defective chip or is too complicated. As an expedient, it is proposed that a loadable counter be integrated upstream from each decoder. In the normal case, the number of the defective PAE is loaded into the counter, after which the decoder controls the states of the multiplexers as described above. If it is not known which PAE is defective, beginning at PAE 0 or PAE m the counter can function in response to any potentially defective PAE by reducing the count by one PAE (counting from PAE m) or increasing the count by one (counting from PAE 0) after each unsuccessful test until the defective PAE is reached and the test takes place normally. The count then reached is stored as the state vector for controlling the multiplexers and represents the defective PAE. If a functional count is not found, there is either another defect (possibly in another row/column or a bus error) or more than one PAE is defective. One disadvantage when using counters is that all possibilities must be permutated until the defective PAE has been located.

Another possibility, although it requires a greater implementation expense, is therefore to use look-up tables which select the corresponding defective PAE on the basis of the test algorithm just executed and the resulting error state in ErrorCHK. To do so, however, the test algorithms and look-up tables must be coordinated. However, this coordination will not be discussed further here because it is highly chip-specific and does not depend on the basic principle.

2.1.10. Special Design for Standard Processors (Pentium, MIPS, ALPHA, Etc.)

Processors today and those in the future will contain a plurality of integer units and floating point units. Therefore, the method described here can be applied directly to these units by having an additional unit in each case which will be available for possible defects. The test of the processors can be performed at the manufacturer, during startup of the computer or also during the operating time. It is especially appropriate for a test to be performed during boot-up, i.e., starting up of the computer after a reset, which is performed with PCs of the BIOS type (BIOS basic input output system). The corresponding state vectors of the multiplexers can be stored either on the processor or in an external memory, e.g., the battery-buffered real-time clock (RTC) in a PC.

3. SUMMARY

The present invention makes it possible to replace defective units, which are designed as arithmetic and logic units in the present publication but in general can represent any desired unit of a chip, by a functional unit. At the same time, the present invention relates to a method with which self-tests can be performed more easily, less expensively and before or during the running of the application program. This also greatly increases fault tolerance during operation, which is especially important for failure-critical applications such as power plant operations, aviation and space travel or in the military.

4. BRIEF DESCRIPTION OF THE DIAGRAMS

The following diagrams illustrate embodiments of the method according to the present invention:

FIG. 1: basic circuit
FIG. 2: no PAE defective
FIG. 3: PAE1 defective
FIG. 4: PAEm defective
FIG. 5: PAE3 defective
FIG. 6: array of PAEs with PAERs
FIG. 7a: principle of a self-test, first part
FIG. 7b: principle of a self-test, second part
FIG. 8a: EDST integrated into an external ROM
FIG. 8b: EDST integrated into an external RAM area
FIG. 8c: EDST controlled directly by the HOST
FIG. 9: example of a chip-internal memory with BIST function integrated into an internal control unit according to German Patent 196 54 846.2
FIG. 10: example of a fault-tolerant standard processor
FIG. 11: flow chart of a self-test
FIG. 12a: shows the generation of new multiplexer states by way of a counter.
FIG. 12b: shows the generation of new multiplexer states where the look-up table is integrated.
FIG. 13: flow chart of a self-test during the IDLE cycle
FIG. 14: flow chart of a self-test integrated into the application program
FIG. 15: look-up table for error correction
FIG. 16: example of a fault-tolerant bus system
FIG. 17: saving registers Reg-n in a chip-internal memory before execution of the test algorithms
FIG. 18: saving registers Reg-n in an external memory before execution of the test algorithms
FIG. 19: disconnecting the Reg-n and connecting the TestReg-n before execution of the test algorithms

4.1. DETAILED DESCRIPTION OF THE DIAGRAMS

FIG. 1 shows the basic principle of a fault-tolerant configuration. All the PAEs (0101) are arranged in a row with the additional PAER (0102) being assigned to the last PAE. Upstream from the first PAE in the row, a gate (0103) is connected to block the data to the PAE if that PAE is defective. Likewise, a gate (0105) is connected upstream from the PAER (0102) to block the data to the PAER if it is not needed (or is defective). The two gates (0103 and 0105) are optional and are not absolutely necessary. The input buses (0111) composed of a plurality of individual signals are directed over multiplexers (0104) and the gates (0103 and 0105) to the PAEs. After a defect, data can be shifted by one PAE to the right in each case up to the PAER. Upstream from the output buses (0112), which are composed of a plurality of individual signals, there are also multiplexers (0106) which again shift the results by one position to the left in the event of a defect, so the defect is not detectable for the result bus system (quantity of all 0112). The individual control signals (0117) for the respective multiplexers and gates are combined to give one bus (0110) and are generated by a decoder (0107). The decoder receives the number of the defective PAE from unit 0108, which is designed either as a register or as a loadable counter. When using a look-up table to detect the defective PAE from the error generated by ErrorCHK, 0108 is implemented as a register into which the number of the defective PAE is loaded. If the defective PAE is sought by a permutation, 0108 represents a loadable counter which counts through all possible PAEs, starting from 0, until the defective PAE is located. Once the defective PAE has been identified, it is loaded directly into the loadable counter in the next RESET operation. The load signal LOAD (0115) is available for loading the counter or register (0108). To increment the counter, the COUNT signal (0116) is sent to the counter. The counter result is returned by way of signals 0114 for storage. The counter/register is driven and the chronological sequence is controlled by a state machine (not shown), an external HOST or a device according to German Patent 196 54 846.2.

Figure 1:
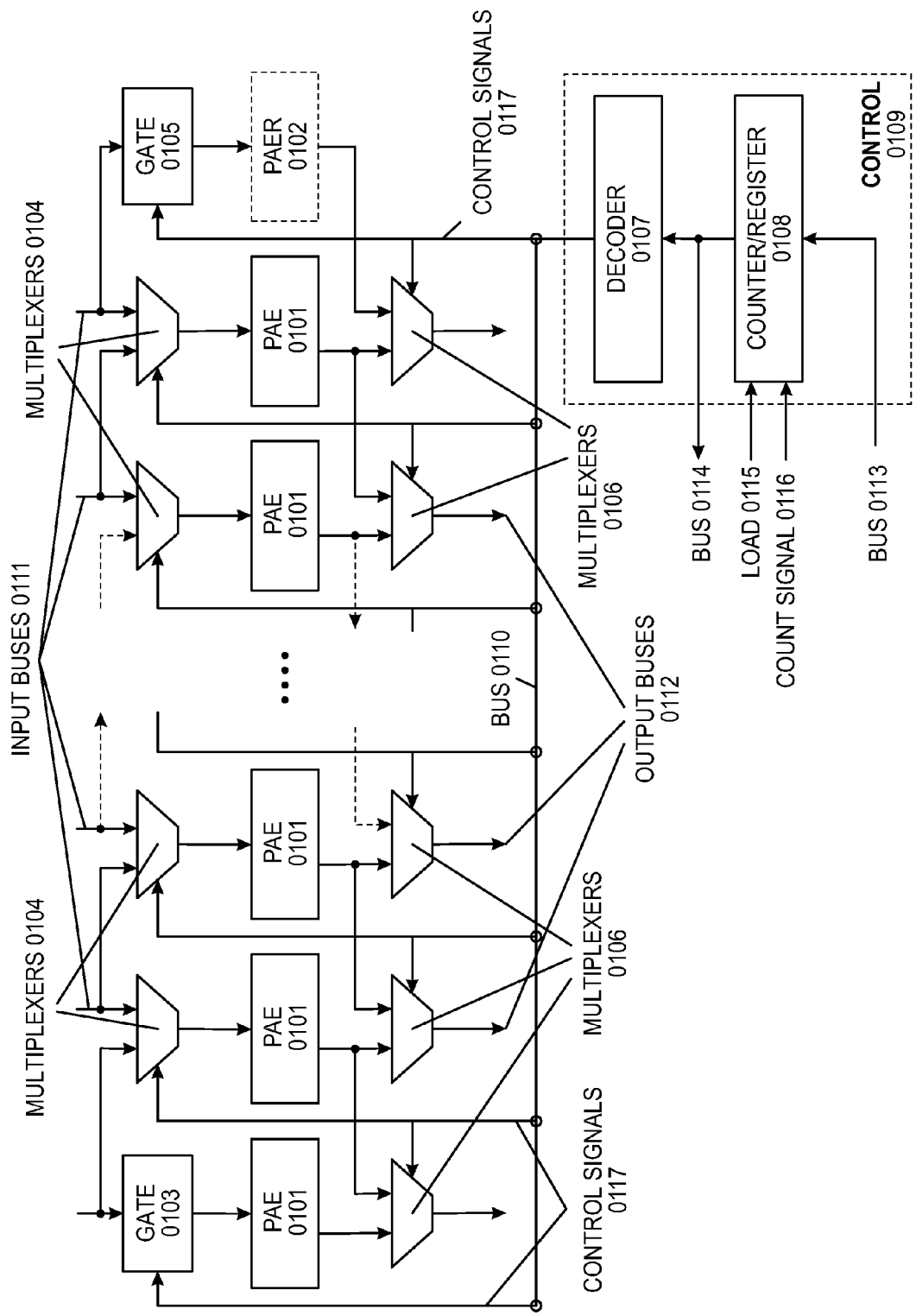
Figure 2:
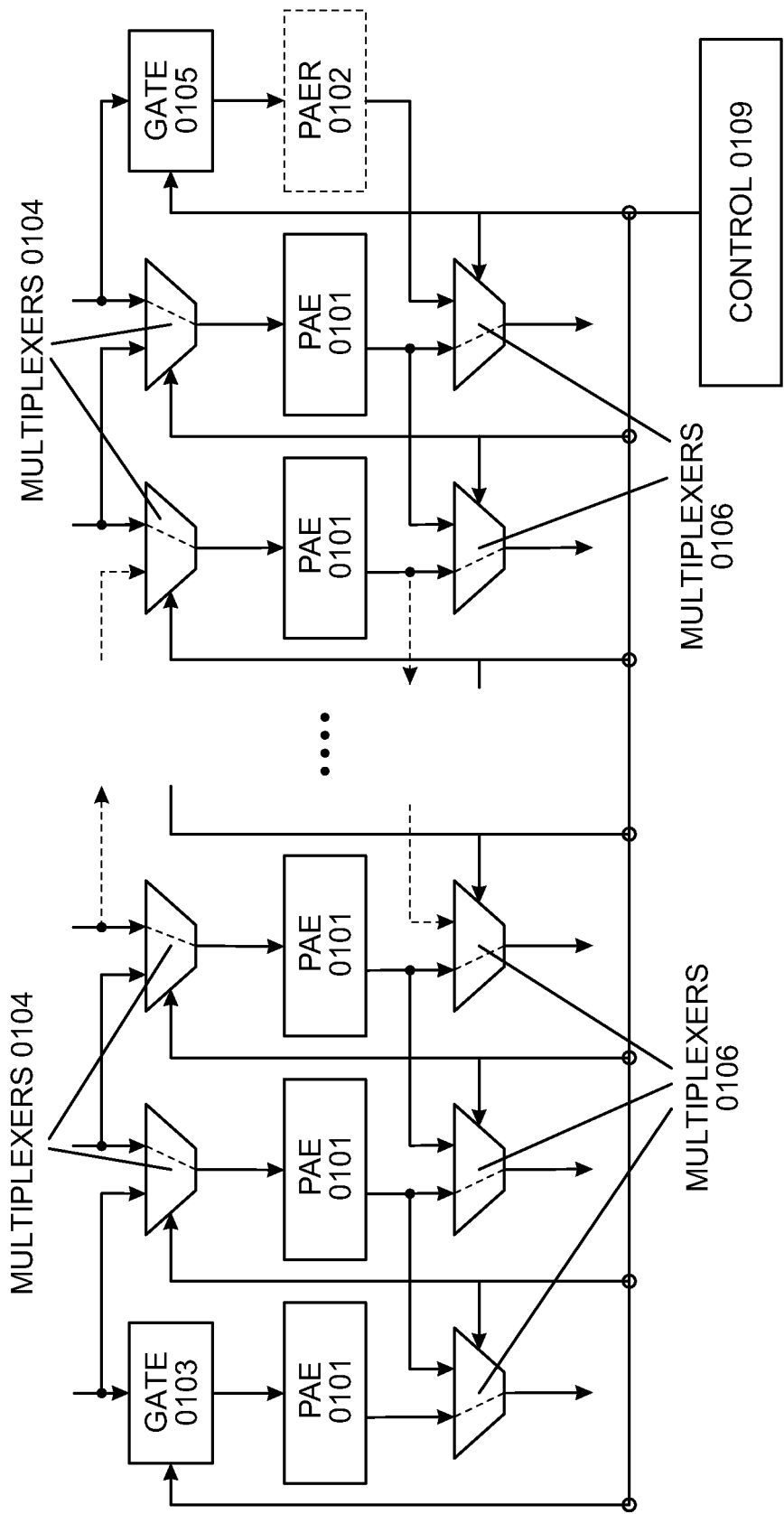
FIG. 2 shows the states of the multiplexers (0104 and 0106) as well as the gates (0103 and 0105) where no PAE is defective and the PAER (0102) is not used.
Figure 3:
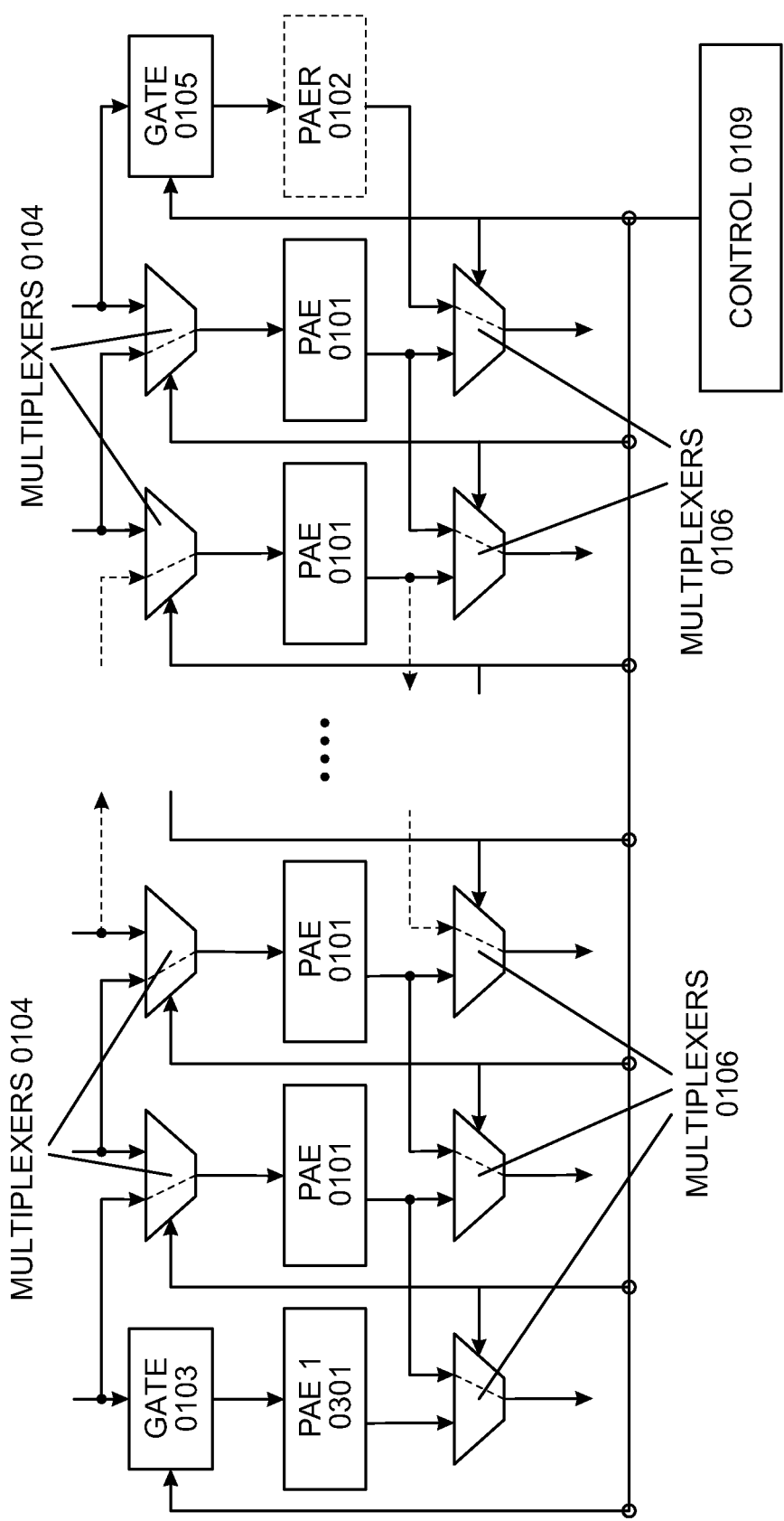
FIG. 3 shows the states of the multiplexers (0104 and 0106) as well as the gates (0103 and 0105) where PAE 1 (0301) is defective and the PAER (0102) is used.
Figure 4:
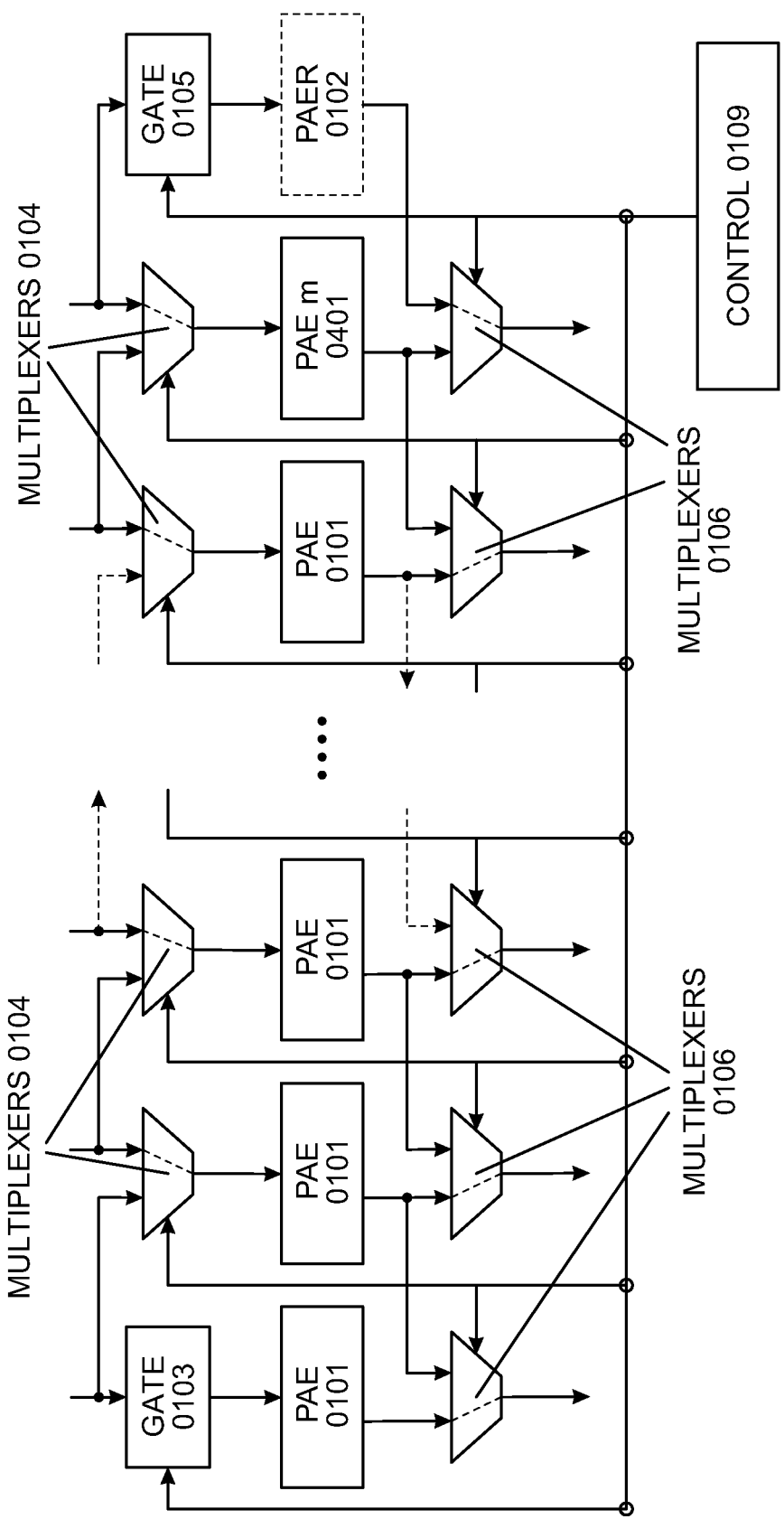
FIG. 4 shows the states of the multiplexers (0104 and 0106) as well as the gates (0103 and 0105) where PAE m (0401) is defective and the PAER (0102) is used.
Figure 5:
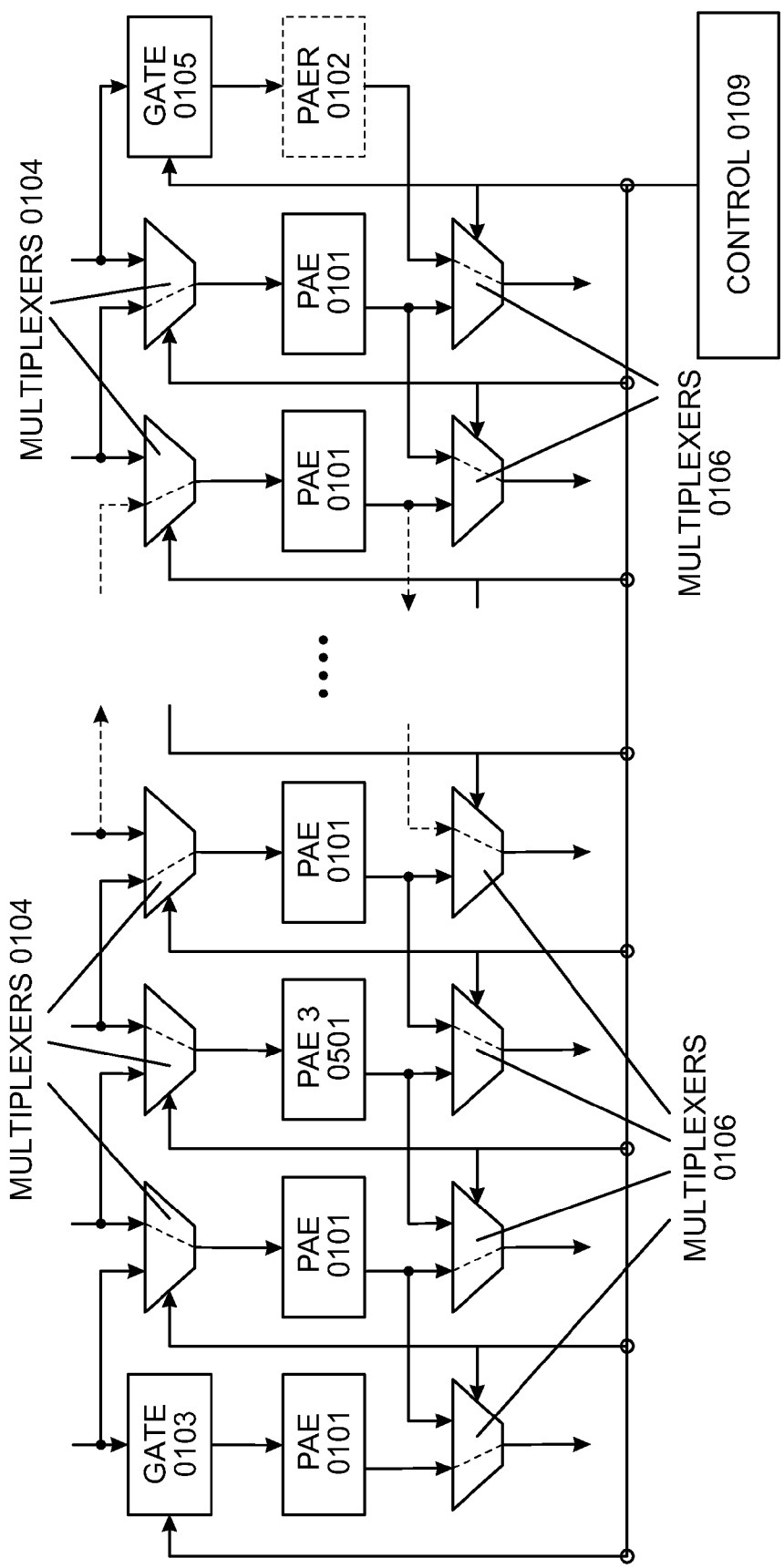
FIG. 5 shows the states of the multiplexers (0104 and 0106) as well as the gates (0103 and 0105) where PAE 3 (0501) is defective and the PAER (0102) is used.
Figure 6:
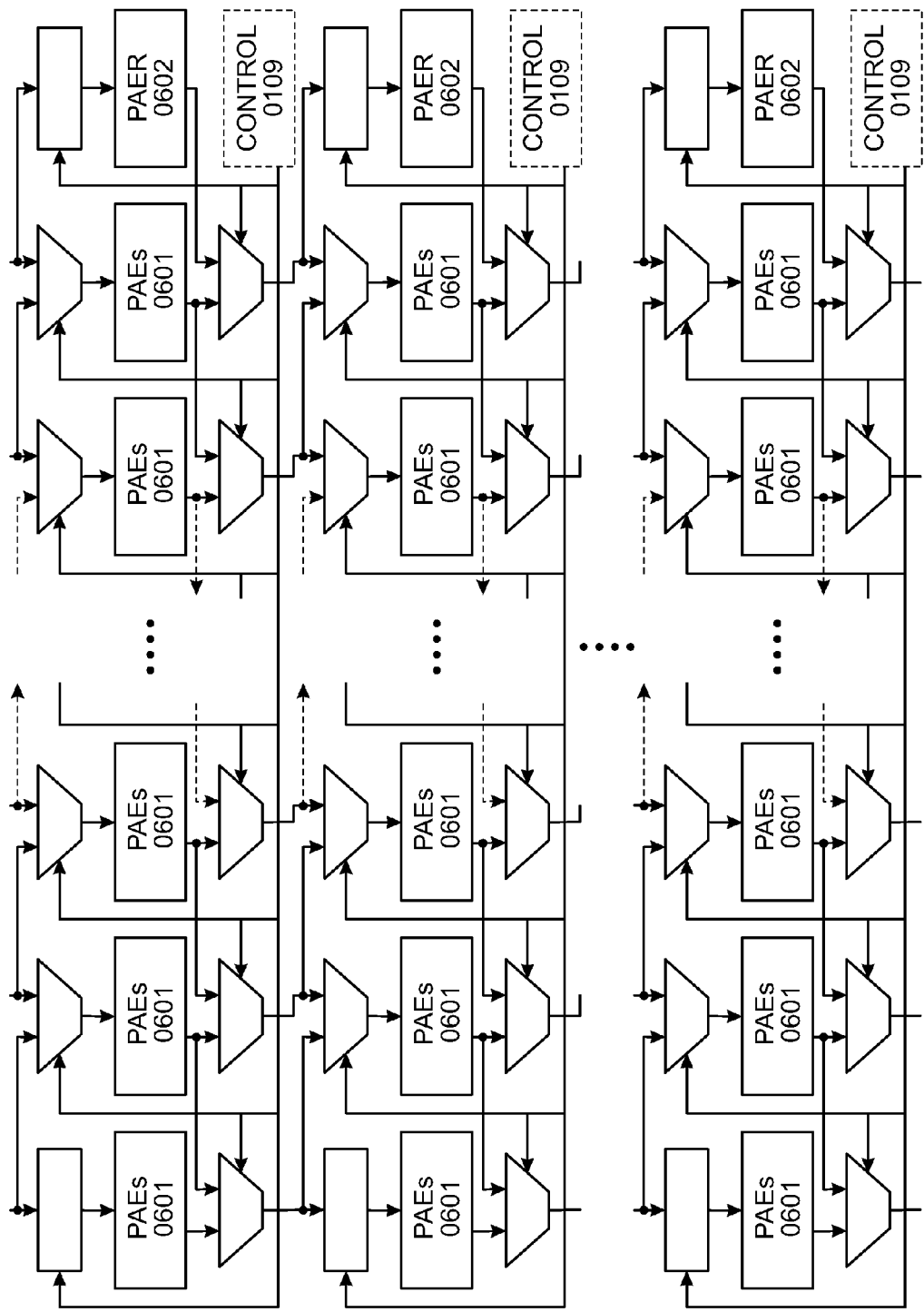
FIG. 6 shows an array of PAEs (0601), where one PAER (0602) is assigned to each PAE row, and each row has a separate control (0109, see FIG. 1). A plurality of controls can also be combined to a single higher-order control above the rows.
Figure 7A:
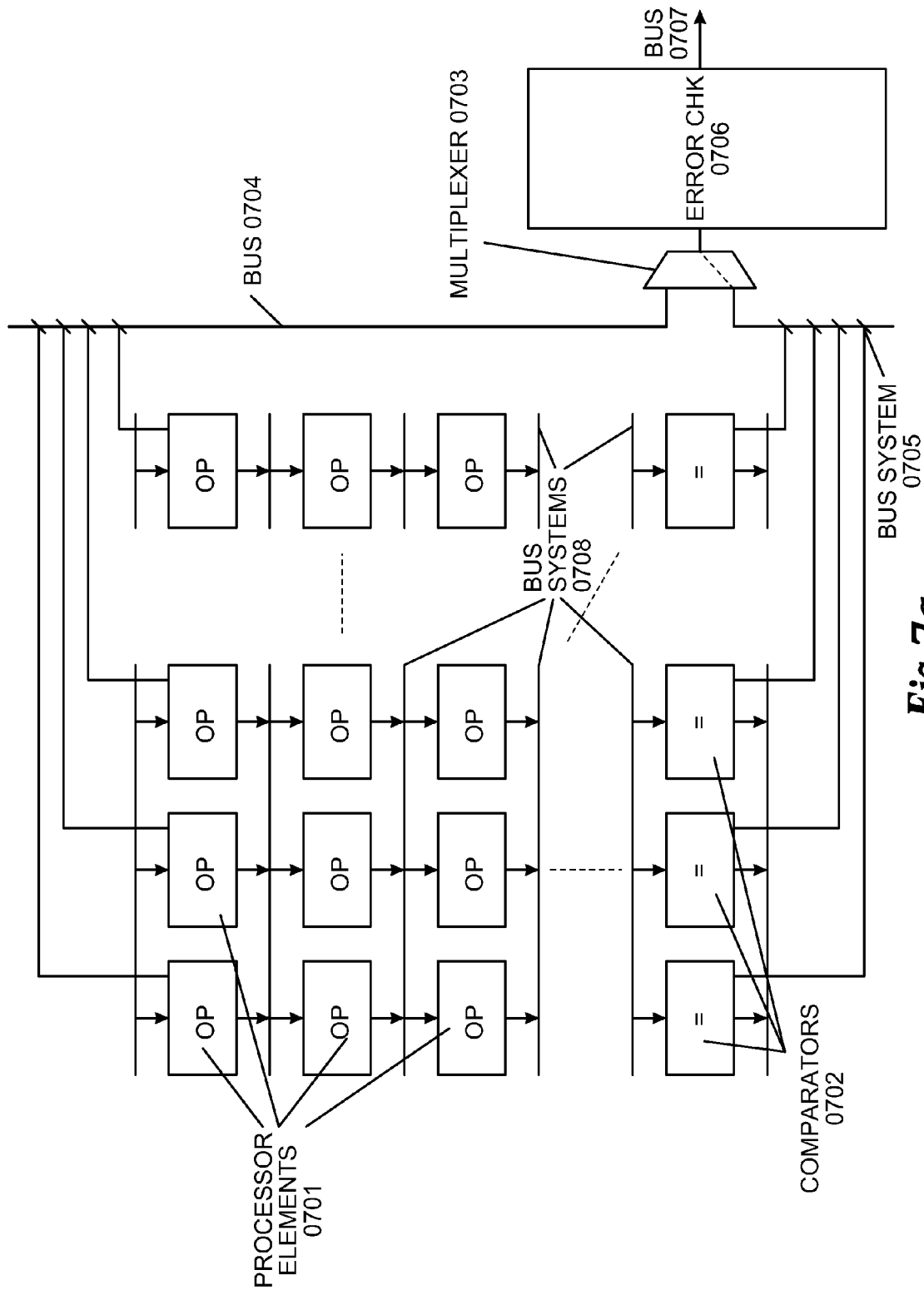

FIG. 7a shows a possible first test of an algorithm, with a plurality of PAEs being configured as processor elements (0701), each performing its operation by using a test vector. The PAEs are interconnected by bus systems (0708) of any desired design. One row of PAEs (0702) is configured as a comparator. The values calculated in the processor elements are compared to a predetermined value in the comparators. There is an error if the two values do not match. The results of the comparisons are sent over a bus system (0705) to a multiplexer (0703) which is connected so that it relays the results of the comparisons from (0702) to a unit (ErrorCHK 0706) of any desired design to detect an error and possibly analyze it. The error analysis (0706) sends its result over the bus (0707) to the HOST or to the controlling state machine (see FIG. 1).

Figure 7B:
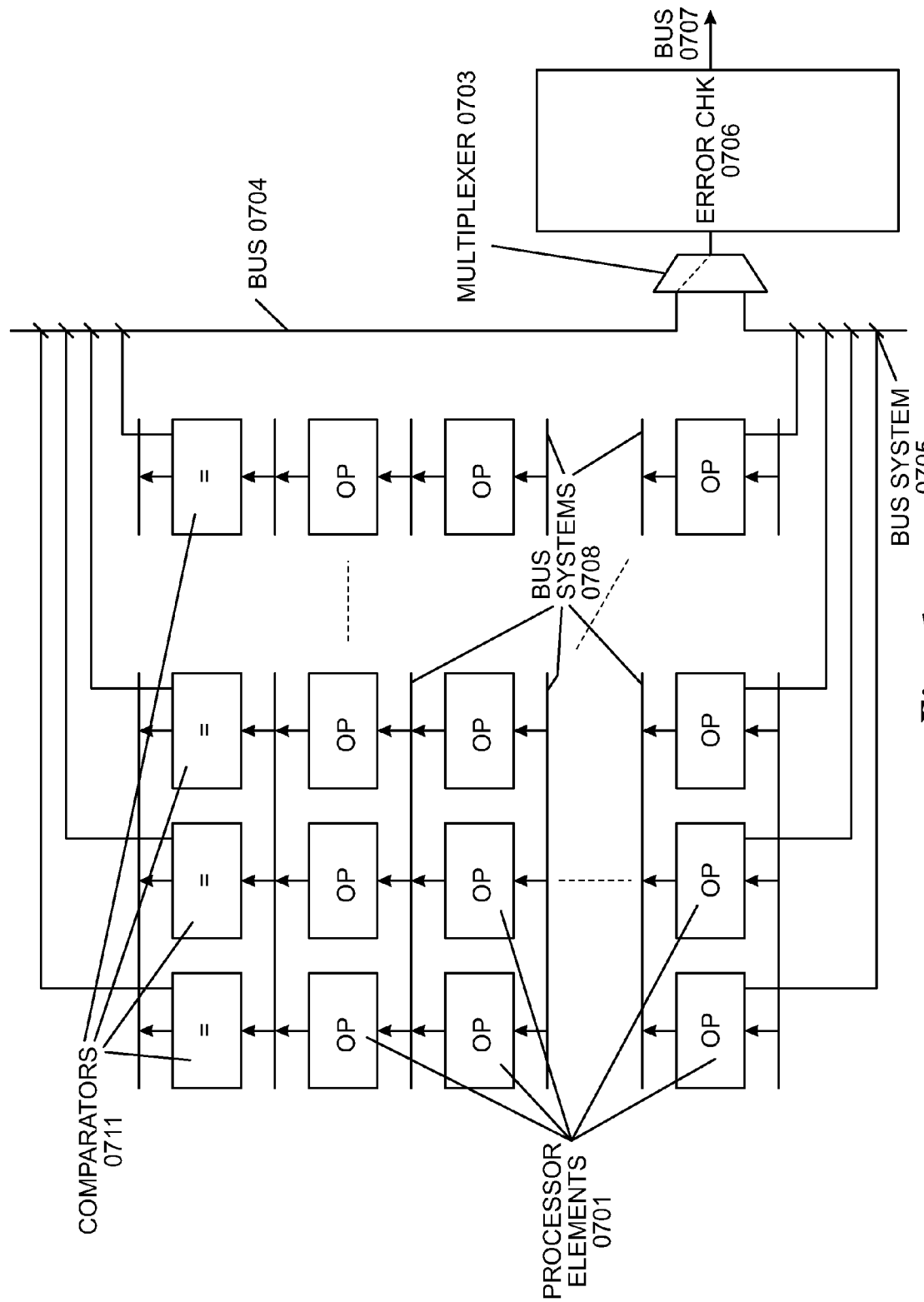

FIG. 7b shows a second test which is performed over the same matrix of PAEs as FIG. 7b. The algorithm to be executed is the same; likewise the values to be calculated. However, the PAEs of row 0702 are designed as normal processor elements, but with the first row of the PAEs (0701) connected previously as arithmetic and logic units (FIG. 7a) now being designed as comparators (0711). The direction of data flow on the bus systems is rotated by 180°. The multiplexer (0703) is connected so that the results of the (mirrored) comparators (0711) are relayed to the error analysis (0706). The mirroring of comparators (0702-0711) achieves the result that the function of each PAE is actually tested. If this mirroring were not performed, only the function of comparison but not any desired function is tested in a PAE row (0702 or 0711).

Implementation of a method other than that on which FIGS. 7a and 7b are based may be appropriate under some circumstances. The matrix here is subdivided into three groups, an upper group, a middle group and a lower group. In the upper and lower groups, results are calculated, with the data flow of the upper group being downward and the data flow of the lower group being upward. The middle group is configured as a comparator and compares the calculated values of the upper group with those of the lower group. The upper and lower groups usually perform the same calculations. There is an error if the results obtained at the comparators are different. Again with this method, it is important for the PAEs which are connected as comparators to be tested adequately for freedom from defects in the next configuration.

FIGS. 8*a, b, c* show possible circuits for testing a chip (0801). The test data is stored externally here (EDST).

In FIG. 8*a* the test data is in an external read-only memory ((E)PROM, ROM, flash ROM, etc.) (0802). The data is in a RAM (0808) through which it is exchanged with the HOST (0805). A non-volatile read-write memory (NV-RAM, EEPROM, flash ROM, etc.) (0807) is used to store the defective PAEs, i.e., the state vectors of the multiplexers.

In FIG. 8*b*, the test data is loaded by a HOST (0805) into part of the RAM (0803) and executed from there. The data is in a RAM (0808) through which it is exchanged with the HOST (0805). It is also possible for the chip itself to load the data into the memory area (0803, 0808) (without the use of a HOST), e.g., directly from a bulk storage device. A non-volatile read-write memory (NV-RAM, EEPROM, flash ROM, etc.) (0807) is used to store the defective PAEs, i.e., the state vectors of the multiplexers.

The errors generated by the chip in FIGS. 8*a*/8*b* are brought out of the unit and are available externally (0804).

In FIG. 8*c* the test data is transmitted incrementally from a HOST (0805) to the chip (0801) using a suitable interface (0806). The chip indicates a possible error state (0804) to the HOST through the interface (0806). The data is in a RAM (0808) through which it is exchanged with the HOST (0805).

Figure 9:
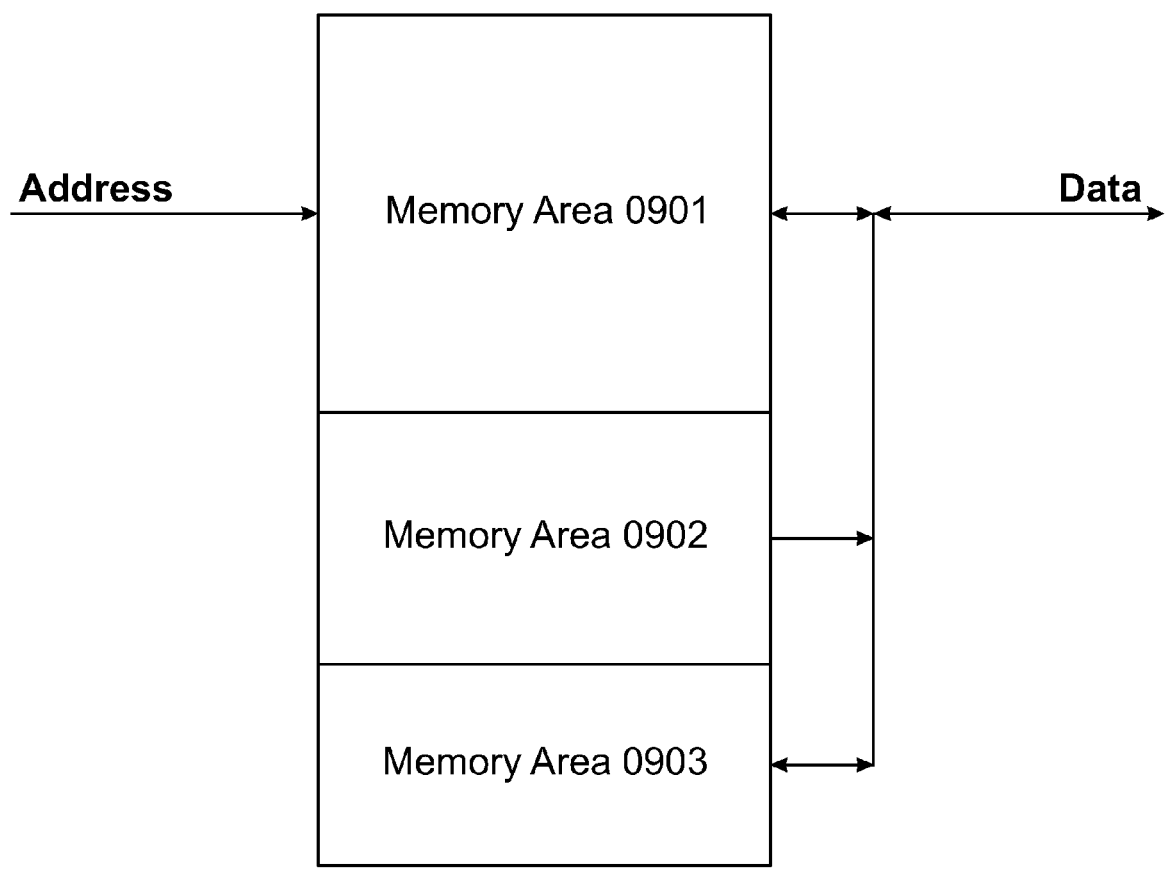

FIG. 9 illustrates an expansion of a chip-internal program memory or configuration memory according to German Patent 196 54 846.2 by the addition of a BIST function according to the method described here. The usual memory area (0901) according to the related art is expanded hereby a read-only memory area (0902), which is usually implemented as ROM, but implementation as (E)EPROM, flash ROM, NV-RAM, etc. in which the test data, i.e., the test algorithms and test vectors are stored would also be possible. At the end of the memory, another memory area (0903) is added. This is a few entries in size and includes the addresses of defective PAEs and/or defective buses which are loaded into the counters/registers (0108). This memory area is designed as a non-volatile read-write memory (flash ROM, EEPROM, NV-RAM, etc.). Thus, the data can be read out in a RESET and written over with the instantaneous data after execution of a test algorithm where a reparable defect is found. This data is supplied by the counters (0108, bus 0114) or by the look-up tables, depending on the implementation.

Figure 10:
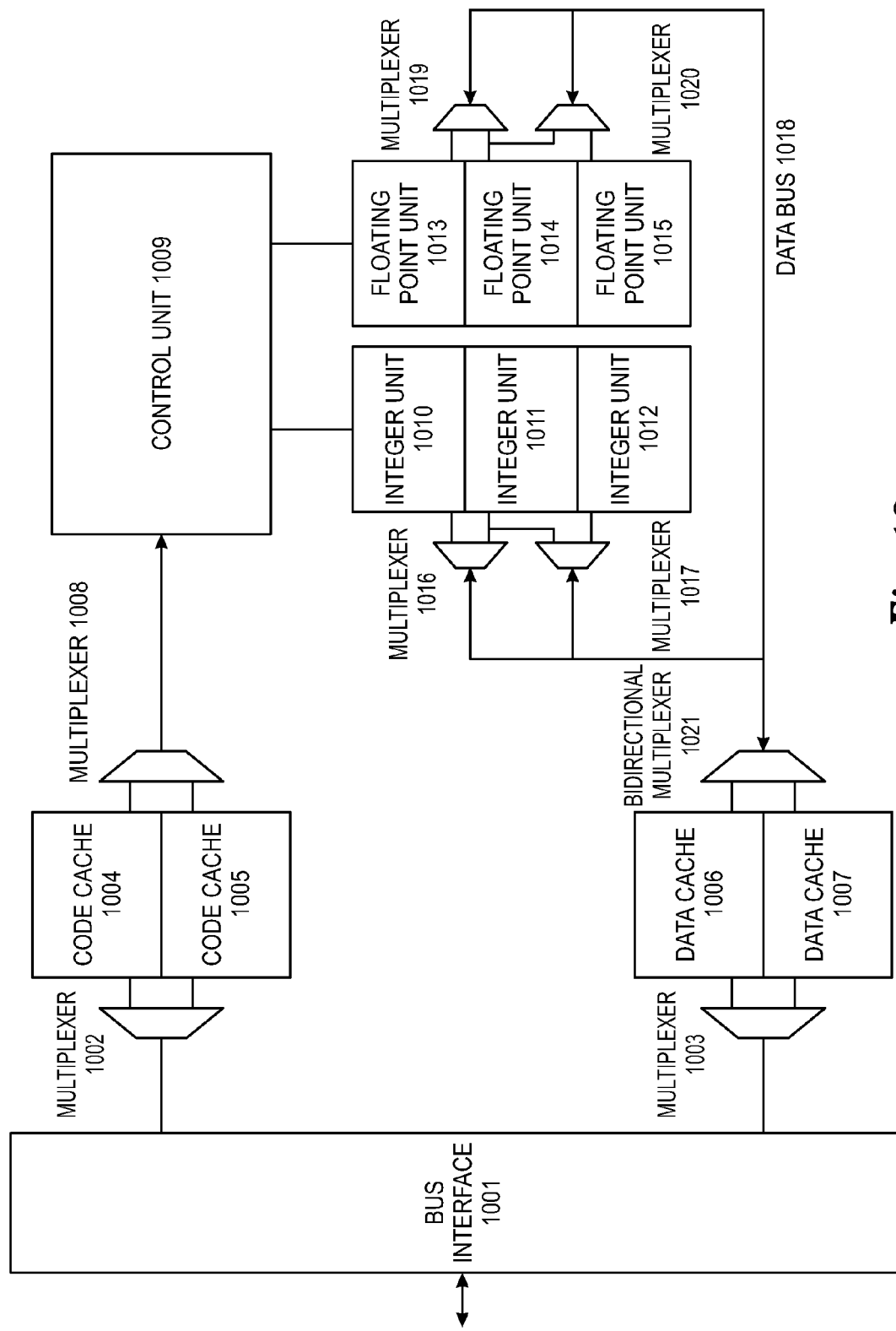

FIG. 10 shows the example of a standard processor with fault correction implemented. According to the related art, the processor is connected to its peripherals over the bus interface (1001). Two multiplexers (1002 and 1003) are assigned to the bus interface, with 1002 controlling two alternative code caches (1004, 1005) and 1003 controlling two alternative data caches (1006, 1007) so that only one of the caches is used at a time.

Thus, one cache is always available for compensating for defects and can be addressed over the multiplexers. The code cache leads over a multiplexer (1008) to the control unit (1009) of the processor, only one of which is used in this example. The integer units (1010, 1011, 1012) and the floating point units (1013, 1014, 1015) are controlled by the control unit. Two are always in operation at a time, with a third being available if one of the units fails. Two integer units are connected to the data bus (1018) over the bidirectional multiplexers (1016, 1017), and two floating point units are connected to the data bus (1018) over the bidirectional multiplexers (1019, 1020). The data bus is connected to the data cache over a bidirectional multiplexer (1021). Multiplexer 1003 is also designed to be bidirectional. The multiplexers are controlled according to the method described above. Multiplexers 1002, 1008, multiplexers 1003, 1021, multiplexers 1016, 1017 and multiplexers 1019, 1020 each form a dependent group.

Thus according to the method described here, the data cache and the code cache and one floating point unit and one integer unit can be replaced within the sample processor in the event of a fault.

Figure 11:
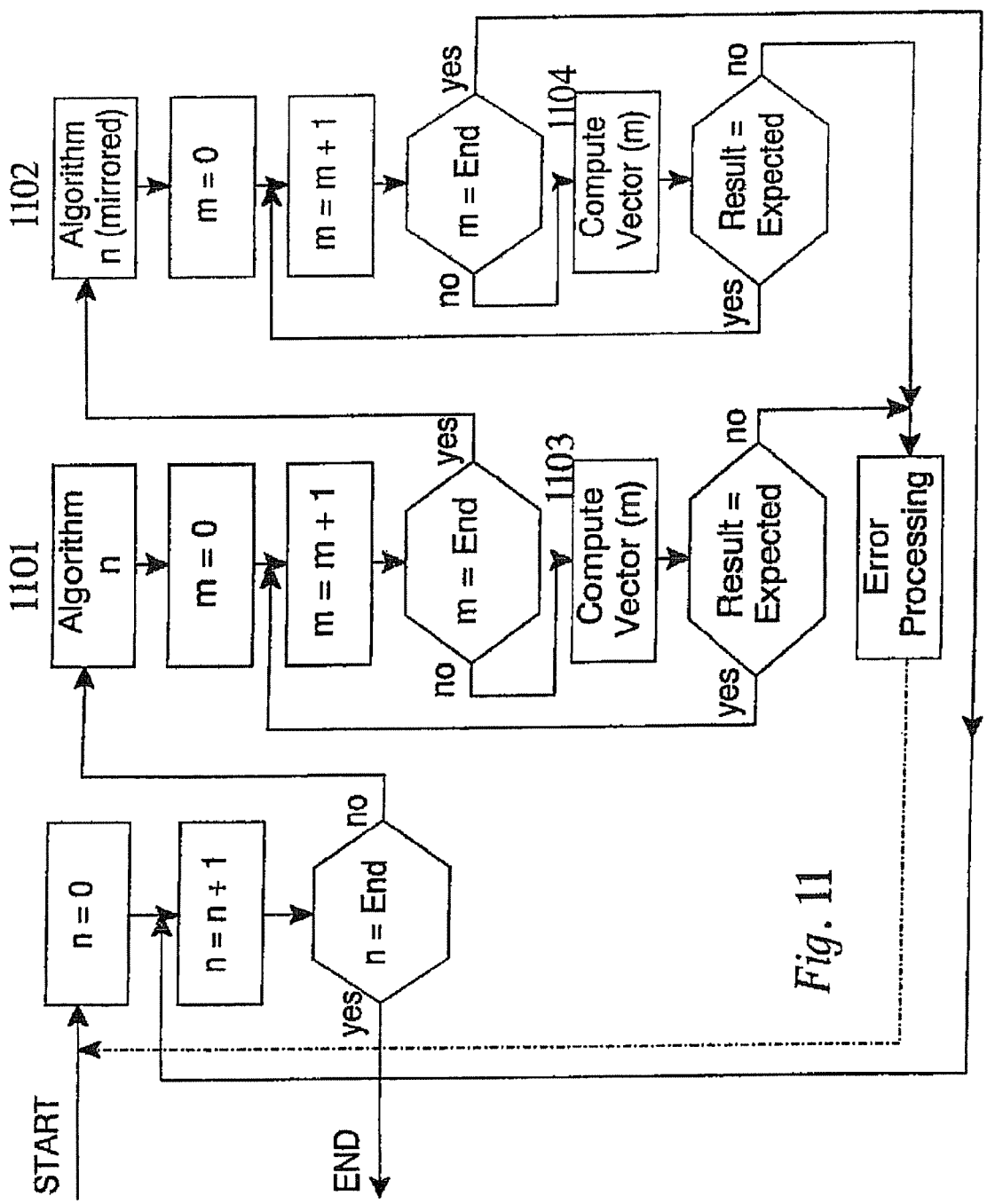

FIG. 11 illustrates a self-test sequence. Variable n, n$\in$(1, 2, . . . ) is the index of all algorithms, and defines the algorithm being used at that time. Each algorithm is in a first position (1101) which corresponds to FIG. 7*a*, and a second mirrored position (1102) which corresponds to FIG. 7*b*. Variable m, m$\in$(1, 2, . . . ) is the index of the test vectors to be calculated and compared. Within each algorithm, the quantity of test vectors is tested completely and then the algorithm is changed either from 1101 to 1102 or from 1102 to a new algorithm (n=n+1). The test is terminated if n reaches the value after the last valid algorithm. If an error is found during calculation (1103, 1104) of the test vectors, error processing is performed as illustrated in detail in FIGS. 12*a*, 12*b*. After successful error processing, all the algorithms are tested again to ensure that no new errors have occurred due to the correction, but in principle testing could also be continued at the site of the instantaneously active algorithm.

Two methods are proposed for error processing. FIG. 12*a* shows the generation of new multiplexer states by way of a counter, where the variable v, v$\in$(0, 1, . . . (number of PAEs)) is the number of the defective PAE. If no PAE is defective, then v=0. First v is increased so that the next PAE beginning with PAE 1, is marked as defective. Then the test that was failed is carried out again. If the test runs correctly, it is certain that PAE v is defective and v is written into a non-volatile read-write memory (e.g., 0903). If the test is failed again, v is increased until either the test runs correctly or v reaches the position after the last PAE and it is thus proven that the defective group of PAEs cannot be corrected, either because the error is located somewhere else (e.g., the bus system) or two or more PAEs are defective.

Figure 12B:
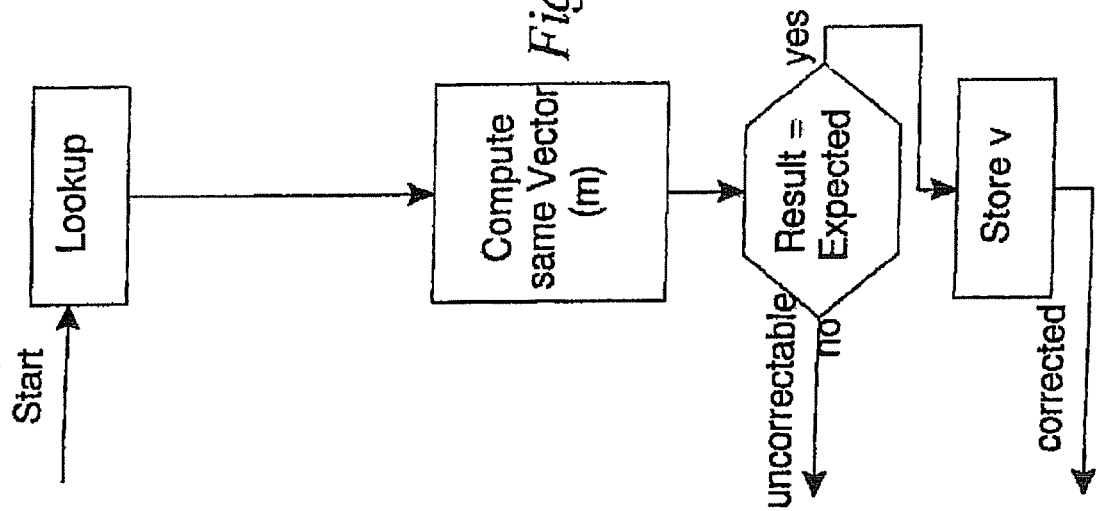
Figure 12A:
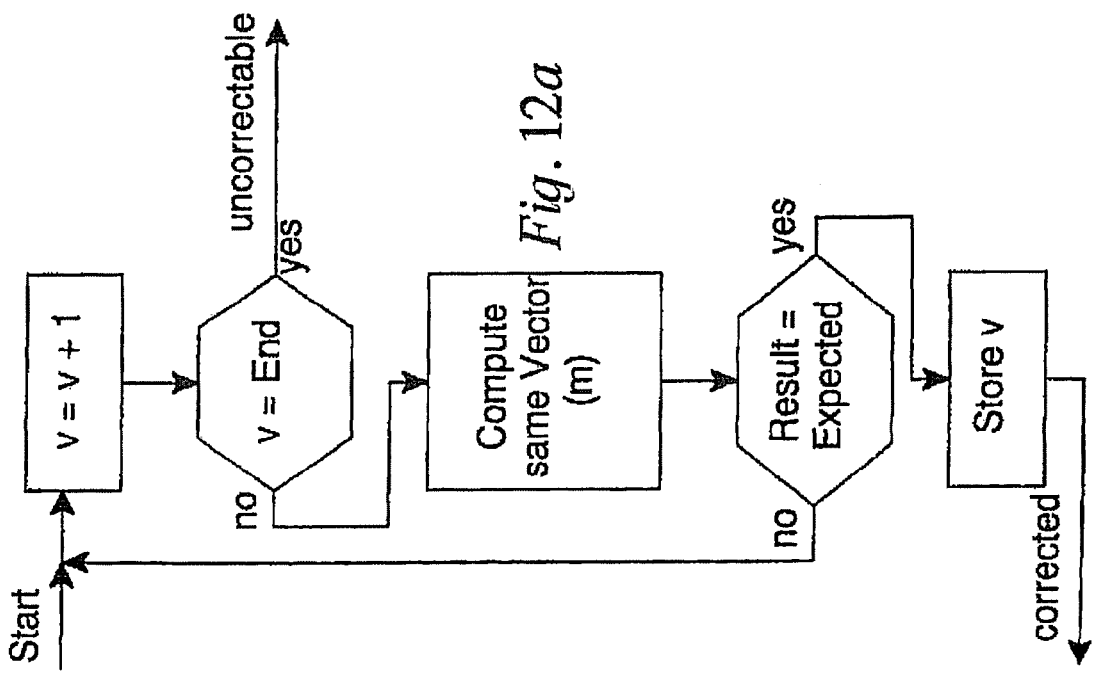

FIG. 12*b* shows a less time-consuming option, where the look-up table described above is integrated. It receives as an input value indices m and n as well as the number of the comparator that found the error. This number is supplied by ErrorCHK (0706) over bus 0707. The look-up table supplies number v back to the defective PAE. Then the test that was failed is performed again. If the test runs correctly, it is certain that PAE v is defective and v is written into a non-volatile read-write memory (e.g., 0903). If the test is failed again, it is assumed that the error is irreparable. With most test algorithms, it is possible to determine the column of the defective PAE but not its row. Thus, the column of defective PAE v can be determined easily, but it is not known in which of the plurality of rows the defective PAE is located. Therefore, in such cases, the error processing of FIGS. 12*a*, 12*b* must be performed over all the rows that were involved in calculation of the test algorithm until the error has been detected or all the rows have been tested and the error is uncorrectable.

Figure 13:
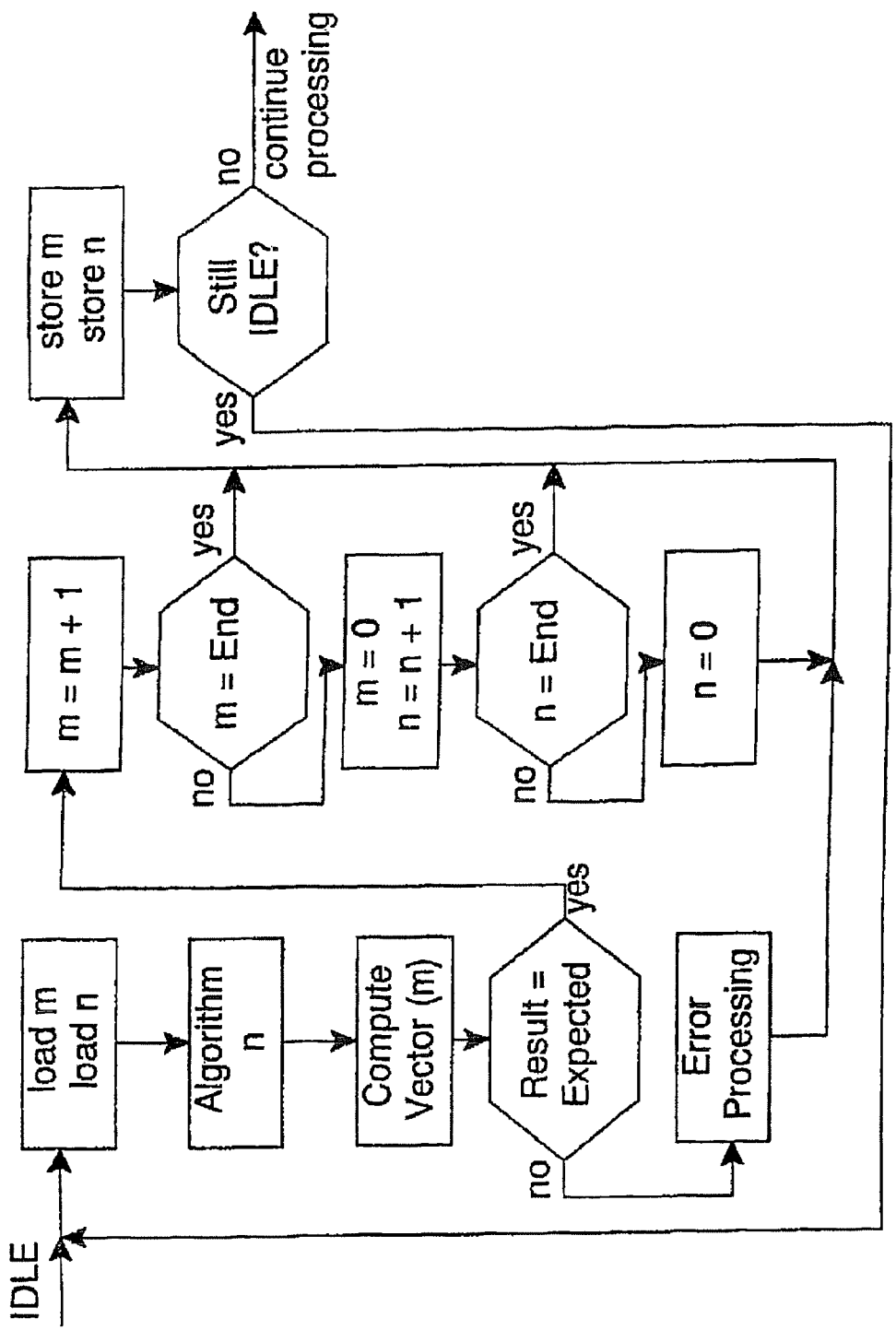

FIG. 13 shows a possibility of performing a chip test during IDLE cycles, i.e., cycles during which no program is being executed because the system is waiting for an action (e.g., a keyboard input). Such cycles are usually executed through queues in the program code. It is readily possible when such a waiting condition prevails to call up a test routine which performs a test of the chip during the waiting time, although a realtime capability is no longer possible in reaction to the action awaited. Indices m and n known from FIG. 11 are also used in FIG. 13 with the same meanings, but the indices are stored in the data memory. All the relevant data in the array is saved before calling up the test routine and is restored again after execution of the test routine. When the test routine is called up, the indices are first loaded from the data memory. Then the corresponding algorithm with the corresponding test vectors is executed. If the result is faulty, error processing is performed according to FIGS. 12a, 12b. Otherwise, the indices are calculated again and written back into the data memory. Then a test is performed to determine whether an IDLE state still prevails, i.e., if waiting for an action. If an IDLE state still prevails, the test routine is started again, but this time a different calculation is performed—according to the new calculation of indices already performed. If there is no longer an IDLE state, the program execution is continued in the normal way.

Figure 14:
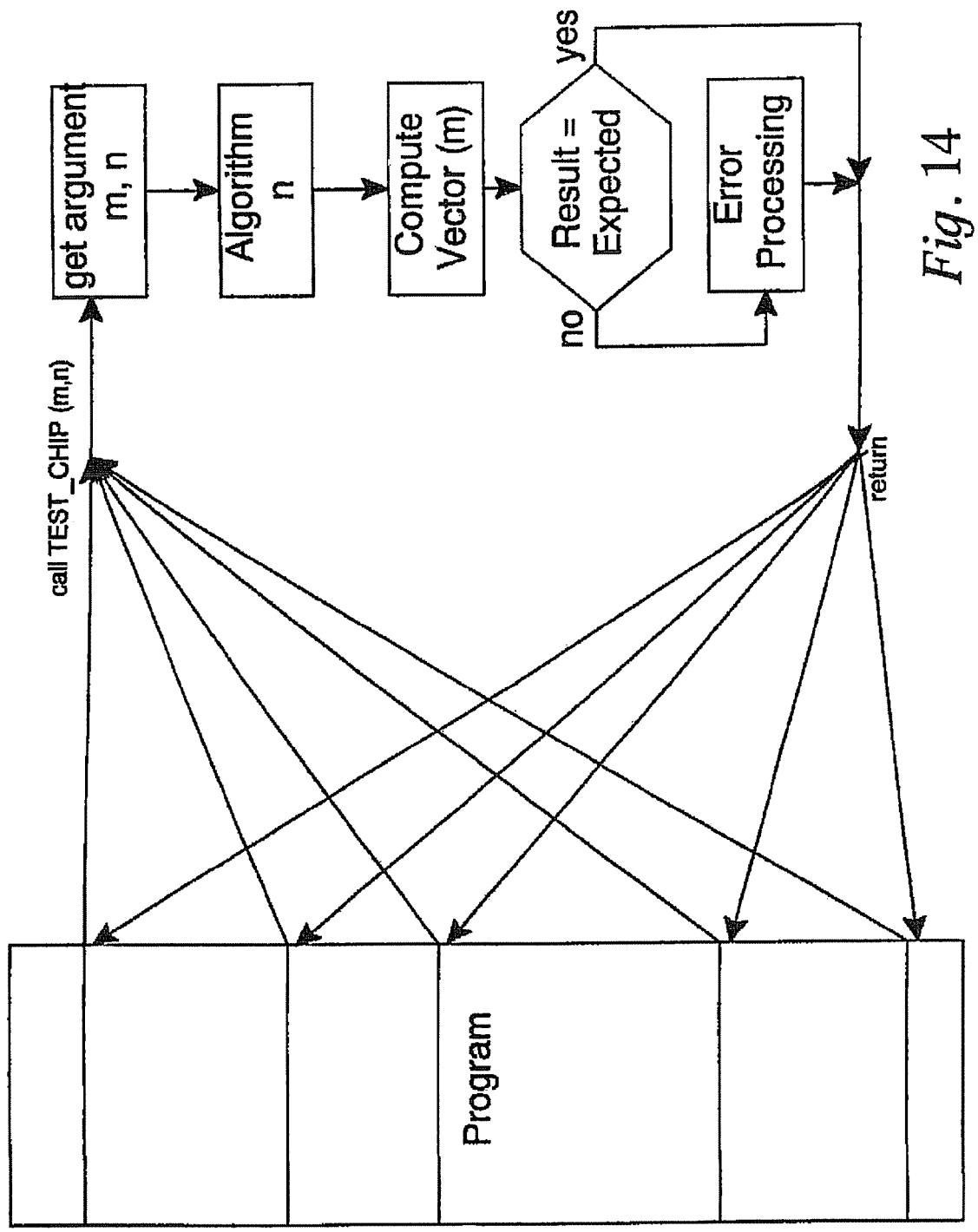

FIG. 14 illustrates a possible modification of FIG. 13, where the test routine is called up directly by the application program (call TEST_CHIP (m, n)). The test routine is called up at certain suitable points in the algorithm. All the relevant data in the array is first saved and is restored again after execution of the test routine. Indices m, n are also transferred directly on call-up. Within the TEST_CHIP routine, algorithm n is executed with data m. The error test is performed according to FIGS. 11 and 13. At the end of TEST_CHIP, the indices are not recalculated, in contrast with FIGS. 11 and 13. The return from the TEST_CHIP routine leads to the position directly downstream from "call TEST_CHIP," which is comparable to the BASIC standard GOSUB . . . RETURN.

Figure 15:
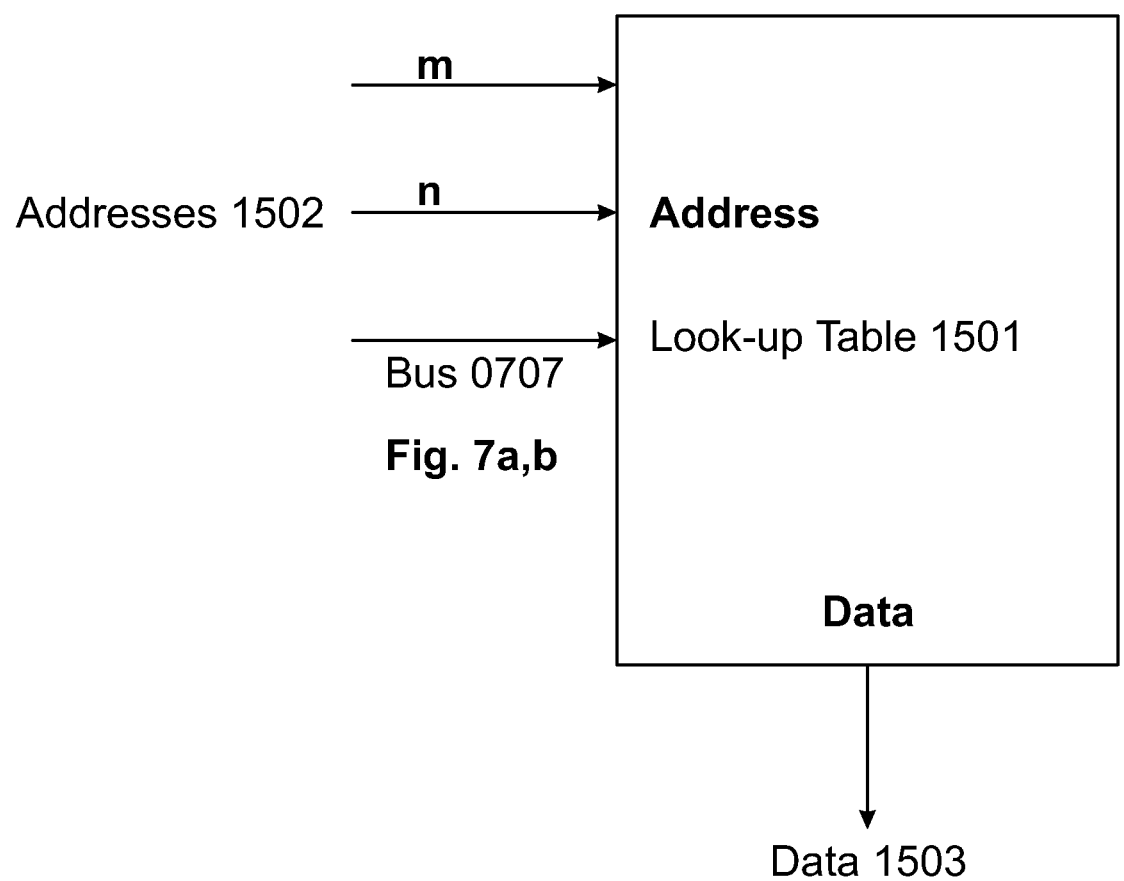

FIG. 15 illustrates a possible control of a look-up table. The look-up table (1501) here is implemented as a ROM. Indices m, n, i.e., the identifier of the test algorithm performed instantaneously and the identifier of the current test data, as well as the result (0707) of the ErrorCHK unit (0706) are sent as addresses (1502) to the ROM. The resulting data (1503) indicates the number of the defective PAE. This number is transferred to the register (0108).

Figure 16:
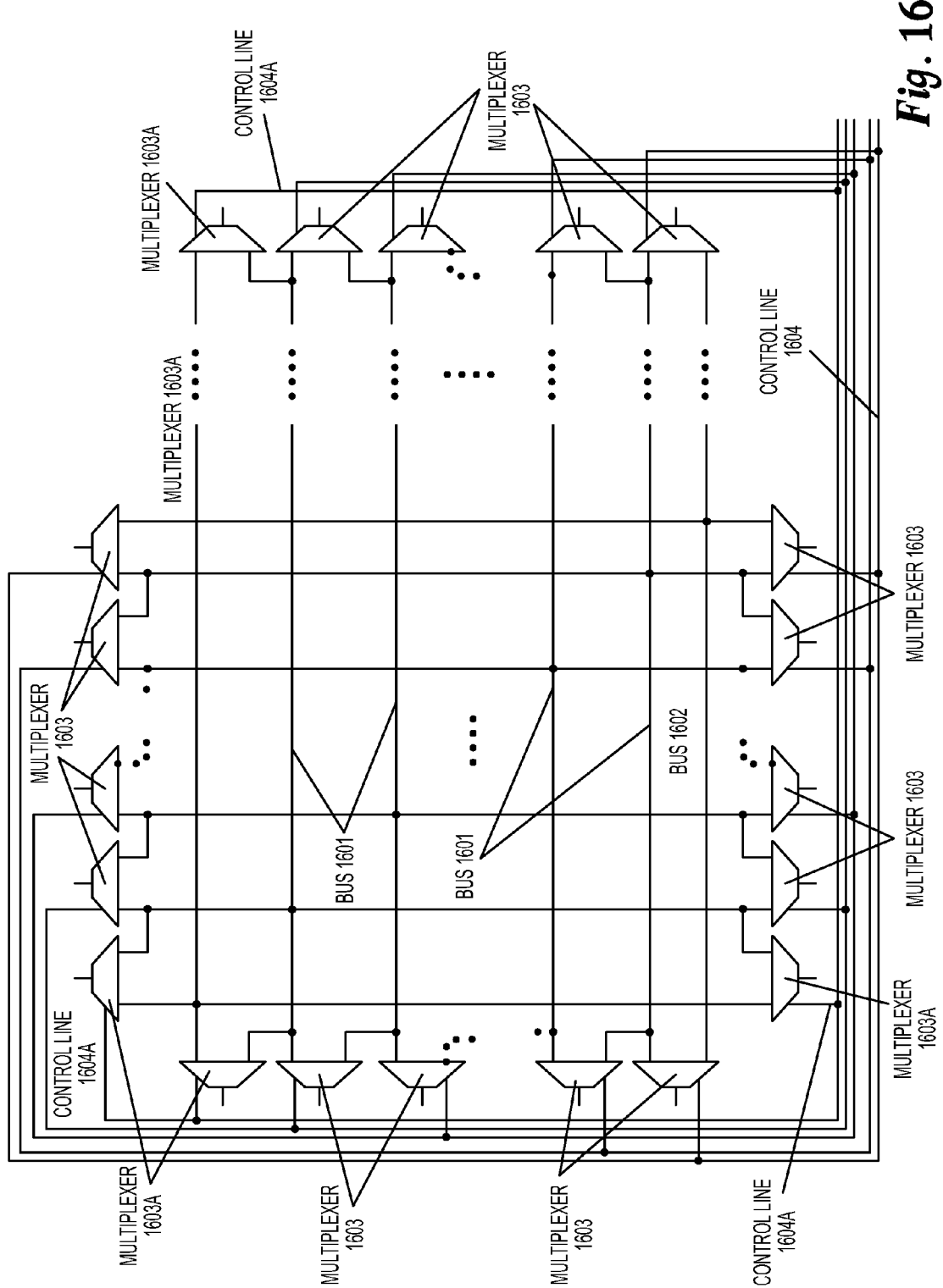

FIG. 16 shows a fault-tolerant bus system. An additional bus (1602) is assigned to a quantity of identical buses (1601). The bus system has terminals in all four directions. The terminals are connected to the buses over multiplexers (1603) so that if one bus fails, its function is assumed by the neighboring bus (below it in the horizontal or to the right in the vertical). All the multiplexers connected to a certain bus are addressed by the same control line, e.g., multiplexers 1603a which are connected to bus 1601a are controlled by control line 1604a. Control lines 1604 are controlled by a unit according to 0109 from FIG. 1. Further control and error processing are in principle the same as those described with regard to the preceding figures.

Figure 17:
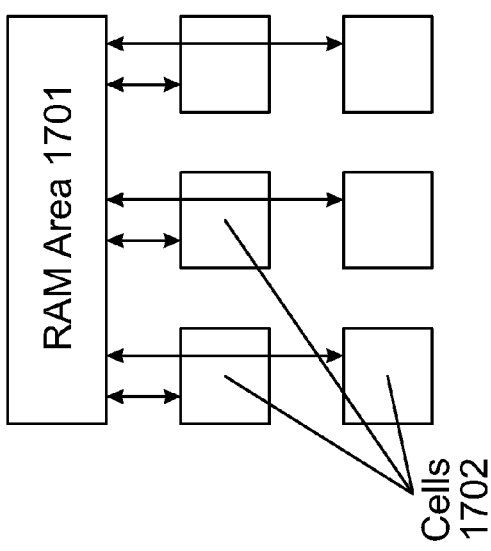

FIG. 17 shows the assignment of a chip-internal RAM or RAM area (1701) to a group of cells (1702). Before executing the test algorithms, the internal registers of the cells (1702) are stored in the RAM or RAM area (1701). After execution of the test algorithms, the data is written back into the internal registers of the cells. The data is read and written over multiplexers/gates (0103, 0104 and 0105). Thus, data originating from a defective cell is written to the cell connected as a replacement according to the position of the multiplexers. The sequence of the user algorithm is not impaired by the test method.

Figure 18:
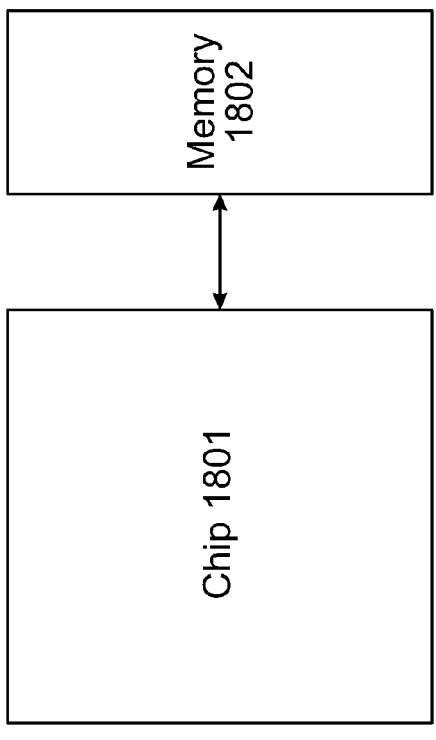

FIG. 18 illustrates the system described in conjunction with FIG. 17, but the data of the cells in the chip (1801) is written to an external memory (1802) or read out of the external memory.

Figure 19:
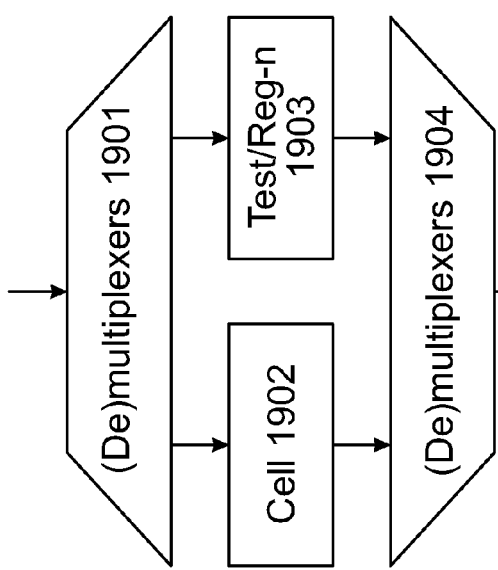

FIG. 19 illustrates the use of explicit test registers TestReg-n. A register TestReg-n (1903) used for the test algorithms is assigned to each internal register Reg-n of a cell (1902). The demultiplexers (the gate) (1901) selects which register is to be written to; the multiplexer (1904) select which register is to be read from. The control of the (de)multiplexers (1901, 1904) is such that in normal operation, i.e., while the user algorithms are running, Reg-n (1902) is selected and TestReg-n (1903) is used in execution of the test algorithm. The circuit according to FIG. 19 is implemented for each relevant register within a cell. A disadvantage of this circuit is that the data of a defective cell is not available to the cell connected as a replacement. To overcome this disadvantage, it is proposed that an additional circuit based on the basic principle (0103, 0104 and 0105) according to the present invention be implemented by (de)multiplexers (1901, 1904). Thus, all the data can be made available to the replacement cell.

DEFINITION OF TERMS

User algorithm: user-specific program that runs on the chip.

Output multiplexer: circuit comparable to a relay which selects between multiple possible buses at the outputs of PAEs.

BIST: built-in self-test. Self-test implemented in an integrated circuit, i.e., the TestMEM and all test functions are included in the circuit, Booting: loading a basic program and setting the basic functions after a reset.

Bus: bundle of multiple individual signals/individual lines which together fulfil a certain transfer function (data bus, address bus . . . ).

EDST: external driven self-test. Self-test implemented in an integrated circuit where the TestMEM is connected outside the integrated circuit and parts of the control can also be accommodated outside the circuit.

Input multiplexer: circuit comparable to a relay which selects between multiple possible buses at the inputs of PAEs.

ErrorCHK: circuit implemented in an integrated unit which recognizes and localizes a fault during BIST or EDST.

HOST: a higher-order module or computer over an integrated circuit.

IDLE: state in which a processor or similar circuit waits for an action and does not perform any processing.

Look-up table: memory which returns a fixedly defined data word of any desired width on the basis of an address; usually implemented as a ROM or ROM-like memory.

Neighbor bus: bus located directly next to another bus and having the same structure.

PAE: processing array element according to German Patent Application 196 51 075.9-53. Although a PAE in German Patent Application 196 51 075.9-53 is an arithmetic and logic unit, the term is used in more general terms in the present patent to represent any desired cell, e.g., arithmetic and logic units, state machines, memories, etc.

PAER: cell which is additionally implemented on the integrated circuit and can be used as a replacement for a defective cell of the same design.

RESET: returning an integrated circuit to a defined basic state. A reset occurs in general after applying a voltage (turning the circuit on).

Self-test: automatic test method implemented in an integrated unit.

Setpoint results: the results that must be supplied by the test algorithms to prove the correctness of the integrated circuit. There is an error if the setpoint results do not match the calculations.

Test algorithms: program that tests the integrated unit; it contains all the mathematical functions and circuits that are to be tested.

State machine: state machine for sequence control of complex operations; also called a sequencer.

Test algorithm: program for testing the chip or cells of a structure.

Test data: the quantity of all test algorithms, test vectors and setpoint results.

TestMEM: memory in which the test data is stored.

Test routine: individual program section within the test algorithms.

Test vectors: data with which the test algorithms are executed.

Gates: switches that relay or block data.

Cell: self-contained module within an integrated circuit, e.g., arithmetic and logic units, state machines, memories.

The invention claimed is:

1. An Integrated Circuit Data Processor, comprising:
   data processing cores being arranged in an array;
   a plurality of the data processing cores comprising at least one Arithmetic and Logic Unit; and
   wherein the integrated circuit is operative to:
   perform at least a self-test on the plurality of data processing cores comprising at least one Arithmetic and Logic Unit; and
   disable data processing cores found by the self-test to be defective.

2. The Integrated Circuit Data Processor according to claim 1, wherein the defective data processing cores are permanently disabled.

3. The Integrated Circuit Data Processor according to claim 1, wherein a defect pattern is stored in a non volatile memory within the integrated circuit, the defect pattern defining the data processing cores being disabled.

4. The Integrated Circuit Data Processor according to claim 1, wherein the defective data processing cores are detected during production test.

5. The Integrated Circuit Data Processor to claim 1, wherein the defective data processing cores are detected in the field.

6. The Integrated Circuit Data Processor according to claim 1, wherein the defective data processing cores are detected by a BIOS routine.

7. The Integrated Circuit Data Processor according to claim 1, wherein the defective data processing cores are detected at system start.

8. The Integrated Circuit Data Processor according to claim 1, wherein the defective data processing cores are managed at system startup.

9. The Integrated Circuit Data Processor according to claim 1, wherein the defective data processing cores are managed by a BIOS routine.

10. The Integrated Circuit Data Processor according to claim 1, wherein the defective data processing cores are at least one of detected and disabled at runtime.

11. The Integrated Circuit Data Processor according to any one of the claims 2 to 7 and 8 to 10, wherein the defective data processing cores are replaced by redundant data processing cores.

12. An Integrated Circuit Data Processor, comprising:
    data processing cores arranged in an array;
    a plurality of the data processing cores comprise at least one Arithmetic Logic Unit; and
    at least some of the data processing cores operative to process different instructions at a single time; and
    a non-volatile memory;
    wherein, if at least one core is determined to be a defective core:
    the non-volatile memory is operative to store information representing the defective data processing cores; and
    at least some of the plurality of data processing cores are capable of being switched-off as function of the information representing the defective data processing cores.

13. The Integrated Circuit Data Processor according to claim 12 further comprising:
    an interconnection system to which the plurality of data processing cores are connected.

14. An Integrated Circuit Data Processor, comprising:
    data processing cores arranged in an array;
    a plurality of the data processing cores comprise at least one Arithmetic Logic Unit; and
    at least some of the data processing cores operative to process different instructions at a single time; and
    a non-volatile memory;
    wherein, if at least one core is determined to be a defective core:
    the non-volatile memory is operative to store information representing the defective data processing cores; and
    at least some of the plurality of data processing cores are switched-off as function of the information representing the defective data processing cores.

15. The Integrated Circuit Data Processor according to claim 14 further comprising:
    an interconnection system to which the plurality of data processing cores are connected.

16. An Integrated Circuit Data Processor, comprising:
    data processing cores arranged in an array;
    a plurality of the data processing cores comprise at least one Arithmetic Logic Unit; and
    at least some of the data processing cores operative to process different instructions at a single time;
    an interconnection system to which the plurality of data processing cores are connected; and
    a non-volatile memory,
    wherein, if at least one core is determined to be a defective core:
    the non-volatile memory is operative to store information representing the defective data processing cores; and
    at least some of the plurality of data processing cores are capable of being removed from the interconnection system as function of the information representing the defective data processing cores.

17. An Integrated Circuit Data Processor, comprising:
    data processing cores arranged in an array;
    a plurality of the data processing cores comprise at least one Arithmetic Logic Unit; and
    at least some of the data processing cores operative to process different instructions at a single time;
    an interconnection system to which the plurality of data processing cores are connected; and
    a non-volatile memory, wherein, if at least one data processing cores is determined to be a defective core:
    the non-volatile memory is operative to store information representing the defective data processing cores;
    at least some of the plurality of data processing cores are removed from the interconnection system as function of the information representing the defective data processing cores.

18. An Integrated Circuit Data Processor, comprising:
data processing cores arranged in an array;
a plurality of the data processing cores comprise at least one Arithmetic Logic Unit; and
at least some of the data processing cores being operative to process different instructions at a single time;
an interconnection system to which the plurality of data processing cores are connected; and
a non-volatile memory wherein, if at least one core is determined to be a defective core:
the non-volatile memory is operative to store information representing the defective data processing cores; and
at least some of the plurality of data processing cores are capable of being disconnected from the interconnection system as function of the information representing the defective data processing cores.

19. The Integrated Circuit Data Processor according to any one of the claims 13, 15 to 18, wherein the defective data processing cores are disconnected from the interconnection system.

20. An Integrated Circuit Data Processor, comprising:
data processing cores arranged in an array;
a plurality of the data processing cores comprise at least one Arithmetic Logic Unit; and
at least some of the data processing cores operative to process different instructions at a single time;
an interconnection system to which the plurality of data processing cores are connected; and
a non-volatile memory wherein, if at least one core is determined to be a defective core:
the non-volatile memory is operative to store information representing the defective data processing cores;
at least some of the plurality of data processing cores are disconnected from the interconnection system as function of the information representing the defective data processing cores.

21. The Integrated Circuit Data Processor according to any one of the claims 12, 14 and 16 to 20, wherein the defective data processing cores are replaced by at least one redundant core.

22. The Integrated Circuit Data Processor according to any one of the claims 13 and 15 to 20, wherein input signals of defective data processing cores are disconnected from the interconnection system.

23. The Integrated Circuit Data Processor according to any one of the claims 13 and 15 to 20, wherein output signals of defective data processing cores are disconnected from the interconnection system.

24. The Integrated Circuit Data Processor according to any one of the claims 13 and 15 to 20, wherein input and output signals of defective data processing cores are disconnected from the interconnection system.

25. The Integrated Circuit Data Processor according to any one of the claims 13, 15, 16 and 20, wherein the defective data processing cores are removed from the interconnection system.

26. The Integrated Circuit Data Processor according to any one of the claims 12 and 16 to 20, wherein the defective data processing cores are switched-off.

27. An Integrated Circuit Data Processor comprising:
a bus system;
a plurality of data processing cores;
each of the plurality of data processing cores comprises at least one Arithmetic and Logic unit;
wherein the plurality of data processing cores are arranged in an arrangement having columns, the number of columns being larger than two, and
the number of data processing cores in each column being larger than two;
the bus system interconnects the plurality of data processing cores in the arrangement for transferring data between the data processing cores; and
wherein, in view of a probability of the chip having defects already when being manufactured, more of the plurality of data processing cores are implemented than used, so that some of the data processing cores can be exempted from data transfer via the bus system in response to a chip test.

28. The Integrated Circuit Data Processor of claim 27, wherein at least some of the functionality of each of the data processing cores is configurable.

29. The Integrated Circuit Data Processor according to any one of claims 27 and 28, wherein the data processing cores receive individual instructions.

30. The Integrated Circuit Data Processor according to any one of claims 27 and 28, wherein the data processing cores perform operations according to individually received instructions.

31. The Integrated Circuit Data Processor of claim 27, wherein the data processing cores operate in according with a configuration.

32. The Integrated Circuit Data Processor according to any one of claims 27 and 31, wherein the data processing cores receive individual instructions.

33. The Integrated Circuit Data Processor according to any one of claims 27 and 31, wherein the data processing cores perform operations according to individually received instructions.

34. The Integrated Circuit Data Processor of claim 27, wherein the data processing cores operate in accordance with a configured function.

35. The Integrated Circuit Data Processor according to any one of claims 27 and 34, wherein the data processing cores receive individual instructions.

36. The Integrated Circuit Data Processor according to any one of claims 27 and 34, wherein the data processing cores perform operations according to individually received instructions.

37. The Integrated Circuit Data Processor of claim 27, wherein the function of the data processing core is configured.

38. The Integrated Circuit Data Processor according to any one of claims 27 and 37, wherein the data processing cores receive individual instructions.

39. The Integrated Circuit Data Processor according to any one of claims 27 and 37, wherein the data processing cores perform operations according to individually received instructions.

40. The Computer of claim 27, wherein at least some of the functionality of each of the data processing cores is configurable.

41. A Computer comprising:
an Integrated Circuit Data Processor; and
a storage media for storing at least one program for execution on the Integrated Circuit Data Processor; the Integrated Circuit Data Processor comprising
a bus system;
a plurality of data processing cores;
each of the plurality of data processing cores comprises at least one Arithmetic and Logic unit;

wherein the plurality of data processing cores are arranged in an arrangement having columns, the number of columns being larger than two, and the number of data processing cores in each column being larger than two;

the bus system interconnects the plurality of data processing cores in the arrangement for transferring data between the data processing cores; and wherein, in view of a probability of the chip having defects already when being manufactured, more of the plurality of data processing cores are implemented than used, so that some of the data processing cores can be exempted from data transfer via the bus system in response to a chip test.

42. The Computer according to any one of claims 41 and 40, wherein the data processing cores perform operations according to individually received instructions.

43. The Computer according to any one of claims 41 and 40, wherein the data processing cores receive individual instructions.

44. The Computer of claim 41, wherein the data processing cores operate in according with a configuration.

45. The Computer according to any one of claims 41 and 44, wherein the data processing cores receive individual instructions.

46. The Computer according to any one of claims 41 and 44, wherein the data processing cores perform operations according to individually received instructions.

47. The Computer of claim 41, wherein the data processing cores operate in accordance with a configured function.

48. The Computer according to any one of claims 41 and 47, wherein the data processing cores receive individual instructions.

49. The Computer according to any one of claims 41 and 47, wherein the data processing cores perform operations according to individually received instructions.

50. The Computer of claim 41, wherein the function of the data processing core is configured.

51. The Computer according to any one of claims 41 and 50, wherein the data processing cores receive individual instructions.

52. The Computer according to any one of claims 41 and 50, wherein the data processing cores perform operations according to individually received instructions.

* * * * *